US010490596B2

(12) United States Patent
Tsai

(10) Patent No.: US 10,490,596 B2
(45) Date of Patent: Nov. 26, 2019

(54) METHOD FOR FABRICATING AN IMAGE SENSOR

(71) Applicant: TAIWAN SEMICONDUCTOR MANUFACTURING CO., LTD., Hsinchu (TW)

(72) Inventor: Bo-Tsung Tsai, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/489,831

(22) Filed: Apr. 18, 2017

(65) Prior Publication Data

US 2018/0151611 A1    May 31, 2018

Related U.S. Application Data

(60) Provisional application No. 62/427,933, filed on Nov. 30, 2016.

(51) Int. Cl.
*H01L 27/146* (2006.01)

(52) U.S. Cl.
CPC .... *H01L 27/1469* (2013.01); *H01L 27/14614* (2013.01); *H01L 27/14634* (2013.01); *H01L 27/14636* (2013.01); *H01L 27/14643* (2013.01); *H01L 27/14689* (2013.01)

(58) Field of Classification Search
None
See application file for complete search history.

(56) References Cited

U.S. PATENT DOCUMENTS

| 9,209,247 | B2 | 12/2015 | Colinge et al. | |
|---|---|---|---|---|
| 9,224,833 | B2 | 12/2015 | Chen et al. | |
| 9,251,888 | B1 | 2/2016 | Liaw | |
| 2010/0025738 | A1* | 2/2010 | Kohyama | H01L 27/14603 257/222 |
| 2015/0048442 | A1 | 2/2015 | Colinge et al. | |
| 2015/0303270 | A1 | 10/2015 | Liaw | |
| 2016/0043126 | A1* | 2/2016 | Fan | H01L 27/14643 257/226 |

* cited by examiner

*Primary Examiner* — Bo B Jang
(74) *Attorney, Agent, or Firm* — McClure, Qualey & Rodack, LLP

(57) ABSTRACT

A method for fabricating an image sensor is provided. In the method, at first, a semiconductor substrate having a top portion and a bottom portion is provided. Then, a light-sensitive element is formed in the bottom portion of the semiconductor substrate. Thereafter, the top portion of the semiconductor substrate is etched to form a post structure on the bottom portion of the semiconductor substrate. Thereafter, a gate dielectric layer and a conductive layer are sequentially formed to cover the bottom portion of the semiconductor substrate and the post structure. Then, the gate dielectric layer and the conductive layer are etched to form a vertical gate structure on the light-sensitive element.

20 Claims, 66 Drawing Sheets

800

- providing a semiconductor substrate having a top portion and a bottom portion — 810
- forming a light-sensitive element in the bottom portion of the semiconductor substrate — 812
- forming an ohmic contact layer in or on the top portion of the semiconductor substrate — 814
- etching the top portion of the semiconductor substrate and the ohmic contact layer to form a post structure on the bottom portion of the semiconductor substrate and a floating node on the post structure — 816
- forming a lightly-doped region on the light-sensitive element — 818
- forming a gate dielectric layer to cover the lightly-doped region, the post structure and the floating node — 820
- forming a conductive layer to cover the gate dielectric layer — 822
- etching the conductive layer and the gate dielectric layer to form a vertical gate structure on the post structure and to expose the floating node — 824
- forming a doped region on the exposed portions of the sidewalls of the post structure — 825
- forming a protection layer on the light-sensitive element — 826
- forming a source contact on the floating node and a gate contact on the conductive layer — 828

Fig. 8

METHOD FOR FABRICATING AN IMAGE SENSOR

RELATED APPLICATION

This application claims the benefit of the Provisional Application Ser. No. 62/427,933, filed Nov. 30, 2016. The entire disclosures of all the above applications are hereby incorporated by reference herein.

BACKGROUND

In semiconductor technology, image sensors are used for sensing light emitted towards them to form an image. The image sensor includes a dummy wafer and a sensing wafer bonded on the circuit wafer. The sensing wafer includes pixel units for converting various types of photo energy of light into electrical signals, and peripheral circuits of the pixel units. For example, the peripheral circuits include source followers to amplify the electrical signals.

In general, the image sensor may be a complementary metal-oxide-semiconductor (CMOS) image sensor (CIS), an active-pixel sensor (APS), a passive-pixel sensor and a charged-coupled device (CCD) sensor. The above image sensor is widely used in various applications such as digital camera or mobile phone camera devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a flow chart showing a method for fabricating an image sensor in accordance with embodiments of the present disclosure.

DETAILED DESCRIPTION

Figure 1A:
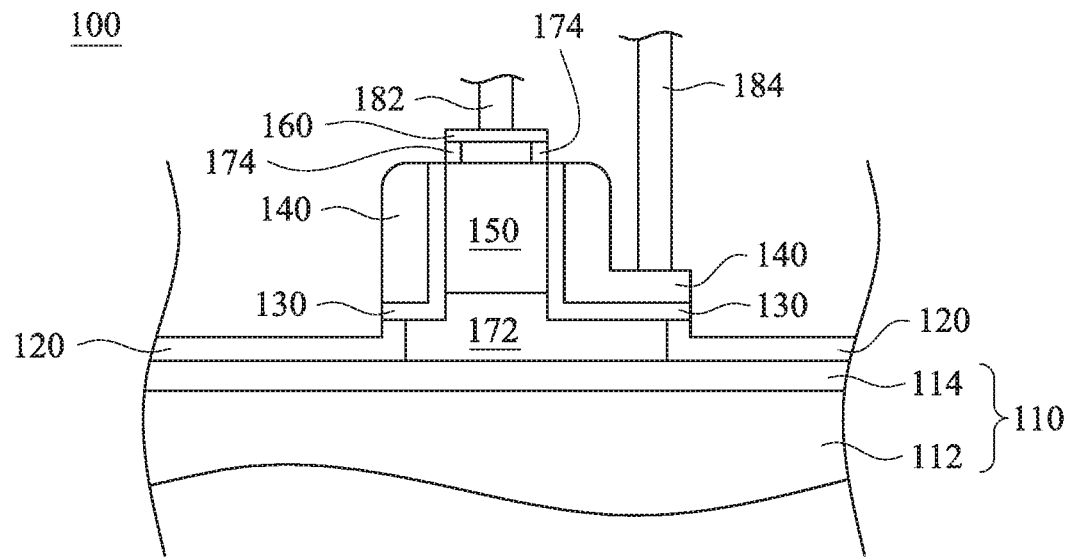
FIG. 1A is a schematic cross-sectional view of a pixel unit of an image sensor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to methods for fabricating an image sensor including pixel units each having a vertical gate structure. In the method, at first, a semiconductor substrate having a top portion and a bottom portion is provided. Then, a light-sensitive element is formed in the bottom portion of the semiconductor substrate. Thereafter, an ohmic contact layer is formed in or on the top portion of the semiconductor substrate. Then, the top portion of the semiconductor substrate and the ohmic contact layer are etched to form a post structure on the bottom portion of the semiconductor substrate and a floating node on the post structure. Thereafter, a gate dielectric layer and a conductive layer are sequentially formed to cover the bottom portion of the semiconductor substrate, the post structure and the floating node. Then, the gate dielectric layer and the conductive layer are etched to form a vertical gate structure on the light-sensitive element. The vertical gate structure is formed to enable the light-sensitive element to occupy a big area. Further, the method for fabricating the image sensor can be implemented with fewer masks, and thus cost of the method for fabricating the image sensor is reduced.

Figure 1B:
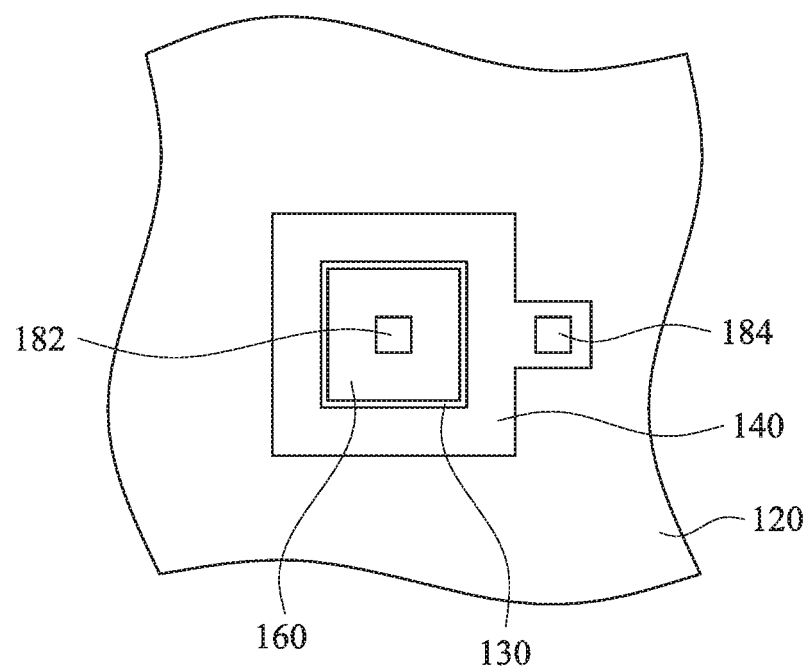
FIG. 1B is a schematic top view of the pixel unit of an image sensor in accordance with some embodiments of the present disclosure.

Referring to FIG. 1A and FIG. 1B, FIG. 1A is a schematic cross-sectional view of a pixel unit 100 of an image sensor in accordance with some embodiments of the present disclosure, and FIG. 1B is a schematic top view of the pixel unit 100 of an image sensor in accordance with some embodiments of the present disclosure. The pixel unit 100 is defined by plural isolation structures (not shown). In some embodiments, the isolation structures are doped (e.g., p-type, n-type, or a combination thereof) regions. In some embodiments, the isolation structures are shallow trench isolations (STIs).

The pixel unit 100 includes a light-sensitive element 110, a protection layer 120, a gate dielectric layer 130, a conductive layer 140, a post structure 150 and a floating node 160. In some embodiments, the light-sensitive element 110 is a photodiode including doped regions 112 and 114. The doped regions 112 and 114 are formed by doping with a dopant of a first type. In some embodiment, the doped regions 112 and 114 are formed by doping with an n-type dopant. In some embodiments, the doped region 112 is doped at a first concentration, and the doped region 114 is doped at a second concentration greater than the first concentration. In some embodiments, the doped region 112 is doped at a concentration of about 1E12 atoms/cm$^3$, and the doped region 114 is doped at a concentration of about 5E12 atoms/cm$^3$, but embodiments of the present disclosure are not limited thereto.

The protection layer 120 is disposed on the light-sensitive element 110 to stabilize the light-sensitive element 110. The protection layer 120 may be referred to as a pinning layer and formed by doping with a dopant of a second type opposite to the first type. In some embodiments, the protection layer 120 is formed by doping with a p-type dopant at a concentration of about 1E13 atoms/cm$^3$.

The gate dielectric layer 130 and the conductive layer 140 are sequentially disposed on the light-sensitive element 110 and surround the post structure 150, thereby forming a vertical gate structure on the light-sensitive element 110. In some embodiments, the gate dielectric layer 130 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material. In some embodiments, the conductive layer 140 is formed by doped poly-silicon, metal such as Al, Cu, W, Ti, Ta, TiN, TaN, NiSi, CoSi, other suitable conductive materials, or combinations thereof.

The floating node 160 is formed on the post structure 150 and can be considered as a source node. In some embodiments, the pixel unit 100 further includes a source contact 182 and a gate contact 184 formed on the floating node 160 and the conductive layer 140. Therefore, when the vertical gate structure is turned on to transfer signals generated by the light-sensitive element 110 to corresponding peripheral circuits, a vertical channel is induced in the post structure 150 to transfer the signals of the light-sensitive element 110. Since the channel induced by the vertical gate structure is not located in a substrate in which the light-sensitive element 110 is formed, the light-sensitive element 110 can be formed to occupy a big area of the pixel unit 100, and high quantum efficiency (QE) is achieved.

In some embodiments, a doped region 172 is formed on the light-sensitive element 110 to benefit transmission of the electrical signals from the light-sensitive element 110, and the doped region 172 is formed by doping with a dopant of the first type. In some embodiments, the doped region 172 is formed by doping with the n-type dopant at a concentration of about $2.5E12$ atoms/cm$^3$. In some embodiments, the doped region 172 occupies a portion a channel defined by the gate dielectric layer 130 and the conductive layer 140.

Figure 1C:
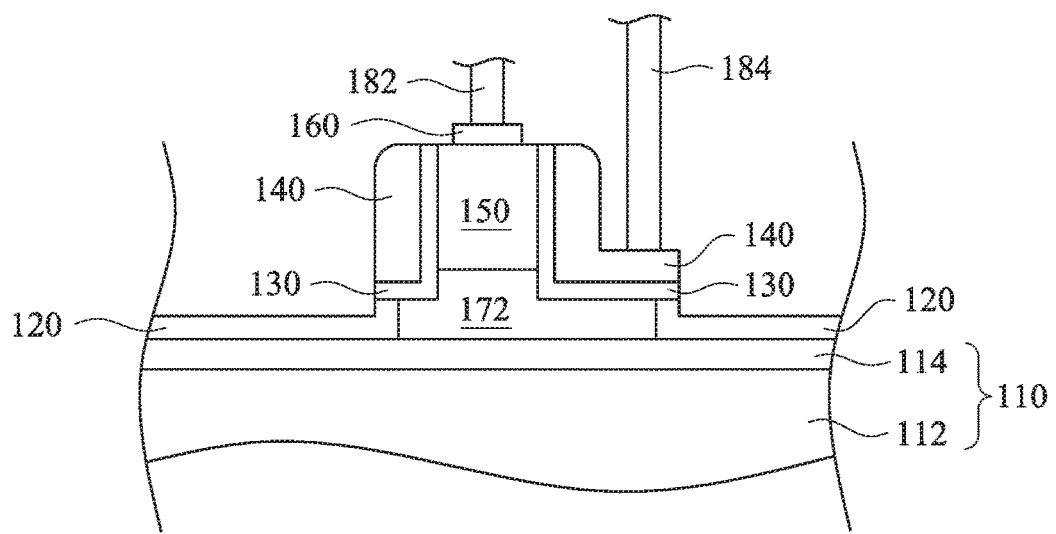
FIG. 1C is a schematic cross-sectional view of a pixel unit of an image sensor in accordance with some embodiments of the present disclosure.
Figure 2:
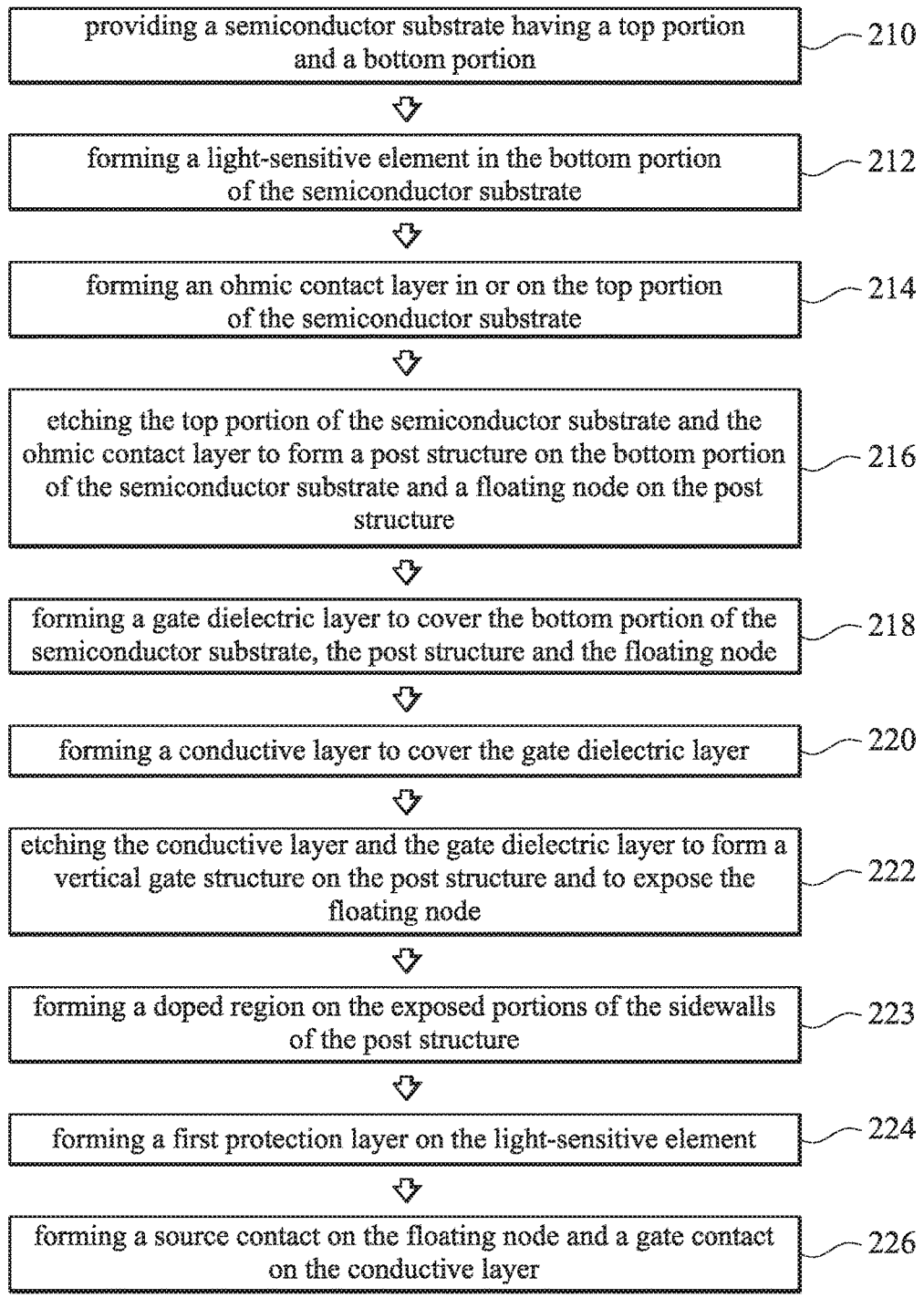
FIG. 2 is a flow chart showing a method for fabricating an image sensor in accordance with embodiments of the present disclosure.

Further, in some embodiments, a doped region 174 is disposed on sidewalls of the post structure 150. The doped region 174 is located between the gate dielectric layer 130 and the floating node 160 and surrounds the post structure 150, thereby reducing capacitance of the gate dielectric layer 130. The doped region 174 is formed by doping with a dopant of the first type. In some embodiments, the doped region 174 is formed by doping with the n-type dopant at a concentration of about $1E12$ atoms/cm$^3$. In some embodiments, the doped region 174 is omitted and the floating node 160 does not fully cover the top surface of the post structure 150 as shown in FIG. 1C.

Figure 3A:
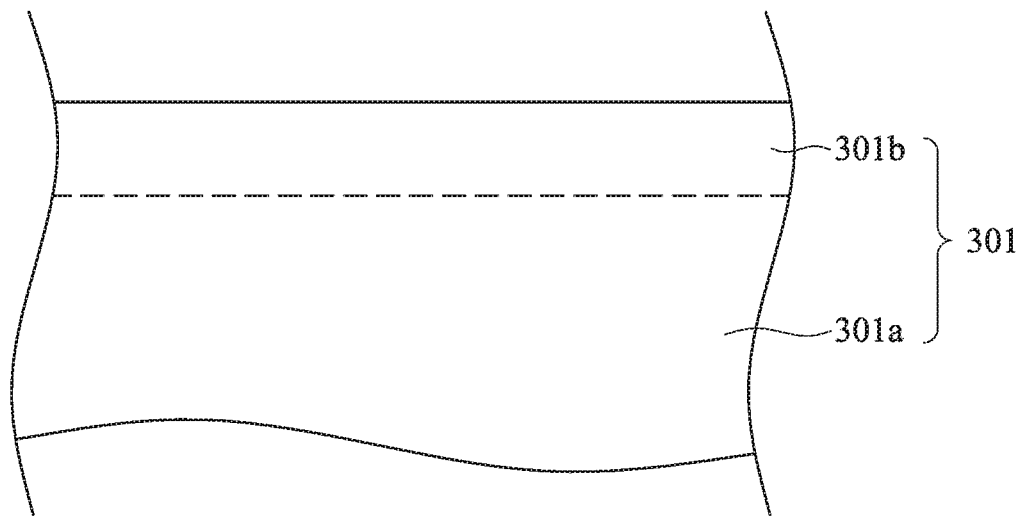
FIG. 3A to FIG. 3M are cross-sectional views of intermediate stages showing the method for fabricating an image sensor in accordance with some embodiments of the present disclosure.

Referring to FIG. 2 and FIG. 3A to FIG. 3M, FIG. 2 is a flow chart showing a method 200 for fabricating an image sensor in accordance with embodiments of the present disclosure, and FIG. 3A to FIG. 3M are cross-sectional views of intermediate stages showing the method 200 for fabricating an image sensor in accordance with some embodiments of the present disclosure. The method 200 begins at operation 210. Operation 210 is performed to provide a semiconductor substrate 301 as shown in FIG. 3A. The semiconductor substrate 301 has a bottom portion 301a and a top portion 301b on the bottom portion 301a.

In some embodiments, the semiconductor substrate 301 may be a semiconductor material and may include structures including a graded layer or a buried oxide, for example. In some exemplary examples, the semiconductor substrate 301 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 301. Alternatively, the semiconductor substrate 301 may be an active layer of a semiconductor-on-insulator (SOI) substrate or a multi-layered structure such as a silicon-germanium layer formed on a bulk silicon layer.

Figure 3B:
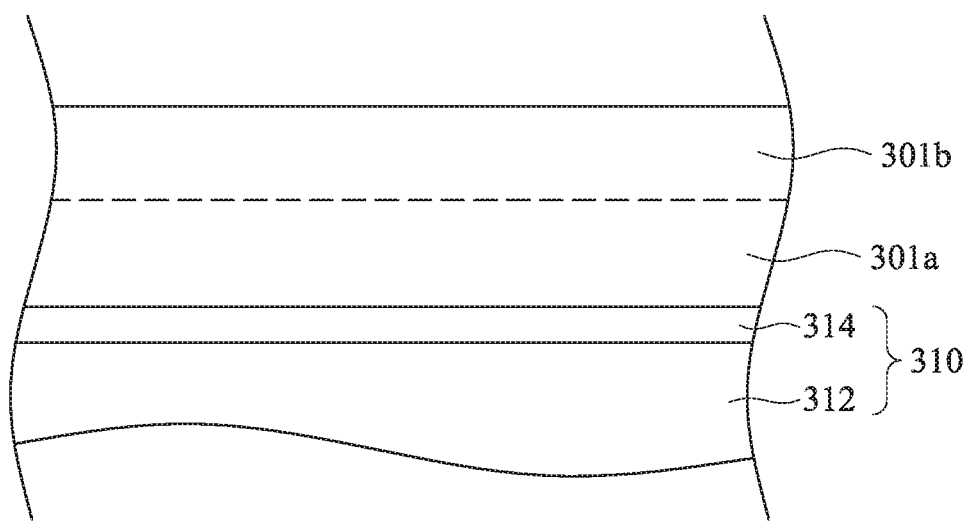

Then, operation 212 is performed to form a light-sensitive element 310 in the bottom portion 301a of the semiconductor substrate 301 as shown in FIG. 3B. In some embodiments, the light-sensitive element 310 is a photodiode and includes doped regions 312 and 314. The doped regions 312 and 314 are formed by doping with a dopant of a first type. In some embodiment, the doped regions 312 and 314 are formed by doping with an n-type dopant. In some embodiments, the doped region 312 is doped at a first concentration, and the doped region 314 is formed by doping with a second concentration greater than the first concentration. In some embodiments, the doped region 312 is doped at a concentration of about $1E12$ atoms/cm$^3$, and the doped region 314 is doped at a concentration of about $5E12$ atoms/cm$^3$, but embodiments of the present disclosure are not limited thereto.

Figure 3C:
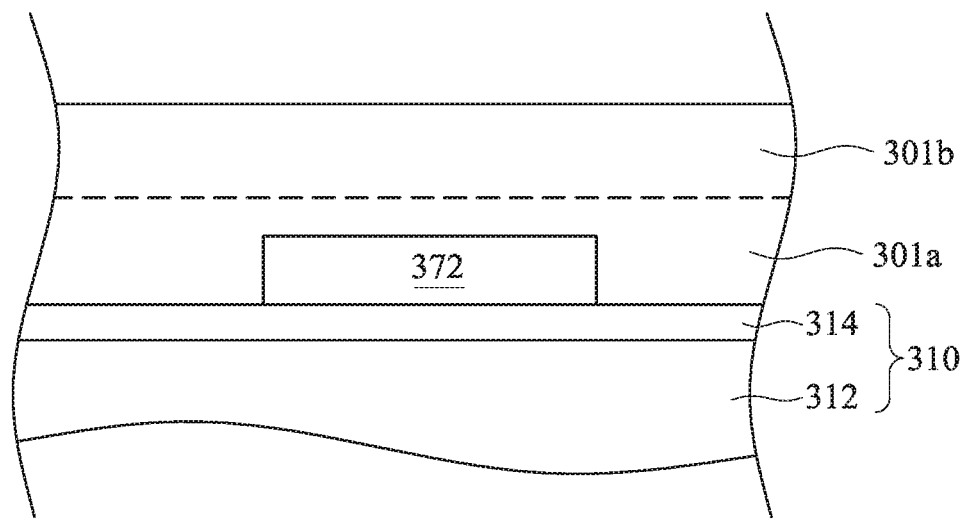

In some embodiments, a doped region 372 can be formed on the light-sensitive element 310 as shown in FIG. 3C, and the doped region 372 is formed by doping with a dopant of the first type. In some embodiments, the doped region 372 is formed by doping with the n-type dopant at a concentration of about $2.5E12$ atoms/cm$^3$. In some embodiments, the doped region 372 is not formed.

Figure 3D:
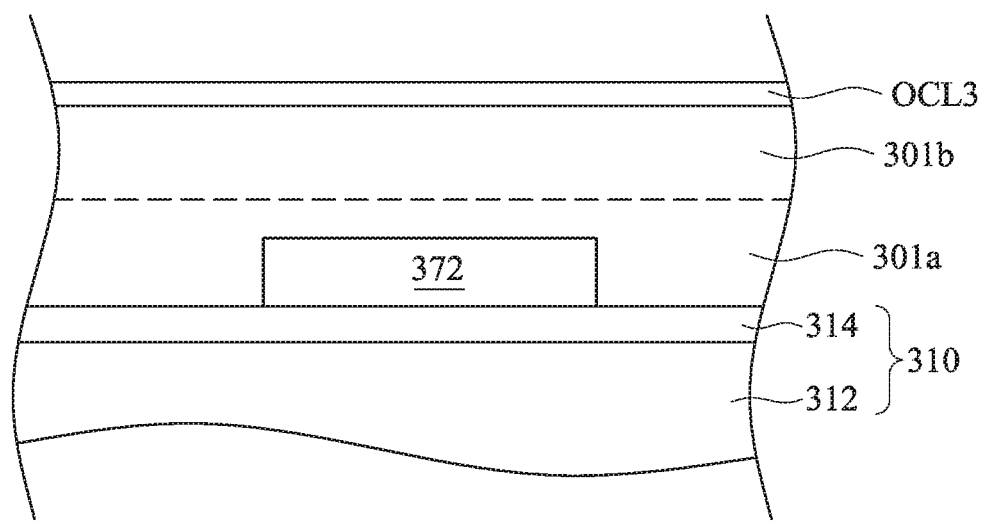

Thereafter, operation 214 is performed to form an ohmic contact layer OCL3 in or on the top portion 301b of the semiconductor substrate 301 as shown in FIG. 3D. In some embodiments, the ohmic contact layer OCL3 is formed by doping a portion of the top portion 301b of the semiconductor substrate 301. In some embodiments, a surface of the top portion 301b of the semiconductor substrate 301 is doped with the dopant of the first type at a concentration of $1E15$ atoms/cm$^3$, but embodiments of the present disclosure are not limited thereto.

Figure 3E:
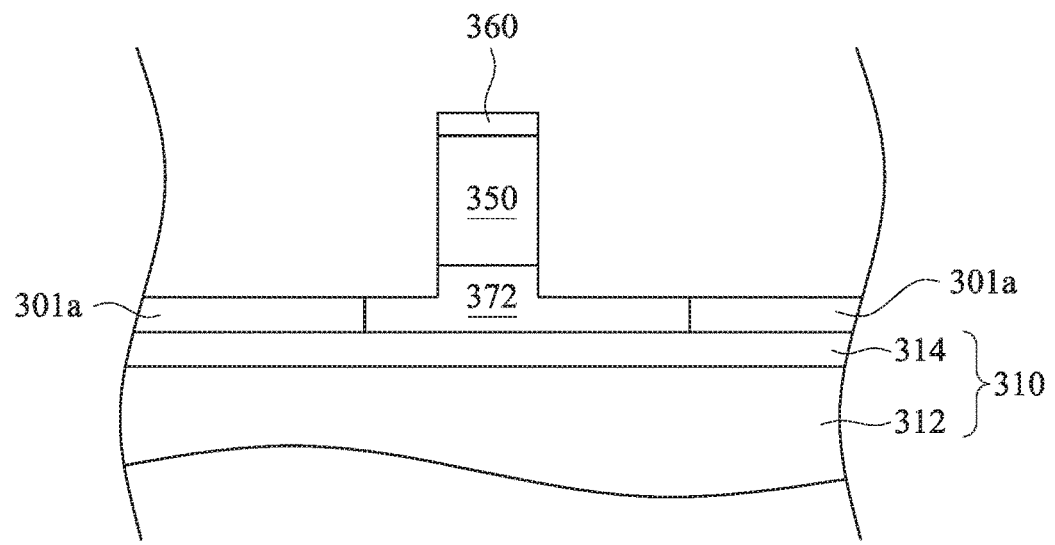

Then, operation 216 is performed to etch the top portion 301b of the semiconductor substrate 301 and the ohmic contact layer OCL3 to form a post structure 350 on the bottom portion 301a of the semiconductor substrate 301 as shown in FIG. 3E. In operation 216, the top portion 301b of the semiconductor substrate 301 is etched to form at least one portion of the post structure 350, and the ohmic contact layer OCL3 is etched to form a floating node 360 on the post structure 350. In some embodiments, a portion of the bottom portion 301a of the semiconductor substrate 301 is also etched to form another portion of the post structure 350. In some embodiments, the doped region 372 is etched to have a protrusion portion located under the post structure 350.

Figure 3F:
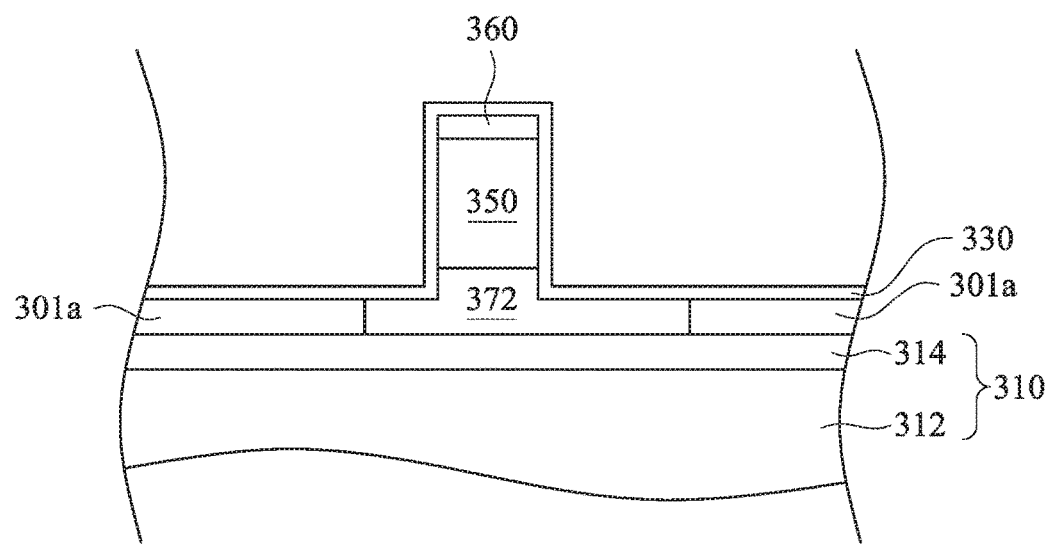

Thereafter, operation 218 is performed to blanketly forming a gate dielectric layer 330 to cover the bottom portion 301a of the semiconductor substrate 301, the post structure 350 and the floating node 360 as shown in FIG. 3F. In some embodiments, the gate dielectric layer 330 is formed by using a deposition process such as an atomic layer deposition (ALD). Other methods to form the gate dielectric layer 330 include chemical vapor deposition (CVD), physical vapor deposition (PVD), and plasma enhanced chemical vapor deposition (PECVD).

In some embodiments, the gate dielectric layer 330 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material.

Figure 3G:
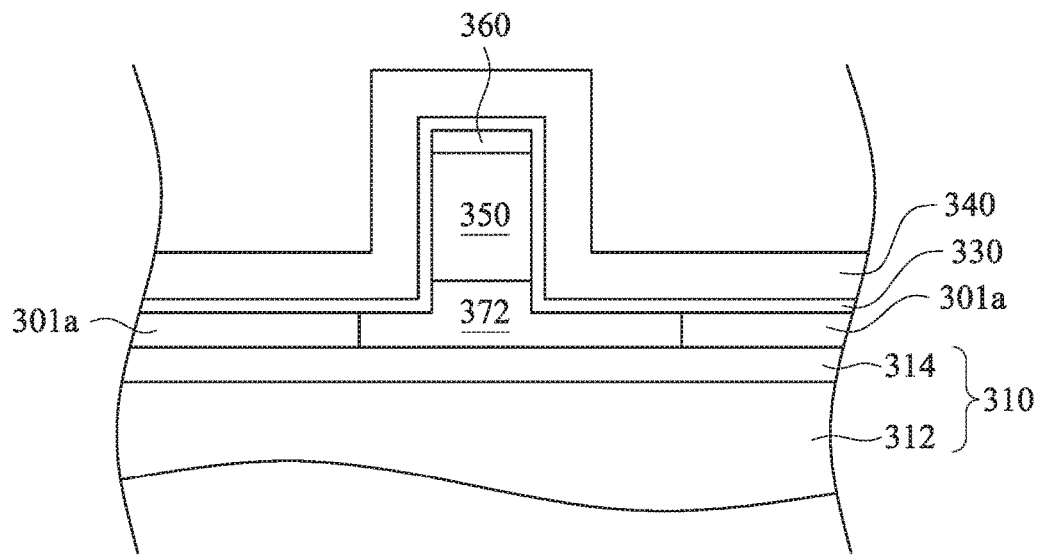

Then, operation 220 is performed to blanketly form a conductive layer 340 to cover the gate dielectric layer 330 as shown in FIG. 3G. In some embodiments, the conductive layer 340 is formed by using a deposition process such as an atomic layer deposition (ALD). Other methods to form the conductive layer 340 include chemical vapor deposition (CVD), physical vapor deposition (PVD), and plasma enhanced chemical vapor deposition (PECVD). In some embodiments, the conductive layer 340 is formed by doped poly-silicon, metal such as Al, Cu, W, Ti, Ta, TiN, TaN, NiSi, CoSi, other suitable conductive materials, or combinations thereof.

Figure 3H:
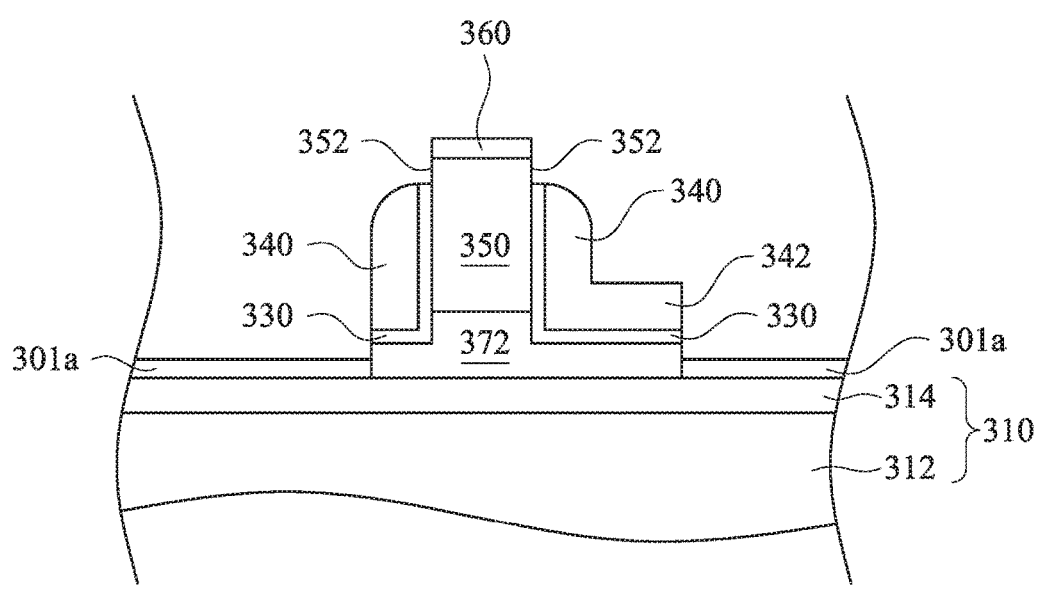

Thereafter, operation 222 is performed to etch the conductive layer 340 and the gate dielectric layer 330 to form a vertical gate structure on the post structure 350, and to expose the floating node 360 and portions 352 of sidewalls of the post structure 350 as shown in FIG. 3H. In some embodiments, the conductive layer 340 is etched to form a contact landing portion 342. In some embodiments, a portion of the bottom portion 301a of the semiconductor substrate 301 may be etched, and thus a portion of the doped region 372 is exposed.

Figure 3I:
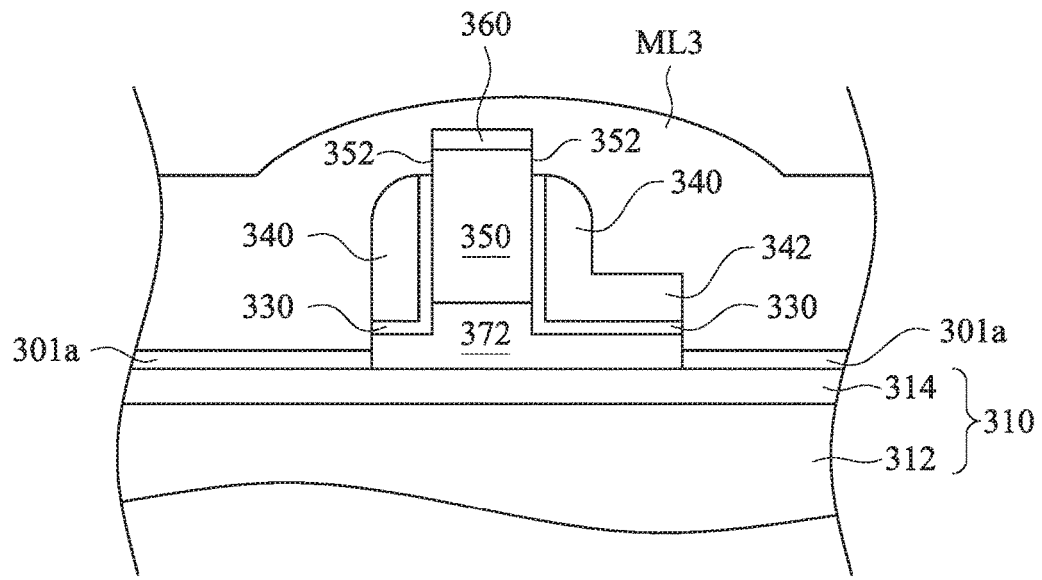
Figure 3J:
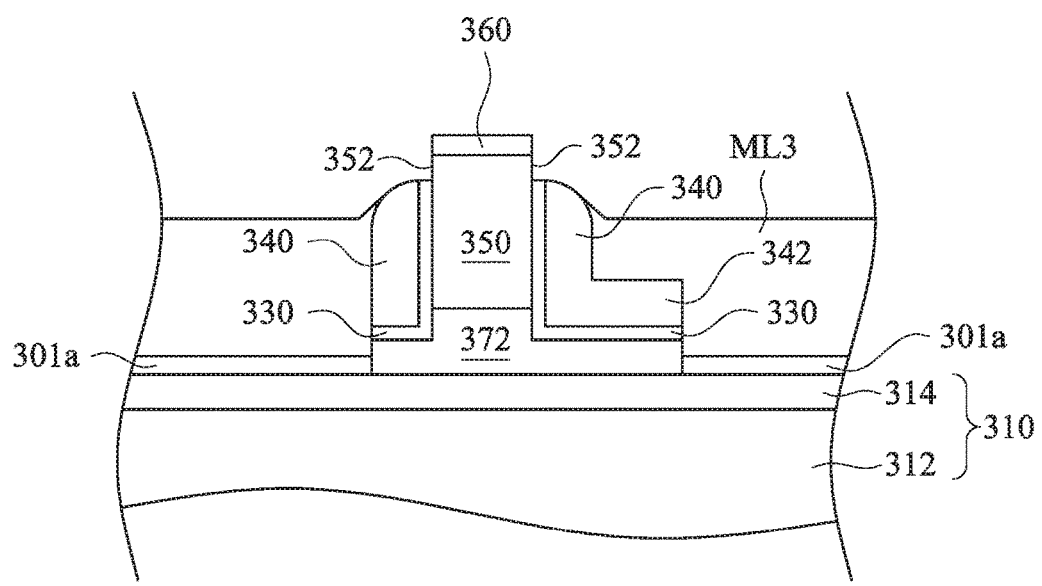
Figure 3K:
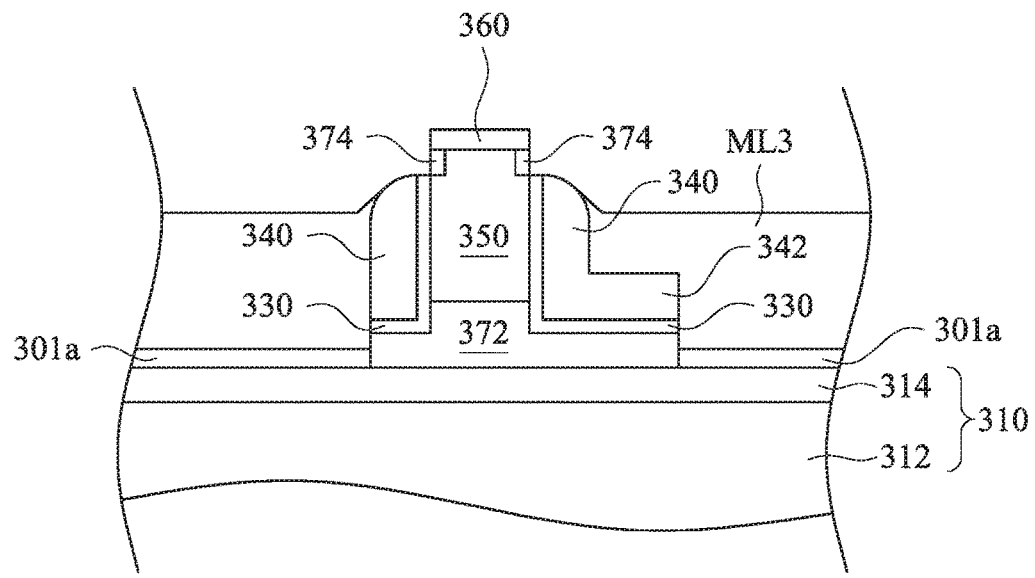

Then, operation 223 is performed to form a doped region on the exposed portions 352 of the post structure 350 as shown in FIG. 3I, FIG. 3J and FIG. 3K. In the operation 223, at first, a mask layer ML3 is formed to cover the floating node 360, the portions 352 of the post structure 350, the gate dielectric layer 330, the conductive layer 340 and the bottom portion 301a of the semiconductor substrate 301, as shown in FIG. 3I. Then, the mask ML3 is etched to expose the portions 352 of the post structure 350 as shown in FIG. 3J. Thereafter, the portions 352 of the post structure 350 are doped to form a doped region 374 surrounding the post structure 350 as shown in FIG. 3K. In some embodiments, the portions 352 of the post structure 350 are doped with the n-type dopant at a concentration of about 1E12 atoms/$cm^3$. In some embodiments, the portions 352 of the post structure 350 are doped with a tilt angle.

Figure 3L:
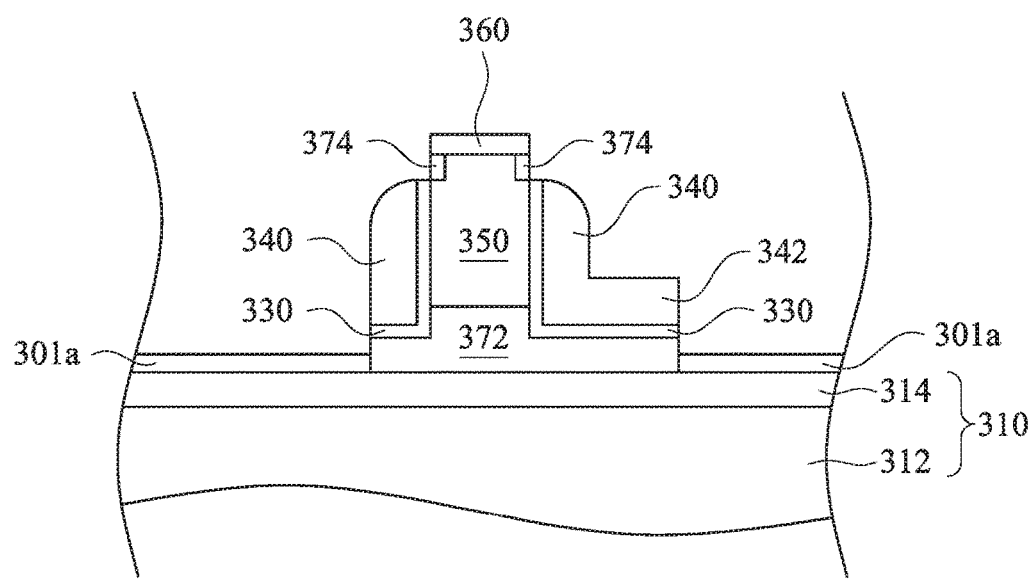

Thereafter, operation 224 is performed to remove the mask ML3 and form a protection layer 320 on the light-sensitive element 310 as shown in FIG. 3L. The protection layer 320 may be referred to as a pinning layer and formed by doping the bottom portion 301a of the semiconductor substrate 301 and the exposed portion of the doped region 372. The protection layer 320 is formed by doping with a dopant of a second type opposite to the first type. In some embodiments, the protection layer 320 is formed by doping with a p-type dopant at a concentration of about 1E13 atoms/$cm^3$.

Figure 3M:
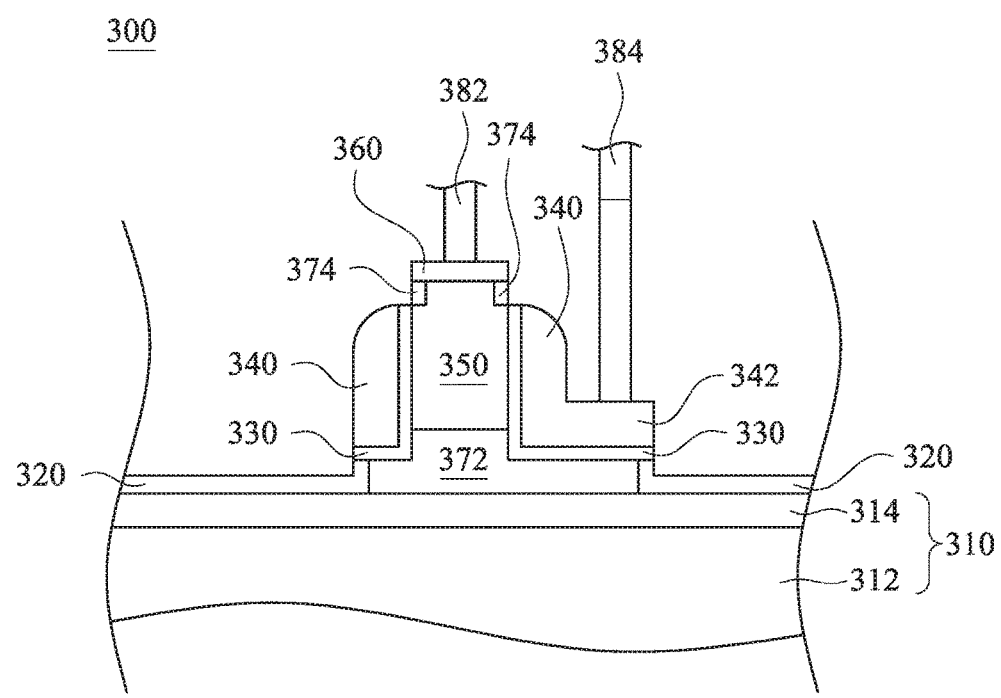

Thereafter, operation 226 is performed to form a source contact 382 on the floating node 360, and to form a gate contact 384 on the gate contact landing portion 342 of the conductive layer 340, thereby forming a pixel unit 300 as shown in FIG. 3M.

It can be understood that few masks are used in method 200 for fabricating an image sensor. For example, a mask is used to form the doped region 372 as shown in FIG. 3C. For another example, a mask is used to achieve etching the top portion 301b of the semiconductor substrate 301 and the ohmic contact layer OCL3 as shown in FIG. 3E. For further another example, a mask is used to define the contact landing portion 342 as shown in FIG. 3H. Since few masks are used in the method 200 for fabricating an image sensor, cost of the method 200 is reduced. Further, the method 200 adopts self-align methodology, and thus process window of operation of the method 200 can be enlarged.

In some embodiments, the operation 222 can be performed to enable the conductive layer 340 and the gate dielectric layer 330 to fully cover the post structure 350, and operation 223 is omitted. Therefore, no doped region is formed between the gate dielectric layer 330 and the floating node 360.

In addition, similar to the floating node 160 of the pixel unit as shown in FIG. 1C, the floating node 360 can be formed to have a smaller area to expose a portion of the post structure 350 between the floating node 360 and the gate dielectric layer 330.

Figure 4A:
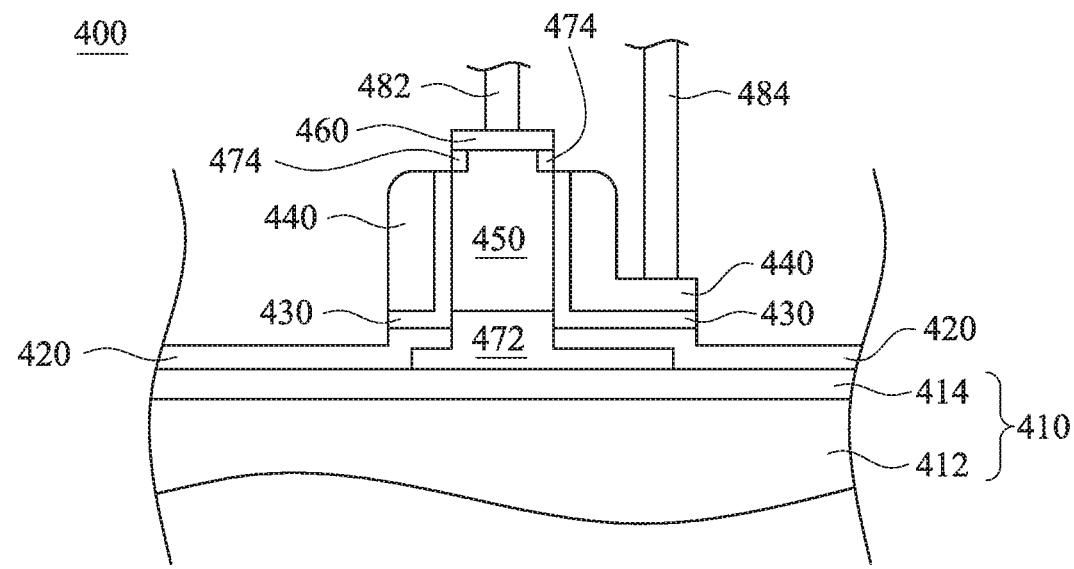
FIG. 4A is a schematic cross-sectional view of a pixel unit of an image sensor in accordance with some embodiments of the present disclosure.
Figure 4B:
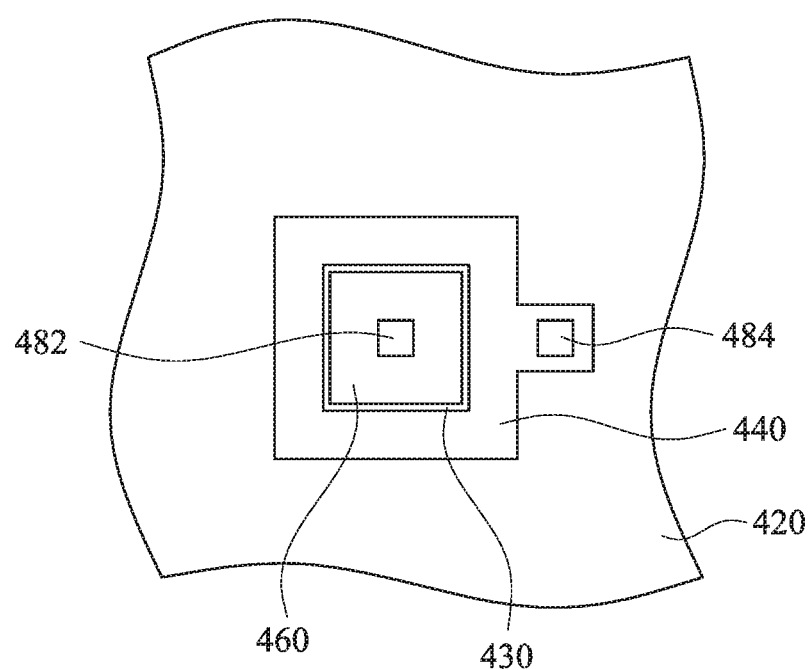
FIG. 4B is a schematic top view of the pixel unit of an image sensor in accordance with some embodiments of the present disclosure.

Referring to FIG. 4A and FIG. 4B, FIG. 4A is a schematic cross-sectional view of a pixel unit 400 of an image sensor in accordance with some embodiments of the present disclosure, and FIG. 4B is a schematic top view of the pixel unit 400 of an image sensor in accordance with some embodiments of the present disclosure. The pixel unit 400 is defined by plural isolation structures (not shown). In some embodiments, the isolation structures are doped (e.g., p-type, n-type, or a combination thereof) regions. In some embodiments, the isolation structures are shallow trench isolations (STIs).

The pixel unit 400 includes a light-sensitive element 410, a protection layer 420, a gate dielectric layer 430, a conductive layer 440, a post structure 450 and a floating node 460. In some embodiments, the light-sensitive element 410 is a photodiode including doped regions 412 and 414. The doped regions 412 and 414 are formed by doping with a dopant of a first type. In some embodiment, the doped regions 412 and 414 are formed by doping with an n-type dopant. In some embodiments, the doped region 412 is doped at a first concentration, and the doped region 414 is doped at a second concentration greater than the first concentration. In some embodiments, the doped region 412 is doped at a concentration of about 1E12 atoms/$cm^3$, and the doped region 414 is doped at a concentration of about 5E12 atoms/$cm^3$, but embodiments of the present disclosure are not limited thereto.

The protection layer 420 is disposed on the light-sensitive element 410 to stabilize the light-sensitive element 410. The protection layer 420 may be referred to as a pinning layer and formed by doping with a dopant of a second type opposite to the first type. In some embodiments, the protection layer 420 is formed by doping with a p-type dopant at a concentration of about 1E13 atoms/$cm^3$.

The gate dielectric layer 430 and the conductive layer 440 are sequentially disposed on the light-sensitive element 410 and surround the post structure 450, thereby forming a vertical gate structure on the light-sensitive element 410. In some embodiments, the gate dielectric layer 430 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material. In some embodiments, the conductive layer 440 is formed by doped poly-silicon, metal such as Al, Cu, W, Ti, Ta, TiN, TaN, NiSi, CoSi, other suitable conductive materials, or combinations thereof.

The floating node 460 is formed on the post structure 450 and can be considered as a source node. In some embodiments, the pixel unit 400 further includes a source contact 482 and a gate contact 484 formed on the floating node 460 and the conductive layer 440.

Therefore, when the vertical gate structure is turned on to transfer signals generated by the light-sensitive element 410 to corresponding peripheral circuits, a vertical channel is induced in the post structure 450 to transfer the signals of the light-sensitive element 410. Since the channel induced by the vertical gate structure is not located in a substrate in which the light-sensitive element 410 is formed, the light-sensitive element 410 can be formed to occupy a big area of the pixel unit 400, and high quantum efficiency (QE) is achieved.

In some embodiments, a doped region 472 is formed on the light-sensitive element 410 and a portion of the protection layer 420 is formed on the doped region 472. The doped region 472 is formed by doping with a dopant of the first type. In some embodiments, the doped region 472 is formed by doping with the n-type dopant at a concentration of about 2.5E12 atoms/$cm^3$.

Figure 4C:
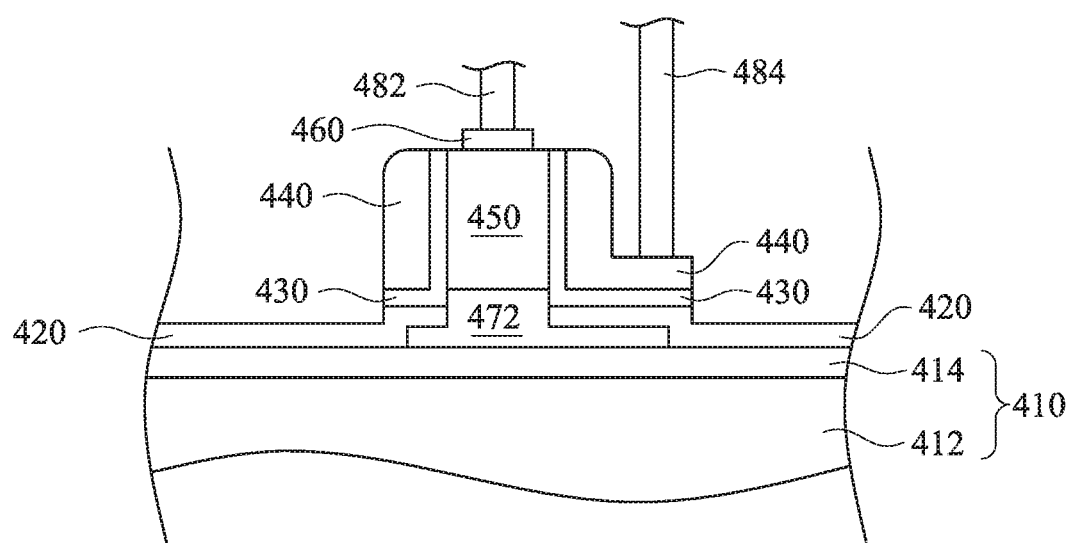
FIG. 4C is a schematic cross-sectional view of a pixel unit of an image sensor in accordance with some embodiments of the present disclosure.

Further, in some embodiments, a doped region 474 is disposed on sidewalls of the post structure 450. The doped region 474 is located between the gate dielectric layer 430 and the floating node 460 and surrounds the post structure 450, thereby reducing capacitance of the gate dielectric layer 430. The doped region 474 is formed by doping with a dopant of the first type. In some embodiments, the doped region 474 is formed by doping with the n-type dopant at a concentration of about 1E12 atoms/$cm^3$. In some embodiments, the doped region 474 is omitted and the floating node 460 does not fully cover the top surface of the post structure 450 as shown in FIG. 4C.

Figure 5:
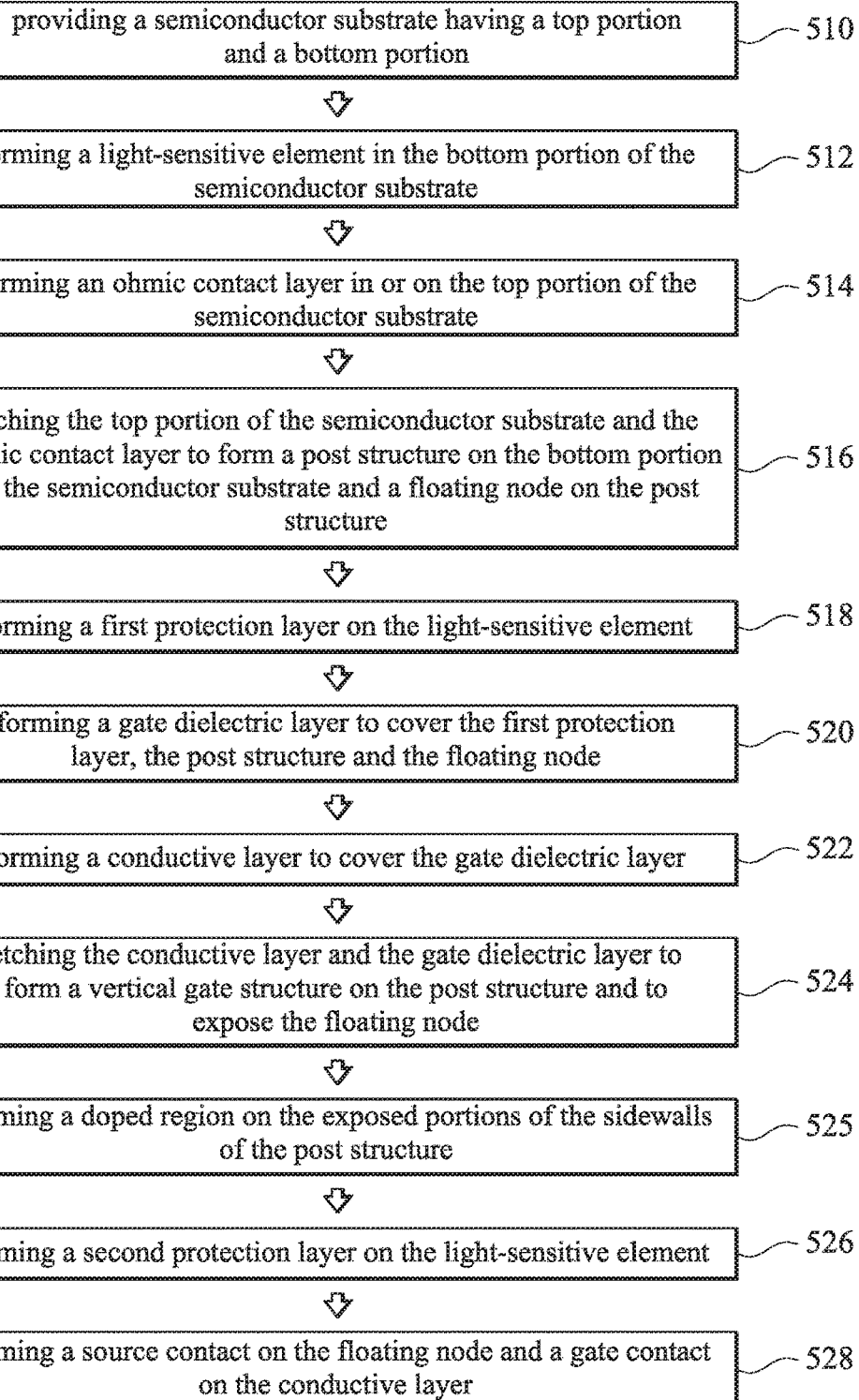
FIG. 5 is a flow chart showing a method for fabricating an image sensor in accordance with embodiments of the present disclosure.
Figure 6A:
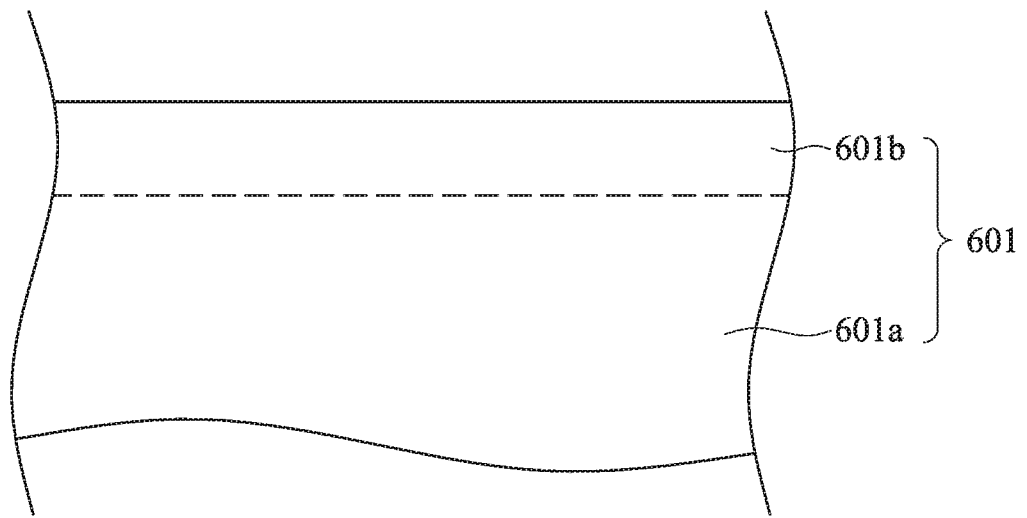
FIG. 6A to FIG. 6N are cross-sectional views of intermediate stages showing the method for fabricating an image sensor in accordance with some embodiments of the present disclosure.
Figure 6B:
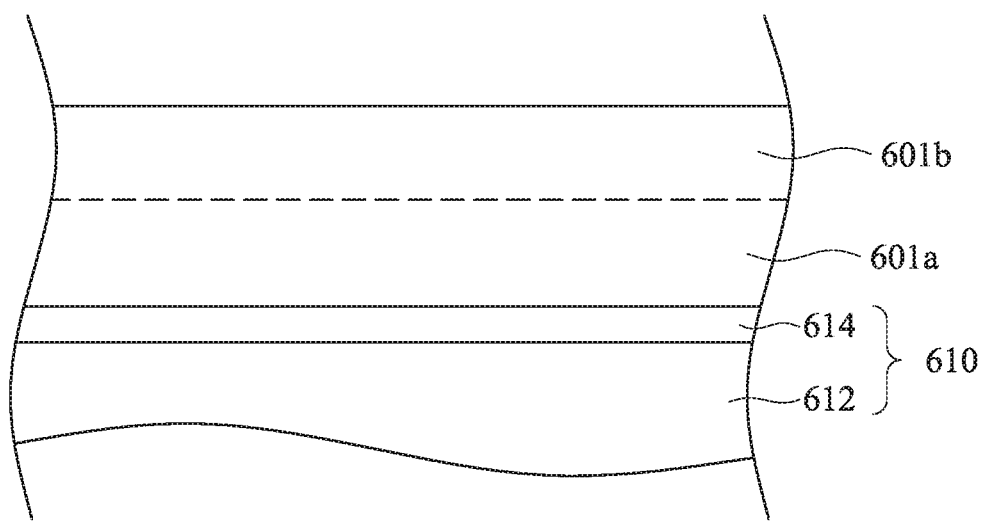
Figure 6C:
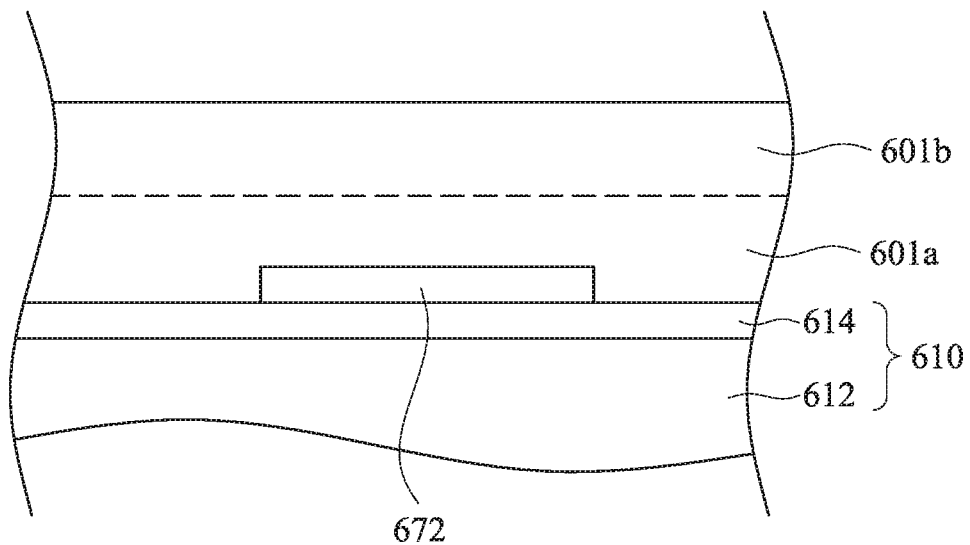
Figure 6D:
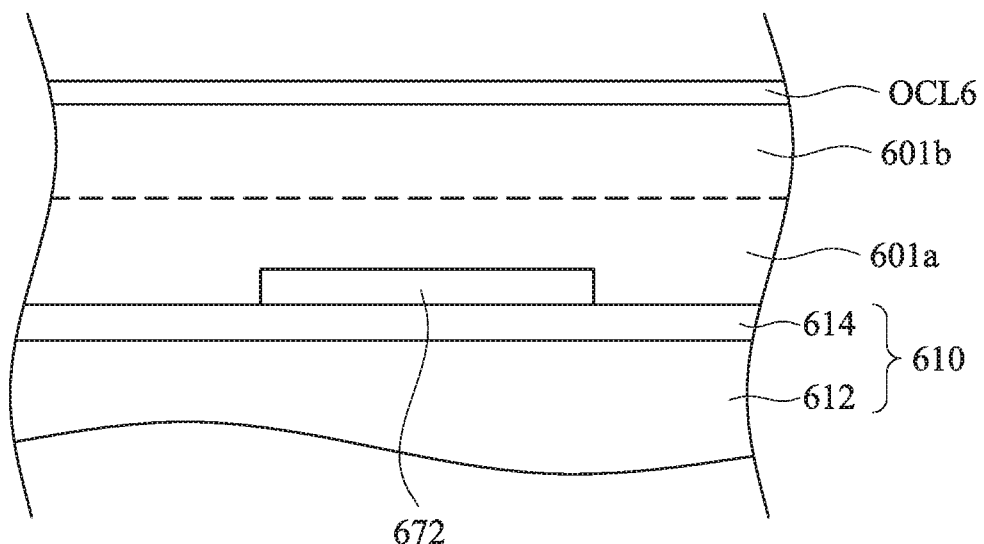
Figure 6E:
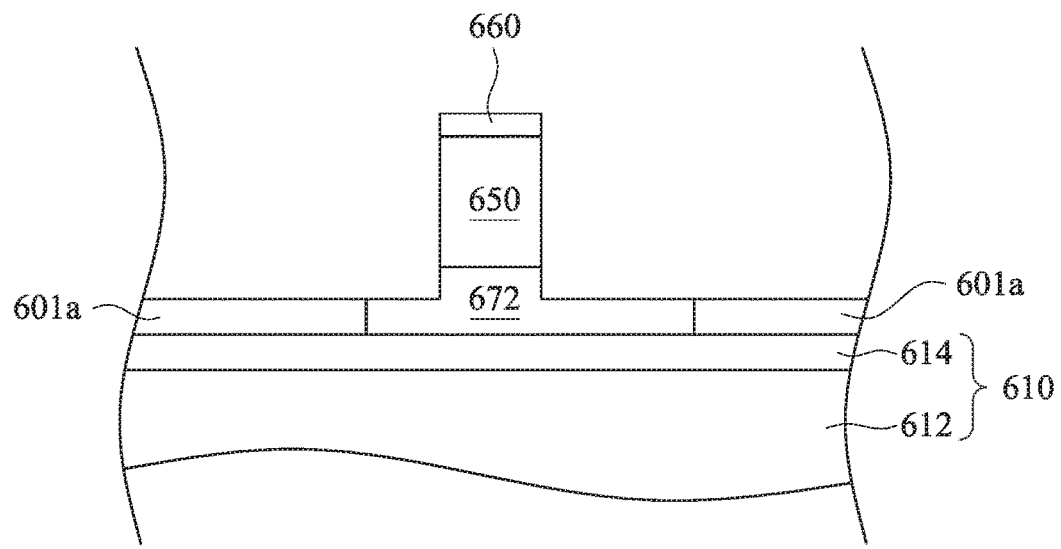
Figure 6F:
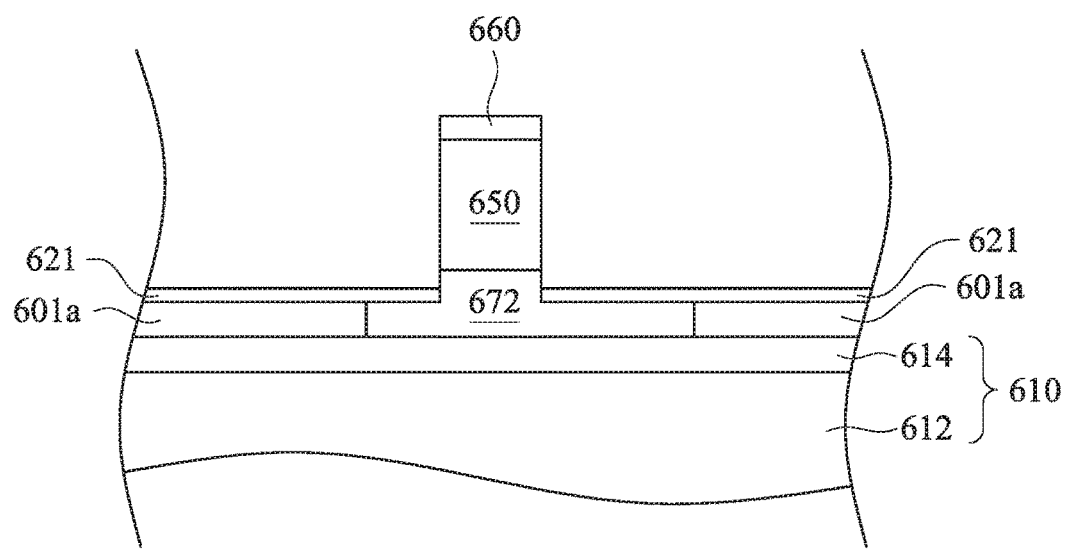
Figure 6G:
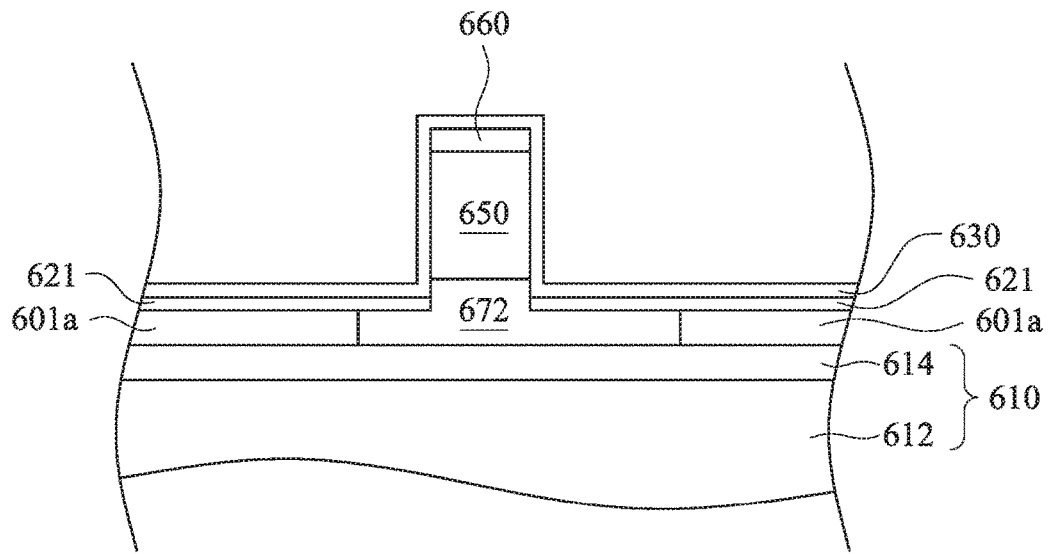
Figure 6H:
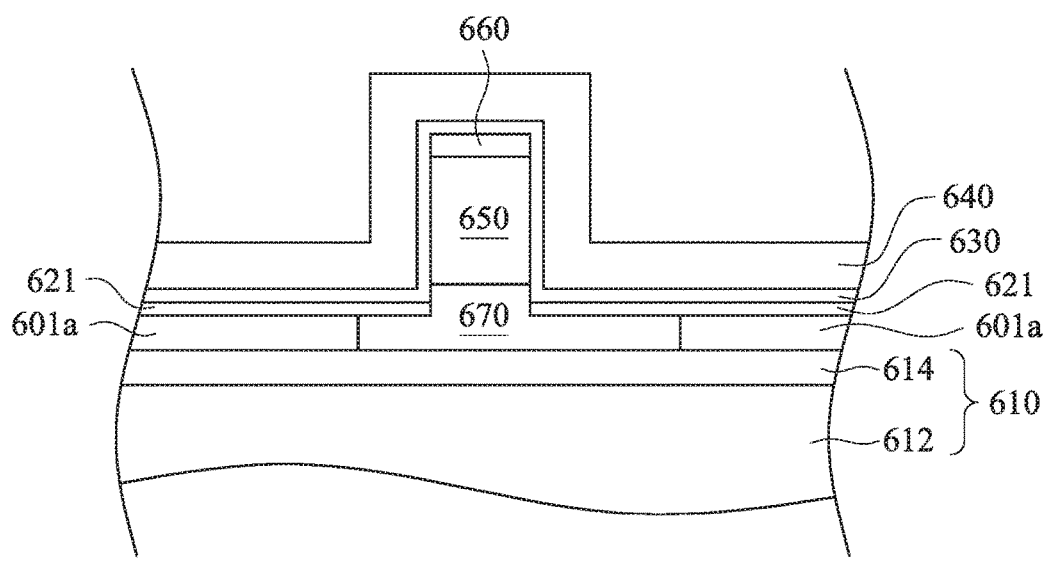
Figure 6I:
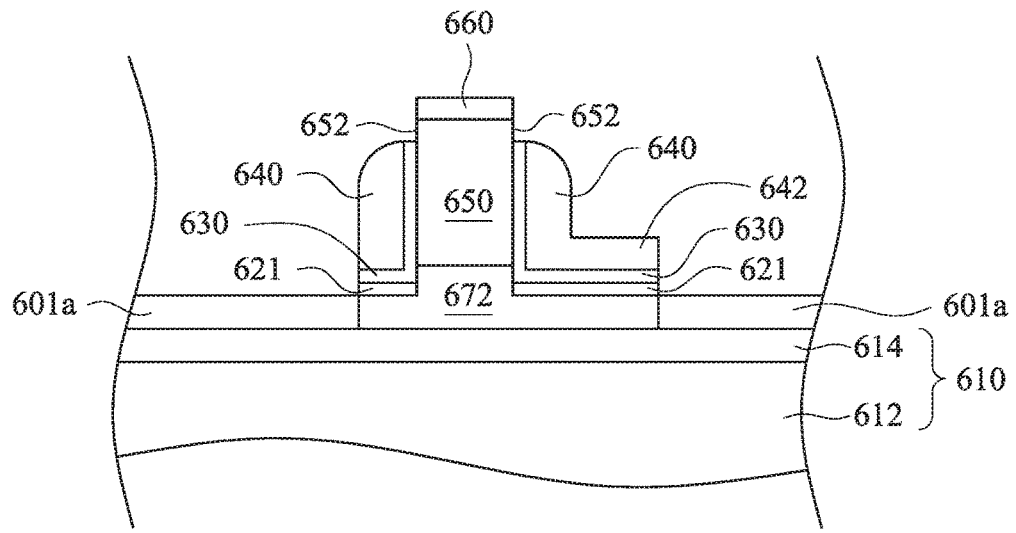
Figure 6J:
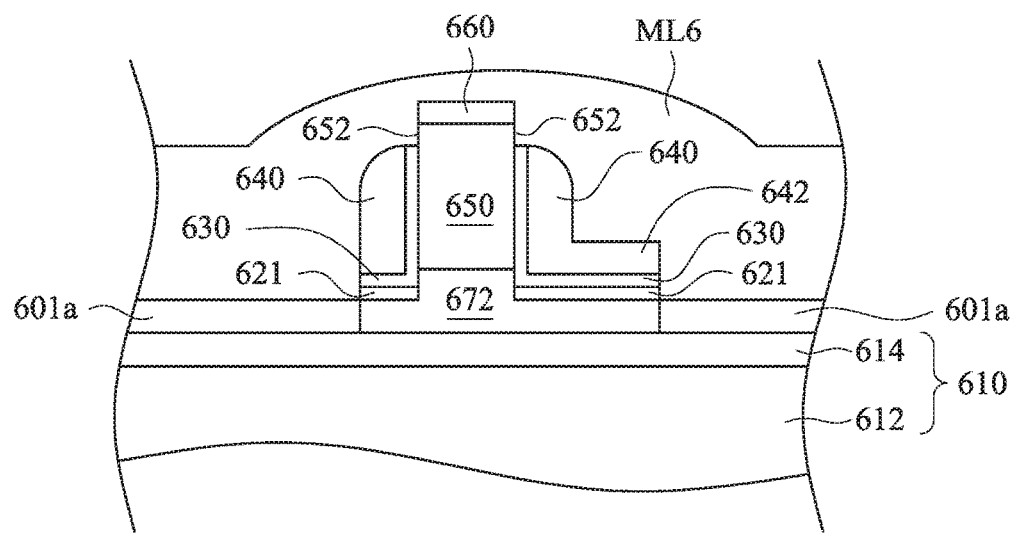
Figure 6K:
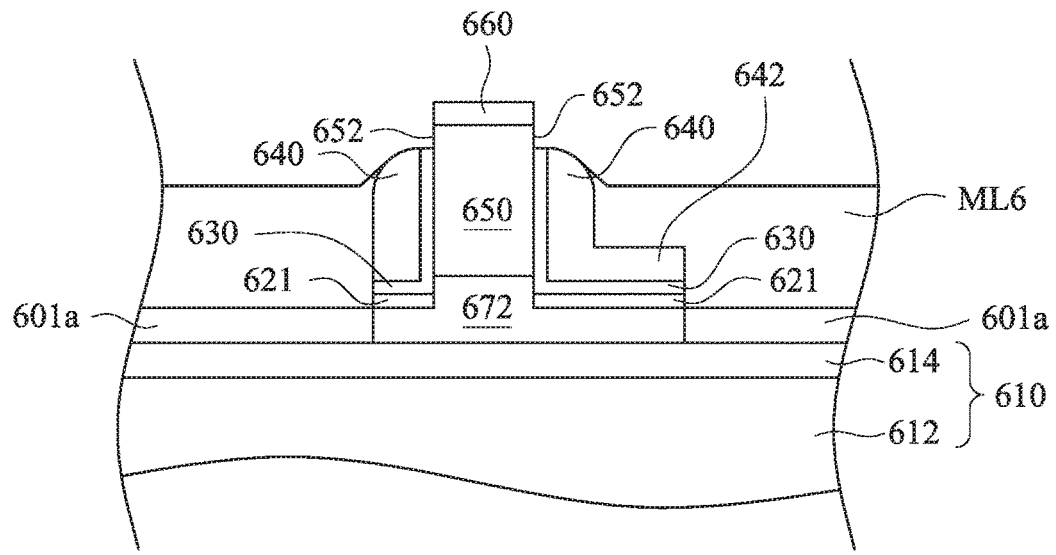
Figure 6L:
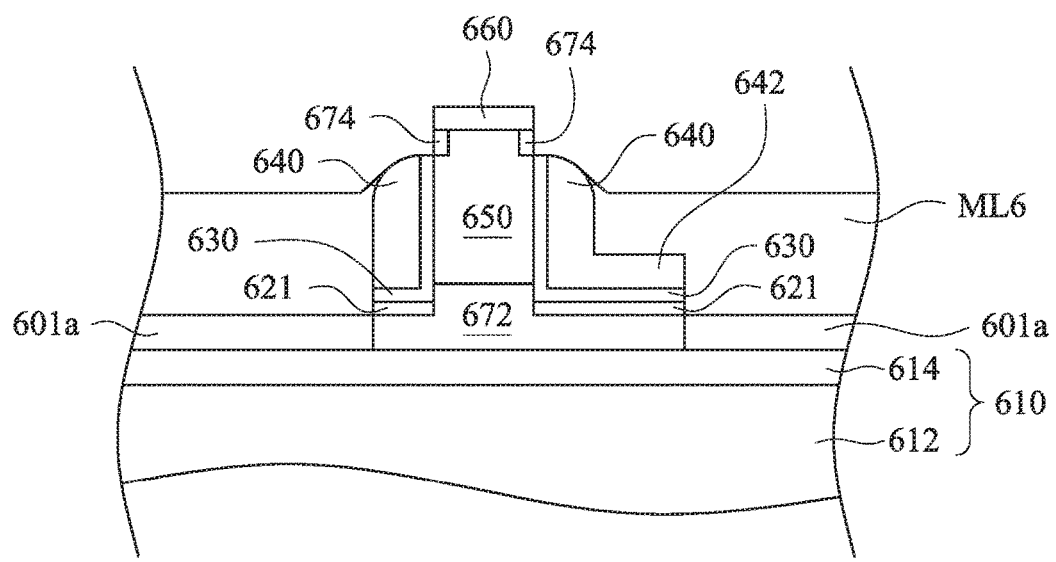
Figure 6M:
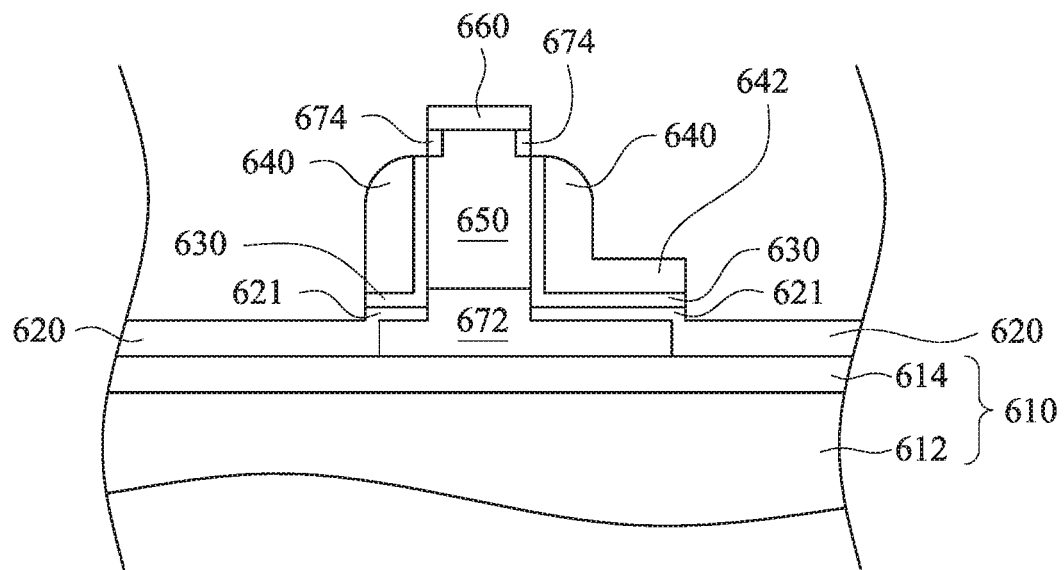
Figure 6N:
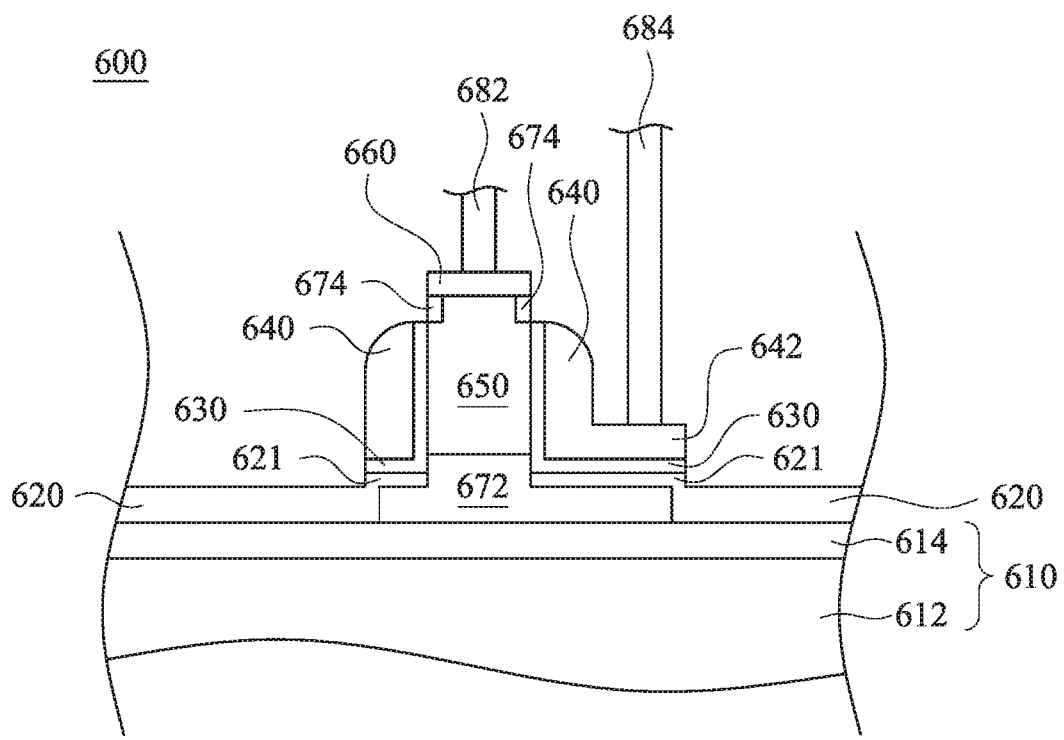

Referring to FIG. 5 and FIG. 6A to FIG. 6N, FIG. 5 is a flow chart showing a method 500 for fabricating an image sensor in accordance with embodiments of the present disclosure, and FIG. 6A to FIG. 6N are cross-sectional views of intermediate stages showing the method 500 for fabricating an image sensor in accordance with some embodiments of the present disclosure. The method 500 begins at operation 510. Operation 510 is performed to provide a semiconductor substrate 601 as shown in FIG. 6A. The semiconductor substrate 601 has a bottom portion 601a and a top portion 601b on the bottom portion 601a.

In some embodiments, the semiconductor substrate 601 may be a semiconductor material and may include structures including a graded layer or a buried oxide, for example. In some exemplary examples, the semiconductor substrate 601 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 601. Alternatively, the semiconductor substrate 601 may be an active layer of a semiconductor-on-insulator (SOI) substrate or a multi-layered structure such as a silicon-germanium layer formed on a bulk silicon layer.

Then, operation 512 is performed to form a light-sensitive element 610 in the bottom portion 601a of the semiconductor substrate 601 as shown in FIG. 6B. In some embodiments, the light-sensitive element 610 is a photodiode and includes doped regions 612 and 614. The doped regions 612 and 614 are formed by doping with a dopant of a first type. In some embodiment, the doped regions 612 and 614 are formed by doping with an n-type dopant. In some embodiments, the doped region 612 is doped at a first concentration, and the doped region 614 is formed by doping with a second concentration greater than the first concentration. In some embodiments, the doped region 612 is doped at a concentration of about 1E12 atoms/$cm^3$, and the doped region 614 is doped at a concentration of about 5E12 atoms/$cm^3$, but embodiments of the present disclosure are not limited thereto.

In some embodiments, a doped region 672 can be formed on the light-sensitive element 610 as shown in FIG. 6C, and the doped region 672 is formed by doping with a dopant of the first type. In some embodiments, the doped region 672 is formed by doping with the n-type dopant at a concentration of about 2.5E12 atoms/$cm^3$. In some embodiments, the doped region 672 is not formed.

Thereafter, operation 514 is performed to form an ohmic contact layer OCL6 in or on the top portion 601b of the semiconductor substrate 601 as shown in FIG. 6D. In some embodiments, the ohmic contact layer OCL6 is formed by doping a portion of the top portion 601b of the semiconductor substrate 601. In some embodiments, a surface of the top portion 601b of the semiconductor substrate 601 is doped with the dopant of the first type at a concentration of 1E15 atoms/$cm^3$, but embodiments of the present disclosure are not limited thereto.

Then, operation 516 is performed to etch the top portion 601b of the semiconductor substrate 601 and the ohmic contact layer OCL6 to form a post structure 650 on the bottom portion 601a of the semiconductor substrate 601 as shown in FIG. 6E. In operation 516, the top portion 601b of the semiconductor substrate 601 is etched to form at least one portion of the post structure 650, and the ohmic contact layer OCL6 is etched to form a floating node 660 on the post structure 650. In some embodiments, a portion of the bottom portion 601a of the semiconductor substrate 601 is also etched to form another portion of the post structure 650. In some embodiments, the doped region 672 is etched to have a protrusion portion located under the post structure 650.

Thereafter, operation 518 is performed to form a first protection layer 621 on the light-sensitive element 610 as shown in FIG. 6F. The first protection layer 621 may be referred to as a pinning layer and formed by doping the bottom portion 601a of the semiconductor substrate 601 and a portion of the doped region 672. The first protection layer 621 is formed by doping with a dopant of a second type opposite to the first type. In some embodiments, the first protection layer 621 is formed by doping with a p-type dopant at a concentration of about 1E12 atoms/$cm^3$.

Then, operation 520 is performed to blanketly forming a gate dielectric layer 630 to cover the first protection layer 621, the post structure 650 and the floating node 660 as shown in FIG. 6G. In some embodiments, the gate dielectric layer 630 is formed by using a deposition process such as an atomic layer deposition (ALD). Other methods to form the gate dielectric layer 630 include chemical vapor deposition (CVD), physical vapor deposition (PVD), and plasma enhanced chemical vapor deposition (PECVD).

In some embodiments, the gate dielectric layer 630 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$) alloy, or another suitable material.

Thereafter, operation 522 is performed to blankly form a conductive layer 640 to cover the gate dielectric layer 630 as shown in FIG. 6H. In some embodiments, the conductive layer 640 is formed by using a deposition process such as an atomic layer deposition (ALD). Other methods to form the conductive layer 640 include chemical vapor deposition (CVD), physical vapor deposition (PVD), and plasma enhanced chemical vapor deposition (PECVD). In some embodiments, the conductive layer 640 is formed by doped poly-silicon, metal such as Al, Cu, W, Ti, Ta, TiN, TaN, NiSi, CoSi, other suitable conductive materials, or combinations thereof.

Then, operation 524 is performed to etch the conductive layer 640 and the gate dielectric layer 630 to form a vertical gate structure on the post structure 650, and to expose the floating node 660 and portions 652 of sidewalls of the post structure 650 as shown in FIG. 6I. In some embodiments, the conductive layer 640 is etched to form a contact landing portion 642, and the first protection layer 621 is etched to expose the underlying bottom portion 601a of the semiconductor substrate 601.

Thereafter, operation 525 is performed to form a doped region on the exposed portions 652 of the post structure 650 as shown in FIG. 6J, FIG. 6K and FIG. 6L. In the operation 525, at first, a mask layer ML6 is formed to cover the floating node 660, the portions 652 of the post structure 650, the gate dielectric layer 630, the conductive layer 640, the first protection layer 621 and the bottom portion 601a of the semiconductor substrate 601, as shown in FIG. 6J. Then, the mask ML6 is etched to expose the portions 652 of the post structure 650 as shown in FIG. 6K. Thereafter, the portions 652 of the post structure 650 are doped to form a doped region 674 surrounding the post structure 650 as shown in FIG. 6L. In some embodiments, the portions 652 of the post structure 650 are doped with the n-type dopant at a concentration of about 1E12 atoms/cm$^3$. In some embodiments, the portions 652 of the post structure 650 are doped with a tilt angle.

Thereafter, operation 526 is performed to remove the mask ML6 and form a second protection layer 622 on the light-sensitive element 610 as shown in FIG. 6M. The second protection layer 622 may be referred to as a pinning layer and formed by doping the bottom portion 601a of the semiconductor substrate 601 and a portion of the doped region 672. The second protection layer 622 is formed by doping with a dopant of a second type opposite to the first type. In some embodiments, the second protection layer 622 is formed by doping with a p-type dopant at a concentration of about 1E13 atoms/cm3. In some embodiments, the second protection layer 622 and the first protection layer 621 are doped at the same concentration, such as about 1E13 atoms/cm3.

Then, operation 628 is performed to form a source contact 682 on the floating node 660, and to form a gate contact 684 on the gate contact landing portion 642 of the conductive layer 640, thereby forming a pixel unit 600 as shown in FIG. 6N.

It can be understood that few masks are used in method 500 for fabricating an image sensor. For example, a mask is used to form the doped region 672 as shown in FIG. 6C. For another example, a mask is used to achieve etching the top portion 601b of the semiconductor substrate 601 and the ohmic contact layer OCL6 as shown in FIG. 6E. For further another example, a mask is used to define the contact landing portion 642 as shown in FIG. 6I. Since few masks are used in the method 500 for fabricating an image sensor, cost of the method 500 is reduced. Further, the method 500 adopts self-align methodology, and thus process window of operation of the method 500 can be enlarged.

In some embodiments, the operation 524 can be performed to enable the conductive layer 640 and the gate dielectric layer 630 to fully cover the post structure 650, and operation 525 is omitted. Therefore, no doped region is formed between the gate dielectric layer 630 and the floating node 660.

In addition, similar to the floating node 460 of the pixel unit as shown in FIG. 4C, the floating node 660 can be formed to have a smaller area to expose a portion of the post structure 650 between the floating node 660 and the gate dielectric layer 630.

Figure 7A:
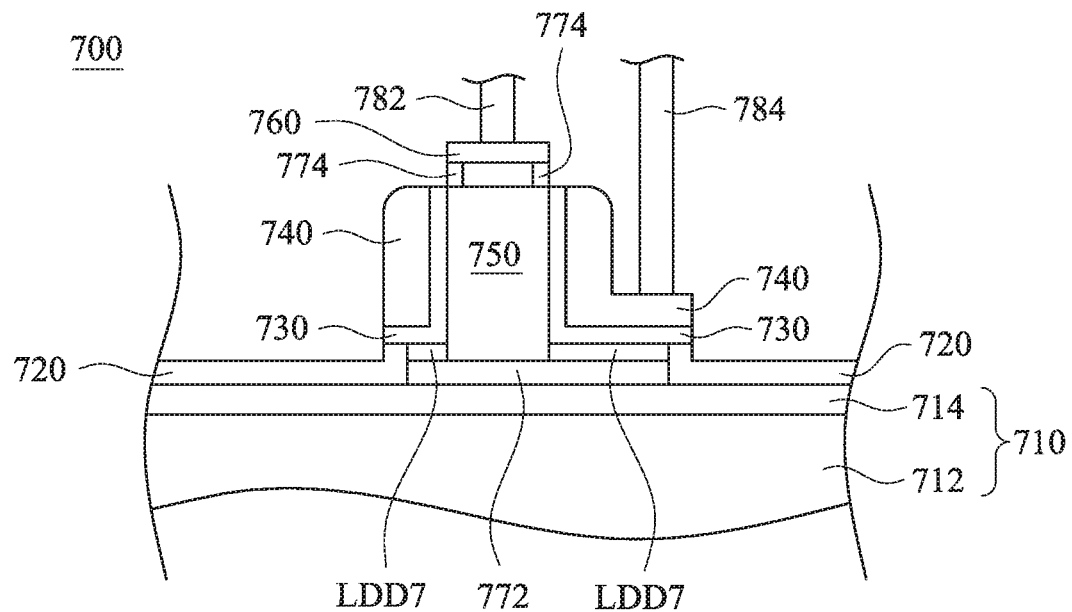
FIG. 7A is a schematic cross-sectional view of a pixel unit of an image sensor in accordance with some embodiments of the present disclosure.
Figure 7B:
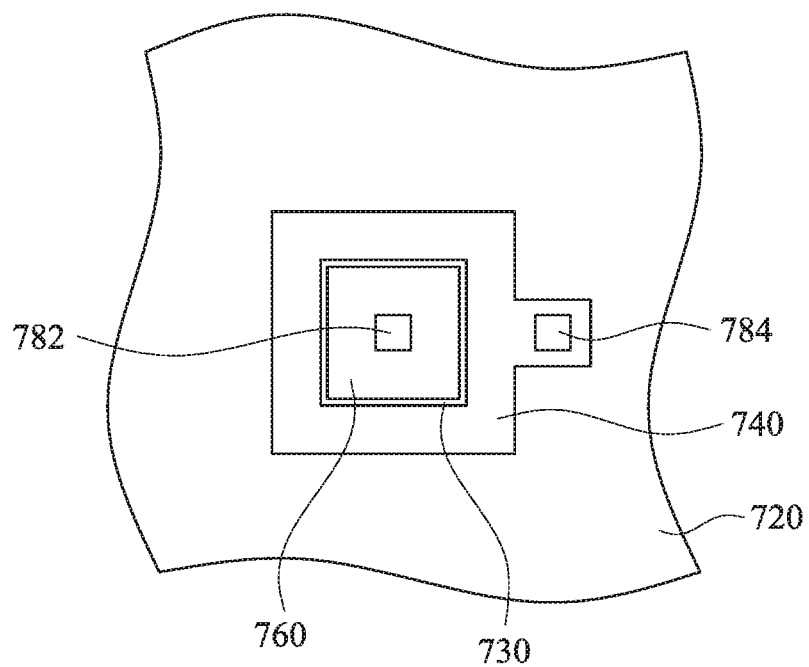
FIG. 7B is a schematic top view of the pixel unit of an image sensor in accordance with some embodiments of the present disclosure.

Referring to FIG. 7A and FIG. 7B, FIG. 7A is a schematic cross-sectional view of a pixel unit 700 of an image sensor in accordance with some embodiments of the present disclosure, and FIG. 7B is a schematic top view of the pixel unit 700 of an image sensor in accordance with some embodiments of the present disclosure. The pixel unit 700 is defined by plural isolation structures (not shown). In some embodiments, the isolation structures are doped (e.g., p-type, n-type, or a combination thereof) regions. In some embodiments, the isolation structures are shallow trench isolations (STIs).

The pixel unit 700 includes a light-sensitive element 710, a protection layer 720, a gate dielectric layer 730, a conductive layer 740, a post structure 750, a floating node 760 and a lightly-doped region LDD7. In some embodiments, the light-sensitive element 710 is a photodiode including doped regions 712 and 714. The doped regions 712 and 714 are formed by doping with a dopant of a first type. In some embodiment, the doped regions 712 and 714 are formed by doping with an n-type dopant. In some embodiments, the doped region 712 is doped at a first concentration, and the doped region 714 is doped at a second concentration greater than the first concentration. In some embodiments, the doped region 712 is doped at a concentration of about 1E12 atoms/cm$^3$, and the doped region 714 is doped at a concentration of about 5E12 atoms/cm$^3$, but embodiments of the present disclosure are not limited thereto.

The protection layer 720 is disposed on the light-sensitive element 710 to stabilize the light-sensitive element 710. The protection layer 720 may be referred to as a pinning layer and formed by doping with a dopant of a second type opposite to the first type. In some embodiments, the protection layer 720 is formed by doping with a p-type dopant at a concentration of about 1E13 atoms/cm$^3$.

The lightly-doped region LDD7 is formed on the light-sensitive element 710 and surrounds the post structure 750. In some embodiments, the lightly-doped region LDD7 is formed by doping with a dopant of the first type. In some embodiments, the lightly-doped region LDD7 is formed by doping with the n-type dopant at a third concentration smaller than the second concentration. In some embodiment, the lightly-doped region LDD7 is doped at a concentration of about 1E12 atoms/cm$^3$.

The gate dielectric layer 730 and the conductive layer 740 are sequentially disposed on the lightly-doped region LDD7 and surround the post structure 750, thereby forming a vertical gate structure on the light-sensitive element 710. In some embodiments, the gate dielectric layer 730 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$), or another suitable material. In some embodiments, the conductive layer 740 is formed by doped poly-silicon, metal such as Al, Cu, W, Ti, Ta, TiN, TaN, NiSi, CoSi, other suitable conductive materials, or combinations thereof.

The floating node 760 is formed on the post structure 750 and can be considered as a source node. In some embodiments, the pixel unit 700 further includes a source contact 782 and a gate contact 784 formed on the floating node 760 and the conductive layer 740.

Therefore, when the vertical gate structure is turned on to transfer signals generated by the light-sensitive element 710 to corresponding peripheral circuits, a vertical channel is induced in the post structure 750 to transfer the signals of the light-sensitive element 710. Since the channel induced by the vertical gate structure is not located in a substrate in which the light-sensitive element 710 is formed, the light-sensitive element 710 can be formed to occupy a big area of the pixel unit 700, and high quantum efficiency (QE) is achieved.

In some embodiments, a doped region 772 is formed on the light-sensitive element 710, and the doped region 772 is formed by doping with a dopant of the first type. In some embodiments, the doped region 772 is formed by doping with the n-type dopant at a concentration of about 2.5E12 atoms/cm$^3$.

Figure 7C:
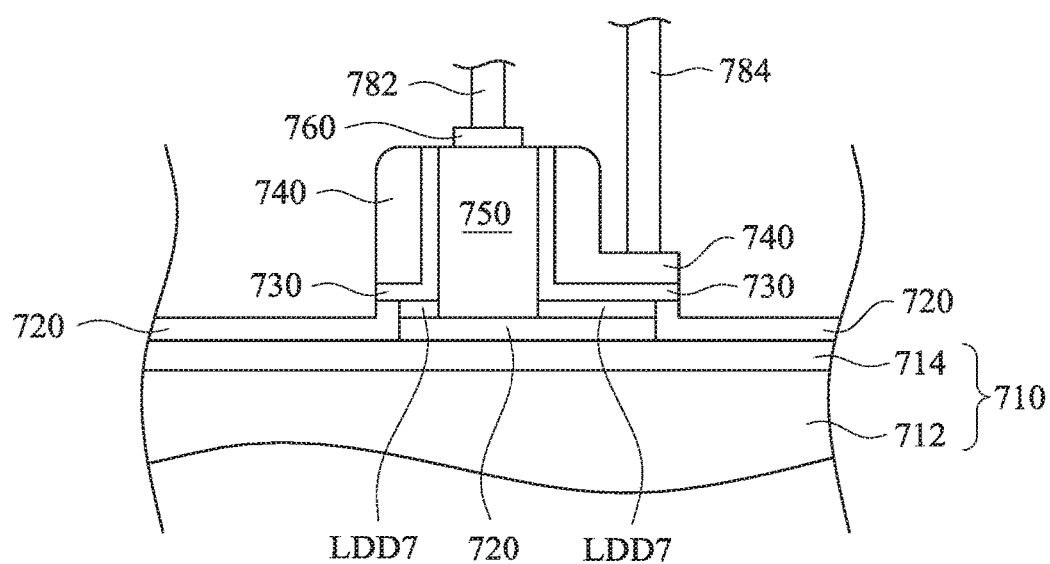
FIG. 7C is a schematic cross-sectional view of a pixel unit of an image sensor in accordance with some embodiments of the present disclosure.

Further, in some embodiments, a doped region 774 is disposed on sidewalls of the post structure 750. The doped region 774 is located between the gate dielectric layer 730 and the floating node 760 and surrounds the post structure 750, thereby reducing capacitance of the gate dielectric layer 730. The doped region 774 is formed by doping with a dopant of the first type. In some embodiments, the doped region 774 is formed by doping with the n-type dopant at a concentration of about 1E12 atoms/cm$^3$. In some embodiments, the doped region 774 is omitted and the floating node 460 does not fully cover the top surface of the post structure 750 as shown in FIG. 7C.

Figure 9A:
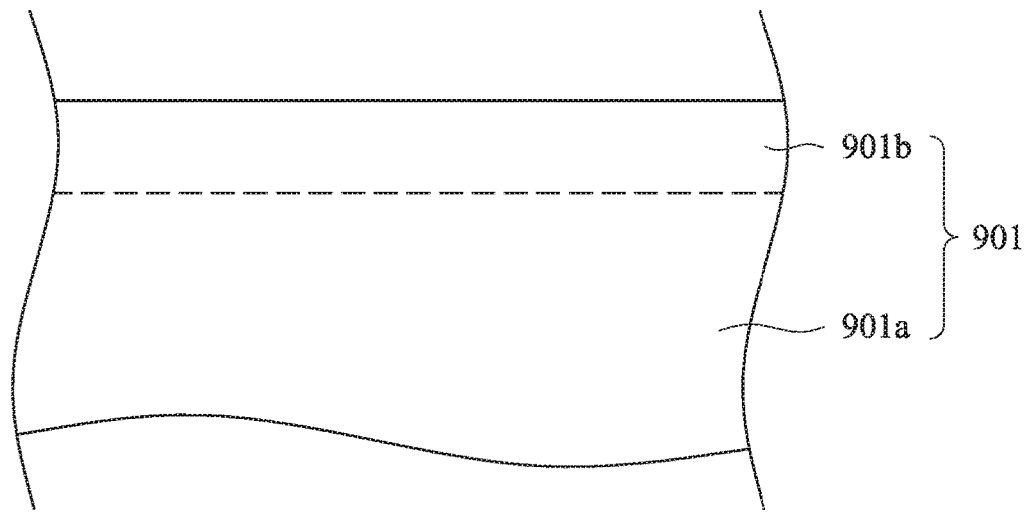
FIG. 9A to FIG. 9N are cross-sectional views of intermediate stages showing the method for fabricating an image sensor in accordance with some embodiments of the present disclosure.
Figure 9B:
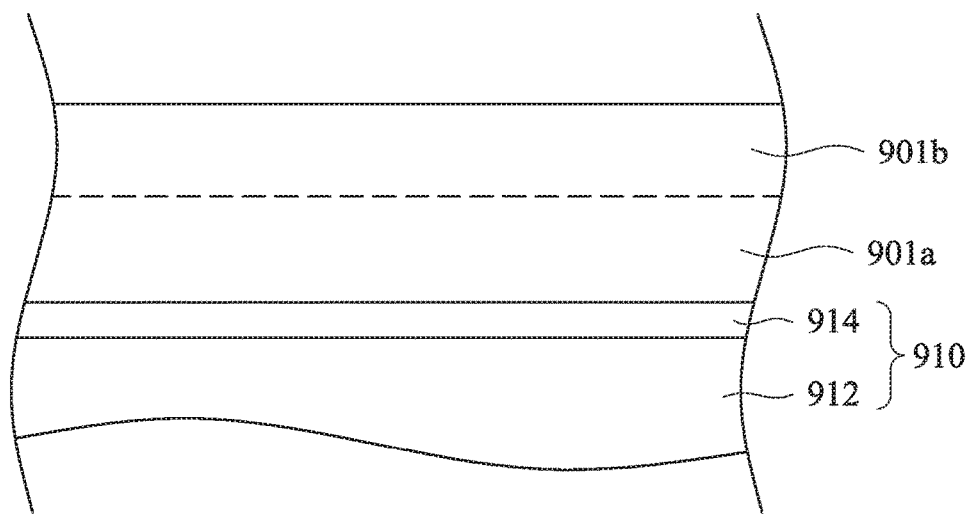
Figure 9C:
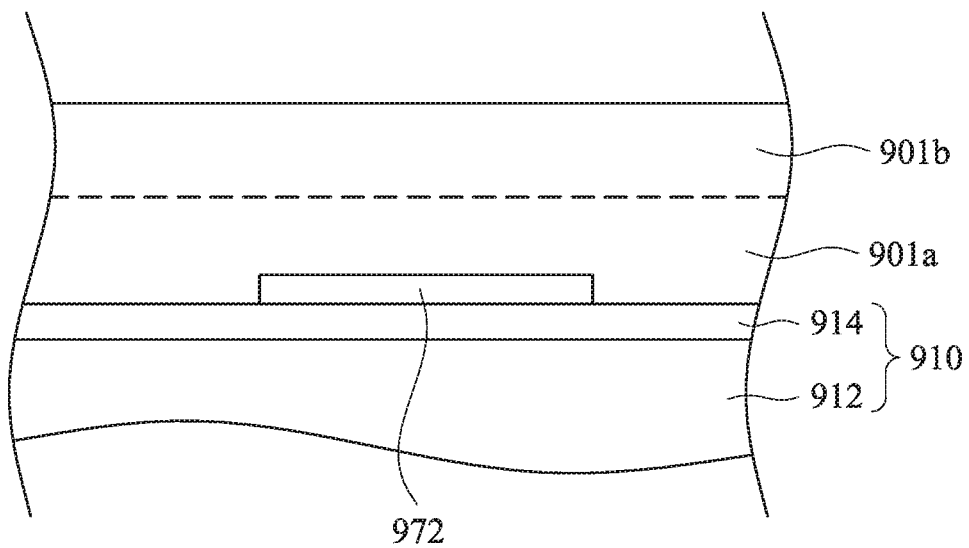
Figure 9D:
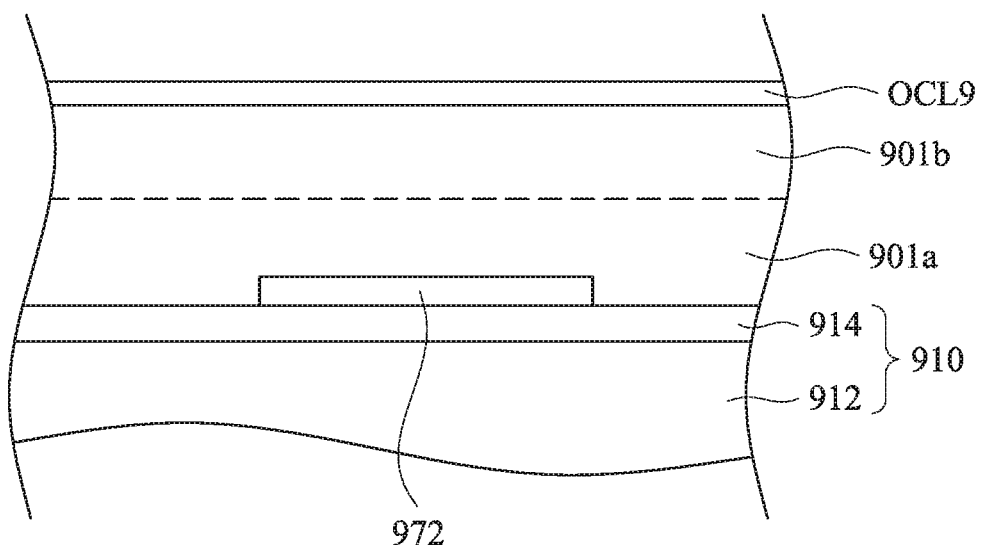
Figure 9E:
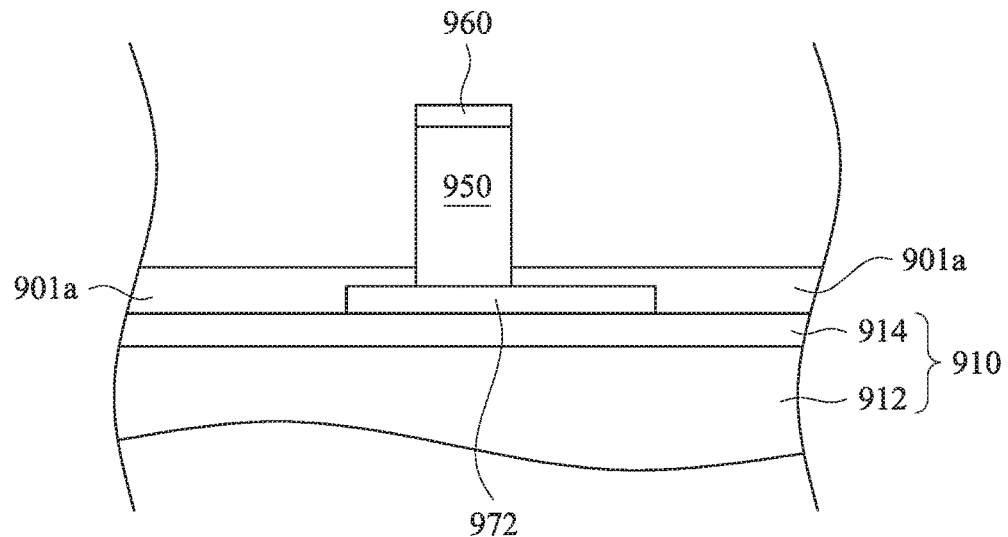
Figure 9F:
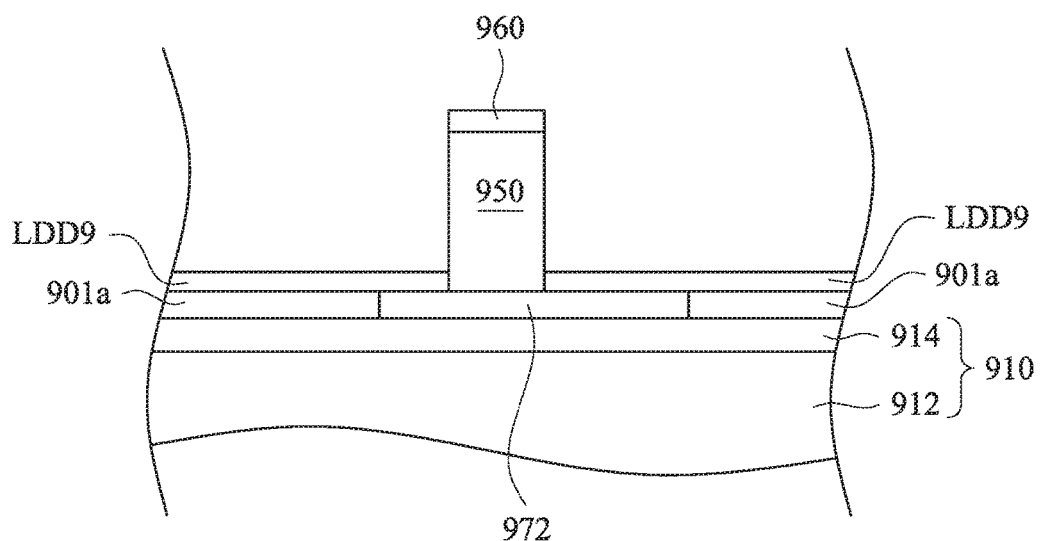
Figure 9G:
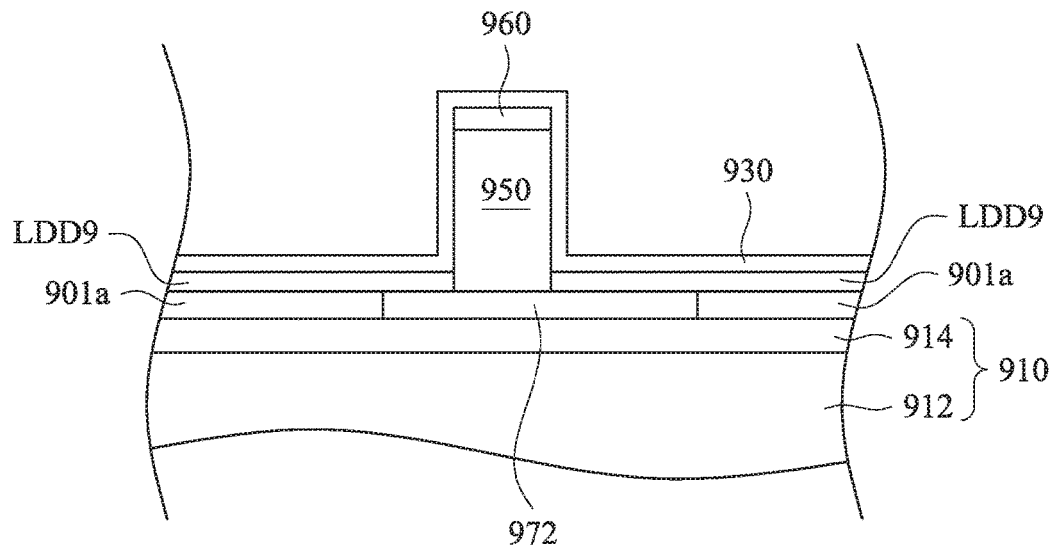
Figure 9H:
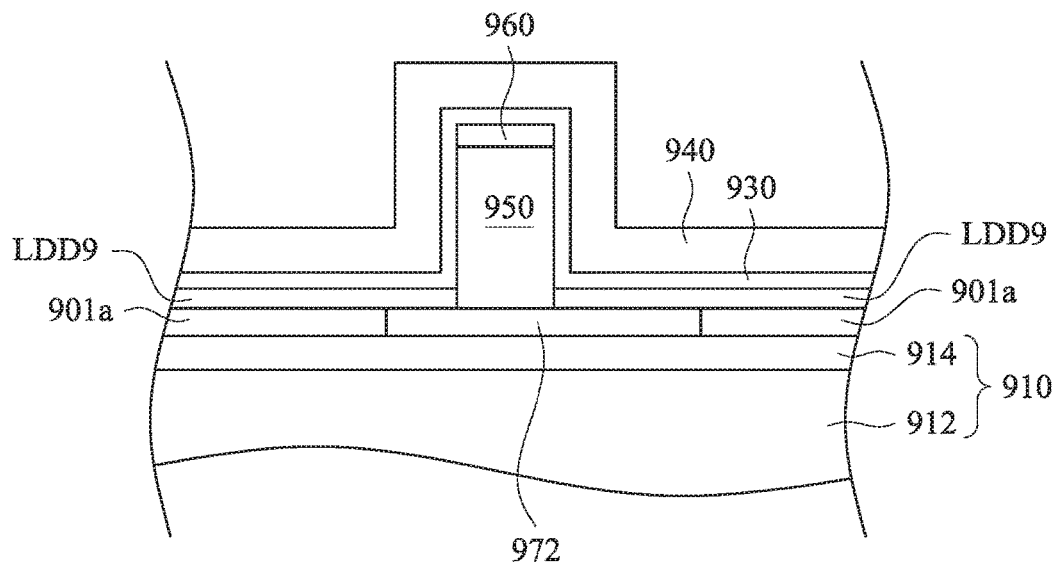
Figure 9I:
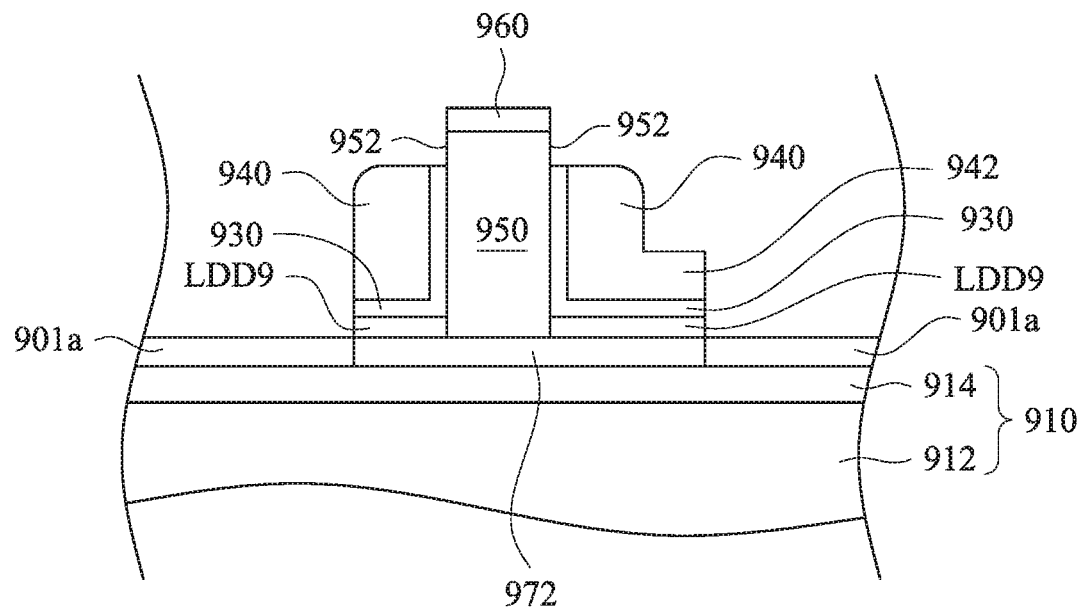
Figure 9J:
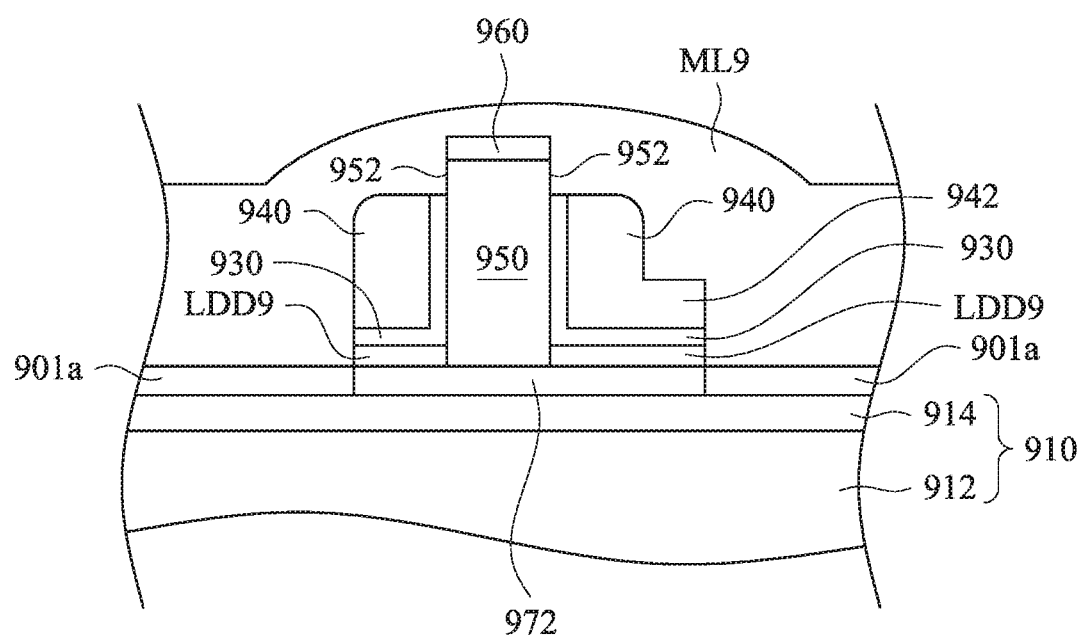
Figure 9K:
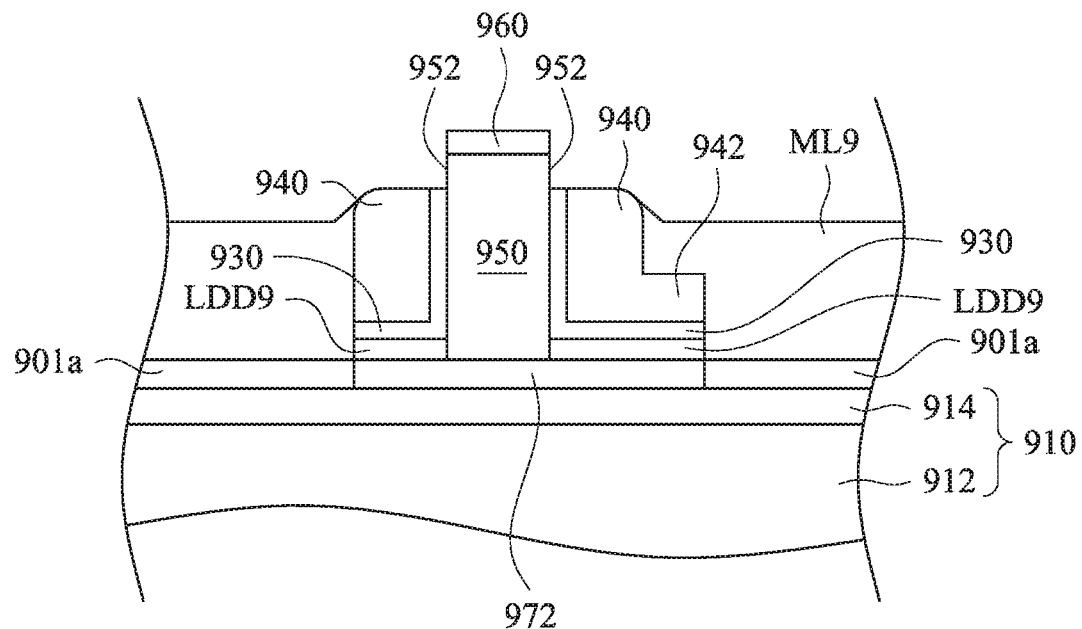
Figure 9L:
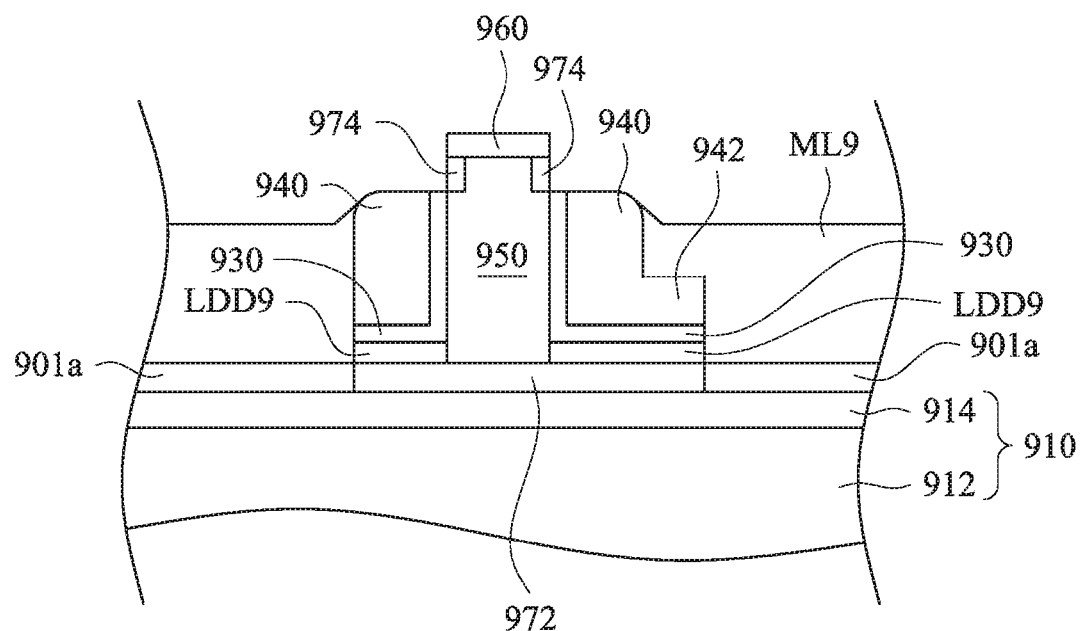
Figure 9M:
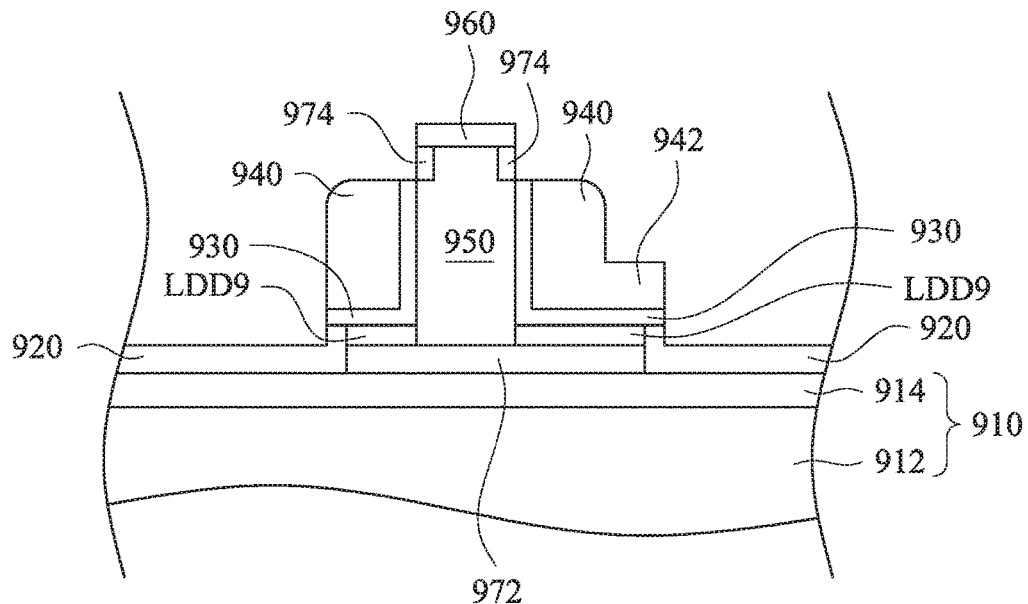
Figure 9N:
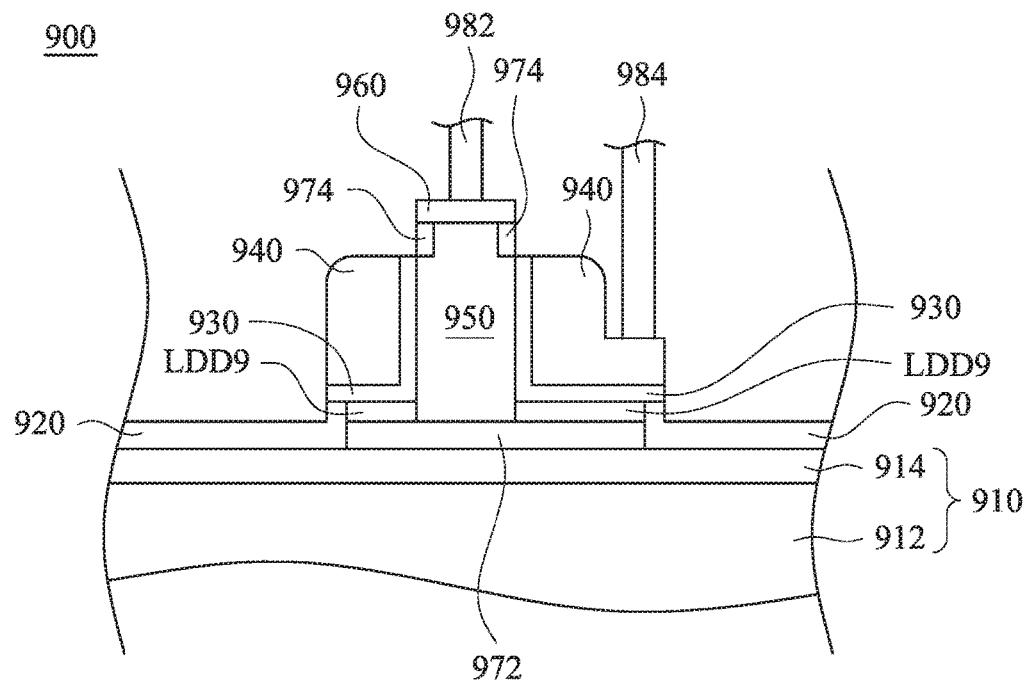

Referring to FIG. 8 and FIG. 9A to FIG. 9N, FIG. 8 is a flow chart showing a method 800 for fabricating an image sensor in accordance with embodiments of the present disclosure, and FIG. 9A to FIG. 9N are cross-sectional views of intermediate stages showing the method 800 for fabricating an image sensor in accordance with some embodiments of the present disclosure. The method 800 begins at operation 810. Operation 810 is performed to provide a semiconductor substrate 901 as shown in FIG. 9A. The semiconductor substrate 901 has a bottom portion 601a and a top portion 901b on the bottom portion 901a.

In some embodiments, the semiconductor substrate 901 may be a semiconductor material and may include structures including a graded layer or a buried oxide, for example. In some exemplary examples, the semiconductor substrate 901 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 901. Alternatively, the semiconductor substrate 901 may be an active layer of a semiconductor-on-insulator (SOI) substrate or a multi-layered structure such as a silicon-germanium layer formed on a bulk silicon layer.

Then, operation 812 is performed to form a light-sensitive element 910 in the bottom portion 601a of the semiconductor substrate 901 as shown in FIG. 9B. In some embodiments, the light-sensitive element 910 is a photodiode and includes doped regions 912 and 914. The doped regions 912 and 914 are formed by doping with a dopant of a first type. In some embodiment, the doped regions 912 and 914 are formed by doping with an n-type dopant. In some embodiments, the doped region 912 is doped at a first concentration, and the doped region 914 is formed by doping with a second concentration greater than the first concentration. In some embodiments, the doped region 912 is doped at a concentration of about 1E12 atoms/cm$^3$, and the doped region 914 is doped at a concentration of about 5E12 atoms/cm$^3$, but embodiments of the present disclosure are not limited thereto.

In some embodiments, a doped region 972 can be formed on the light-sensitive element 910 as shown in FIG. 9C, and the doped region 972 is formed by doping with a dopant of the first type. In some embodiments, the doped region 972 is formed by doping with the n-type dopant at a concentration of about 2.5E12 atoms/cm$^3$. In some embodiments, the doped region 972 is not formed.

Thereafter, operation 814 is performed to form an ohmic contact layer OCL9 in or on the top portion 901b of the semiconductor substrate 901 as shown in FIG. 9D. In some embodiments, the ohmic contact layer OCL9 is formed by doping a portion of the top portion 901b of the semiconductor substrate 901. In some embodiments, a surface of the top portion 901b of the semiconductor substrate 901 is doped with the dopant of the first type at a concentration of 1E15 atoms/cm$^3$, but embodiments of the present disclosure are not limited thereto.

Then, operation 816 is performed to etch the top portion 901b of the semiconductor substrate 901 and the ohmic contact layer OCL9 to form a post structure 950 on the bottom portion 901a of the semiconductor substrate 901 as shown in FIG. 9E. In operation 916, the top portion 901b of the semiconductor substrate 901 is etched to form at least one portion of the post structure 950, and the ohmic contact layer OCL9 is etched to form a floating node 960 on the post structure 950. In some embodiments, a portion of the bottom portion 901a of the semiconductor substrate 601 is also etched to form another portion of the post structure 950.

Thereafter, operation 818 is performed to form a lightly-doped region LDD9 on the light-sensitive element 910 as shown in FIG. 9F. The lightly-doped region LDD9 surrounds the post structure 950 and is formed by doping with a dopant of the first type at a third concentration smaller than the second concentration of the dopant in the doped region 914. In some embodiments, the lightly-doped region LDD9 is formed by doping with the n-type dopant at a concentration of about 1E12 atoms/cm$^3$.

Then, operation 820 is performed to blanketly forming a gate dielectric layer 930 to cover the lightly-doped region LDD9, the post structure 950 and the floating node 960 as shown in FIG. 9G. In some embodiments, the gate dielectric layer 930 is formed by using a deposition process such as an atomic layer deposition (ALD). Other methods to form the gate dielectric layer 930 include chemical vapor deposition (CVD), physical vapor deposition (PVD), and plasma enhanced chemical vapor deposition (PECVD).

In some embodiments, the gate dielectric layer 930 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$) alloy, or another suitable material.

Thereafter, operation 822 is performed to blanketly form a conductive layer 940 to cover the gate dielectric layer 930 as shown in FIG. 9H. In some embodiments, the conductive layer 940 is formed by using a deposition process such as an atomic layer deposition (ALD). Other methods to form the conductive layer 940 include chemical vapor deposition (CVD), physical vapor deposition (PVD), and plasma enhanced chemical vapor deposition (PECVD). In some embodiments, the conductive layer 940 is formed by doped poly-silicon, metal such as Al, Cu, W, Ti, Ta, TiN, TaN, NiSi, CoSi, other suitable conductive materials, or combinations thereof.

Then, operation 824 is performed to etch the conductive layer 940 and the gate dielectric layer 930 to form a vertical gate structure on the post structure 950, and to expose the floating node 960 and portions 952 of sidewalls of the post structure 950 as shown in FIG. 9I. In some embodiments, the conductive layer 940 is etched to form a contact landing portion 942, and the lightly-doped region LDD9 is etched to expose the underlying bottom portion 901a of the semiconductor substrate 901.

Thereafter, operation 825 is performed to form a doped region on the exposed portions 952 of the post structure 950 as shown in FIG. 9J, FIG. 9K and FIG. 9L. In the operation 825, at first, a mask layer ML9 is formed to cover the floating node 960, the portions 952 of the post structure 950, the gate dielectric layer 930, the conductive layer 940 and the bottom portion 901a of the semiconductor substrate 901, as shown in FIG. 9J. Then, the mask ML9 is etched to expose the portions 952 of the post structure 950 as shown in FIG. 9K. Thereafter, the portions 952 of the post structure 950 are doped to form a doped region 974 surrounding the post structure 950 as shown in FIG. 9L. In some embodiments, the portions 952 of the post structure 950 are doped with the n-type dopant at a concentration of about 1E12 atoms/cm$^3$. In some embodiments, the portions 952 of the post structure 950 are doped with a tilt angle.

Thereafter, operation 826 is performed to remove the mask ML9 and form a protection layer 920 on the light-sensitive element 910 as shown in FIG. 9M. The protection layer 920 may be referred to as a pinning layer and formed by doping the bottom portion 901a of the semiconductor substrate 901 and a portion of the lightly doped region LDD9. The protection layer 920 is formed by doping with a dopant of a second type opposite to the first type. In some embodiments, the protection layer 920 is formed by doping with a p-type dopant at a concentration of about 1E13 atoms/cm$^3$.

Then, operation 828 is performed to form a source contact 982 on the floating node 960, and to form a gate contact 984 on the gate contact landing portion 942 of the conductive layer 940, thereby forming a pixel unit 900 as shown in FIG. 9N.

It can be understood that few masks are used in method 800 for fabricating an image sensor. For example, a mask is used to form the doped region 972 as shown in FIG. 9C. For another example, a mask is used to achieve etching the top portion 901b of the semiconductor substrate 901 and the ohmic contact layer OCL9 as shown in FIG. 9E. For further another example, a mask is used to define the contact landing portion 942 as shown in FIG. 9I. Since few masks are used in the method 800 for fabricating an image sensor, cost of the method 800 is reduced. Further, the method 800 adopts self-align methodology, and thus process window of operation of the method 800 can be enlarged.

In some embodiments, the operation 824 can be performed to enable the conductive layer 940 and the gate dielectric layer 930 to fully cover the post structure 950, and operation 823 is omitted. Therefore, no doped region is formed between the gate dielectric layer 930 and the floating node 960.

In addition, similar to the floating node 760 of the pixel unit as shown in FIG. 7C, the floating node 960 can be formed to have a smaller area to expose a portion of the post structure 950 between the floating node 960 and the gate dielectric layer 930.

Figure 10A:
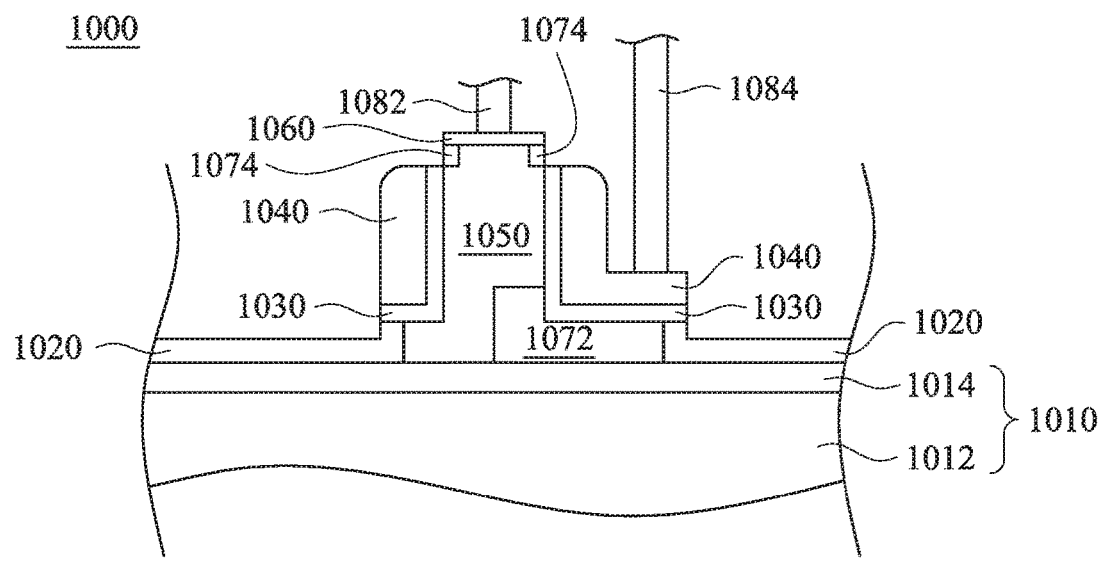
FIG. 10A is a schematic cross-sectional view of a pixel unit of an image sensor in accordance with some embodiments of the present disclosure.
Figure 10B:
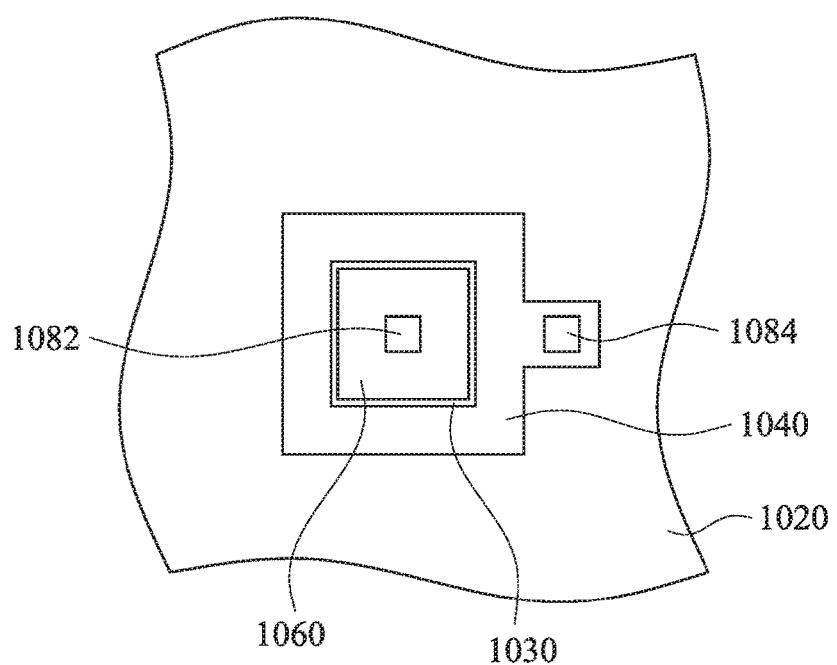
FIG. 10B is a schematic top view of the pixel unit of an image sensor in accordance with some embodiments of the present disclosure.

Referring to FIG. 10A and FIG. 10B, FIG. 10A is a schematic cross-sectional view of a pixel unit 1000 of an image sensor in accordance with some embodiments of the present disclosure, and FIG. 10B is a schematic top view of the pixel unit 1000 of an image sensor in accordance with some embodiments of the present disclosure. The pixel unit 1000 is defined by plural isolation structures (not shown). In some embodiments, the isolation structures are doped (e.g., p-type, n-type, or a combination thereof) regions. In some embodiments, the isolation structures are shallow trench isolations (STIs).

The pixel unit 1000 includes a light-sensitive element 1010, a protection layer 1020, a gate dielectric layer 1030, a conductive layer 1040, a post structure 1050 and a floating node 1060. In some embodiments, the light-sensitive element 1010 is a photodiode including doped regions 1012 and 1014. The doped regions 1012 and 1014 are formed by doping with a dopant of a first type. In some embodiment, the doped regions 1012 and 1014 are formed by doping with an n-type dopant. In some embodiments, the doped region 1012 is doped at a first concentration, and the doped region 1014 is doped at a second concentration greater than the first concentration. In some embodiments, the doped region 1012 is doped at a concentration of about 1E12 atoms/cm$^3$, and the doped region 1014 is doped at a concentration of about 5E12 atoms/cm$^3$, but embodiments of the present disclosure are not limited thereto.

The protection layer 1020 is disposed on the light-sensitive element 1010 to stabilize the light-sensitive element 1010. The protection layer 1020 may be referred to as a pinning layer and formed by doping with a dopant of a second type opposite to the first type. In some embodiments, the protection layer 1020 is formed by doping with a p-type dopant at a concentration of about 1E13 atoms/cm$^3$.

The gate dielectric layer 1030 and the conductive layer 1040 are sequentially disposed on the light-sensitive element 1010 and surround the post structure 1050, thereby forming a vertical gate structure on the light-sensitive element 1010. In some embodiments, the gate dielectric layer 1030 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$) alloy, or another suitable material. In some embodiments, the conductive layer 1040 is formed by doped poly-silicon, metal such as Al, Cu, W, Ti, Ta, TiN, TaN, NiSi, CoSi, other suitable conductive materials, or combinations thereof.

The floating node 1060 is formed on the post structure 1050 and can be considered as a source node. In some embodiments, the pixel unit 1000 further includes a source contact 1082 and a gate contact 1084 formed on the floating node 1060 and the conductive layer 1040. Therefore, when the vertical gate structure is turned on to transfer signals generated by the light-sensitive element 1010 to corresponding peripheral circuits, a vertical channel is induced in the post structure 1050 to transfer the signals of the light-sensitive element 1010. Since the channel induced by the vertical gate structure is not located in a substrate in which the light-sensitive element 1010 is formed, the light-sensitive element 1010 can be formed to occupy a big area of the pixel unit 1000, and high quantum efficiency (QE) is achieved.

In some embodiments, a doped region 1072 is formed on the light-sensitive element 1010, and the doped region 1072 is formed by doping with a dopant of the first type. In some embodiments, the doped region 1072 is formed by doping with the n-type dopant at a concentration of about 2.5E12 atoms/cm$^3$. Comparing with the doped region 1072 of the pixel unit 100, the doped region 1072 occupies a smaller area, and thus the post structure 1050 touches the light-sensitive element 1010 and the protection layer 1020. In some embodiments, a ground reference voltage is applied on the protection layer 1020, thereby enabling the arrangement of the doped region 1072 to benefit the benefit transmission of the electrical signals from the light-sensitive element 1010.

Figure 10C:
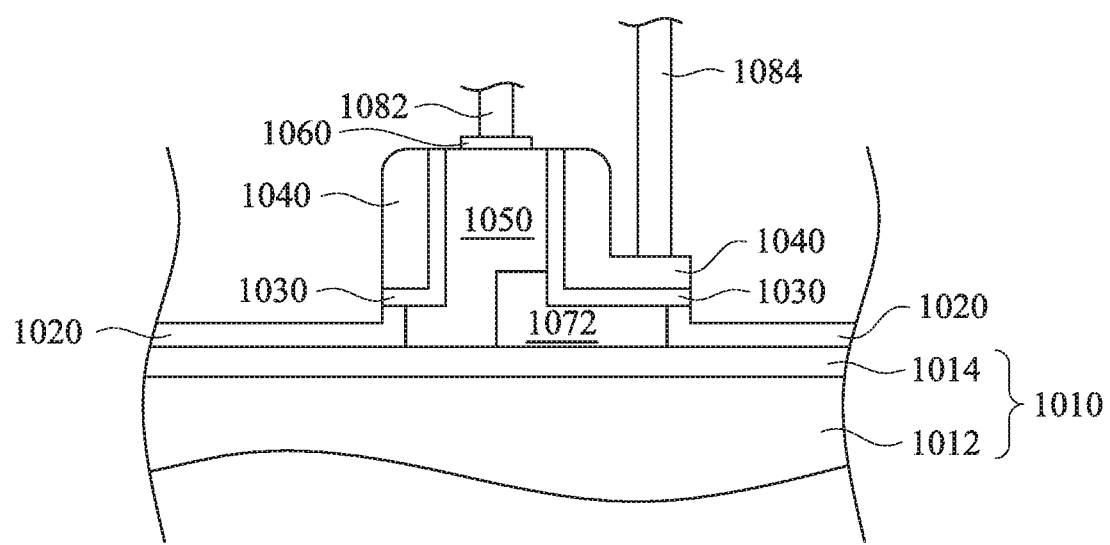
FIG. 10C is a schematic cross-sectional view of a pixel unit of an image sensor in accordance with some embodiments of the present disclosure.
Figure 11:
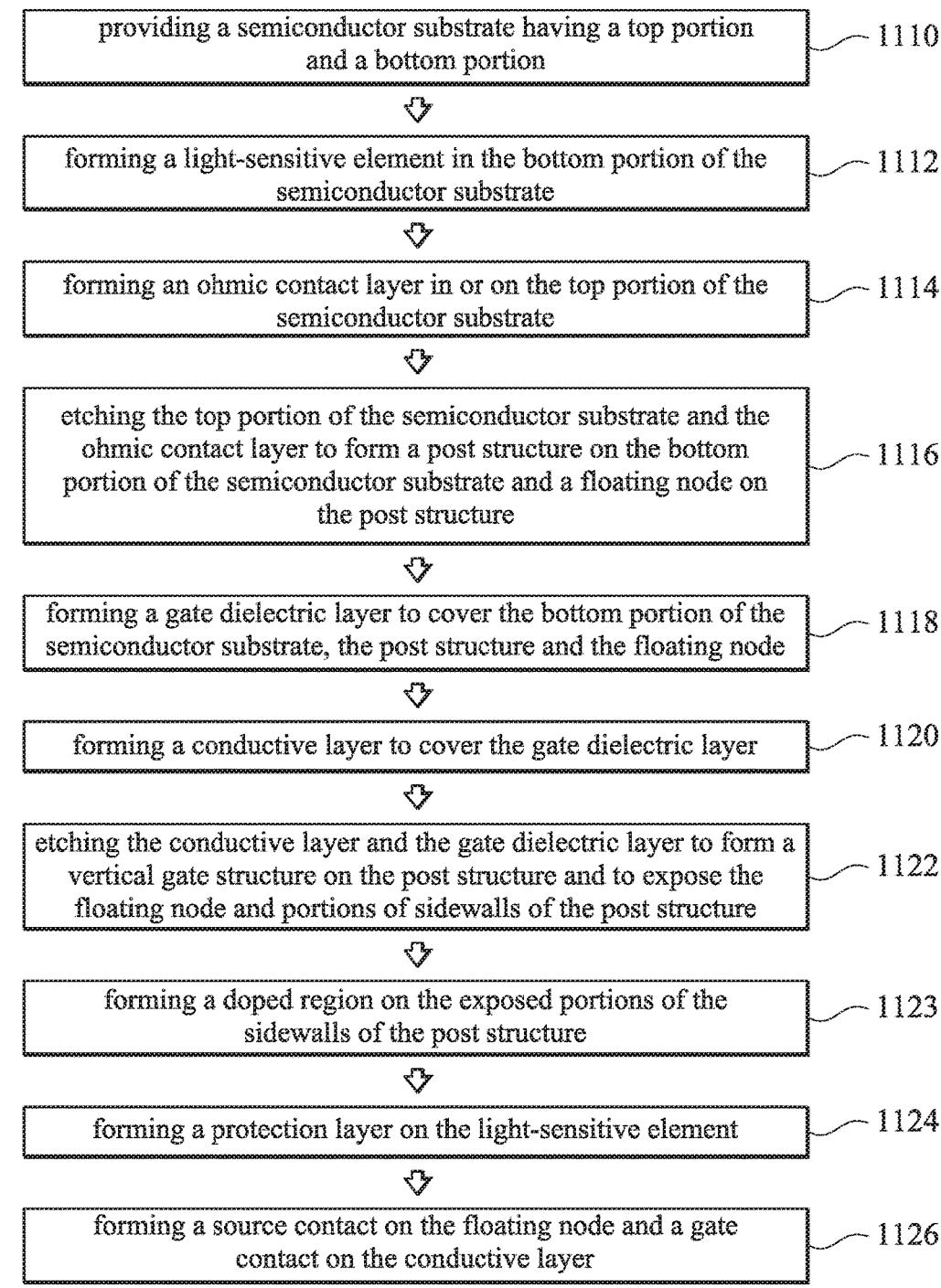
FIG. 11 is a flow chart showing a method for fabricating an image sensor in accordance with embodiments of the present disclosure.

Further, in some embodiments, a doped region 1074 is disposed on sidewalls of the post structure 1050. The doped region 1074 is located between the gate dielectric layer 1030 and the floating node 1060 and surrounds the post structure 1050, thereby reducing capacitance of the gate dielectric layer 1030. The doped region 1074 is formed by doping with a dopant of the first type. In some embodiments, the doped region 1074 is formed by doping with the n-type dopant at a concentration of about 1E12 atoms/cm$^3$. In some embodiments, the doped region 1074 is omitted and the floating node 1060 does not fully cover the top surface of the post structure 1050 as shown in FIG. 10C.

Figure 12A:
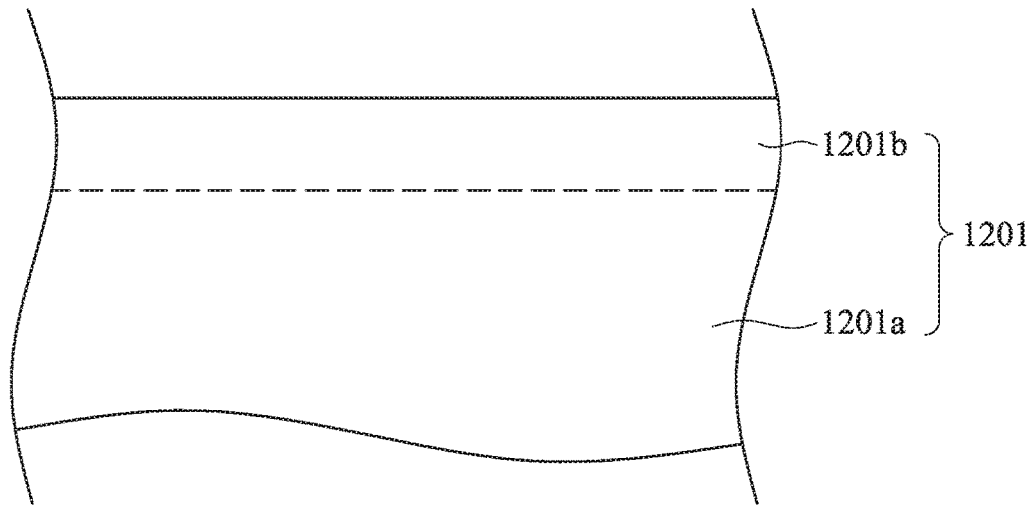
FIG. 12A to FIG. 12M are cross-sectional views of intermediate stages showing the method for fabricating an image sensor in accordance with some embodiments of the present disclosure.

Referring to FIG. 11 and FIG. 12A to FIG. 12M, FIG. 11 is a flow chart showing a method 1100 for fabricating an image sensor in accordance with embodiments of the present disclosure, and FIG. 12A to FIG. 12M are cross-sectional views of intermediate stages showing the method 1100 for fabricating an image sensor in accordance with some embodiments of the present disclosure. The method 1100 begins at operation 1110. Operation 1110 is performed to provide a semiconductor substrate 1201 as shown in FIG. 12A. The semiconductor substrate 1201 has a bottom portion 1201a and a top portion 1201b on the bottom portion 1201a.

In some embodiments, the semiconductor substrate 1201 may be a semiconductor material and may include structures including a graded layer or a buried oxide, for example. In some exemplary examples, the semiconductor substrate 1201 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 1201. Alternatively, the semiconductor substrate 1201 may be an active layer of a semiconductor-on-insulator (SOI) substrate or a multi-layered structure such as a silicon-germanium layer formed on a bulk silicon layer.

Figure 12B:
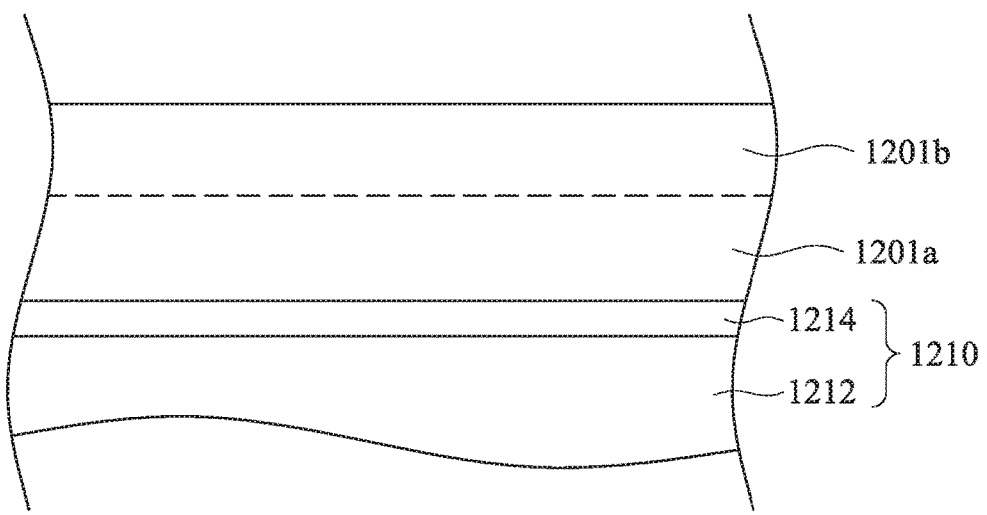

Then, operation 1112 is performed to form a light-sensitive element 1210 in the bottom portion 1201a of the semiconductor substrate 1201 as shown in FIG. 12B. In some embodiments, the light-sensitive element 1210 is a photodiode and includes doped regions 1212 and 1214. The doped regions 1212 and 1214 are formed by doping with a dopant of a first type. In some embodiment, the doped regions 1212 and 1214 are formed by doping with an n-type dopant. In some embodiments, the doped region 1212 is doped at a first concentration, and the doped region 1214 is formed by doping with a second concentration greater than the first concentration. In some embodiments, the doped region 1212 is doped at a concentration of about 1E12 atoms/cm$^3$, and the doped region 1214 is doped at a concentration of about 5E12 atoms/cm$^3$, but embodiments of the present disclosure are not limited thereto.

Figure 12C:
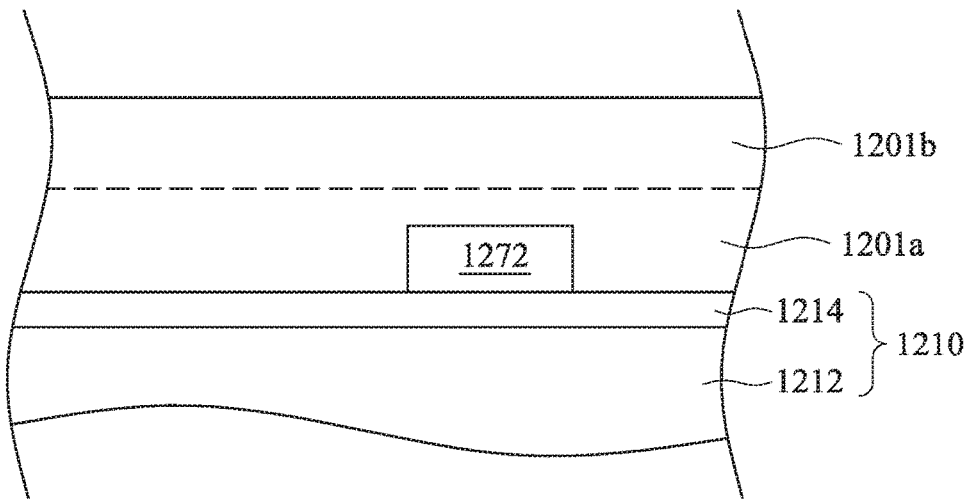

In some embodiments, a doped region 1272 can be formed on the light-sensitive element 1210 as shown in FIG. 12C, and the doped region 1272 is formed by doping with a dopant of the first type. In some embodiments, the doped region 1272 is formed by doping with the n-type dopant at a concentration of about 2.5E12 atoms/cm$^3$. In some embodiments, the doped region 1272 is not formed.

Figure 12D:
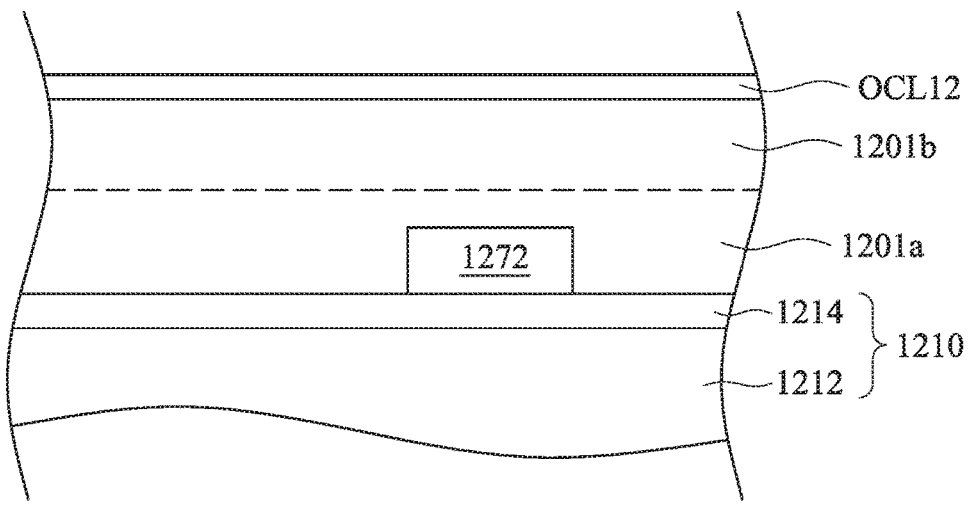

Thereafter, operation 1114 is performed to form an ohmic contact layer OCL12 in or on the top portion 1201b of the semiconductor substrate 1201 as shown in FIG. 12D. In some embodiments, the ohmic contact layer OCL12 is formed by doping a portion of the top portion 1201b of the semiconductor substrate 1201. In some embodiments, a surface of the top portion 1201b of the semiconductor substrate 1201 is doped with the dopant of the first type at a concentration of 1E15 atoms/cm$^3$, but embodiments of the present disclosure are not limited thereto.

Figure 12E:
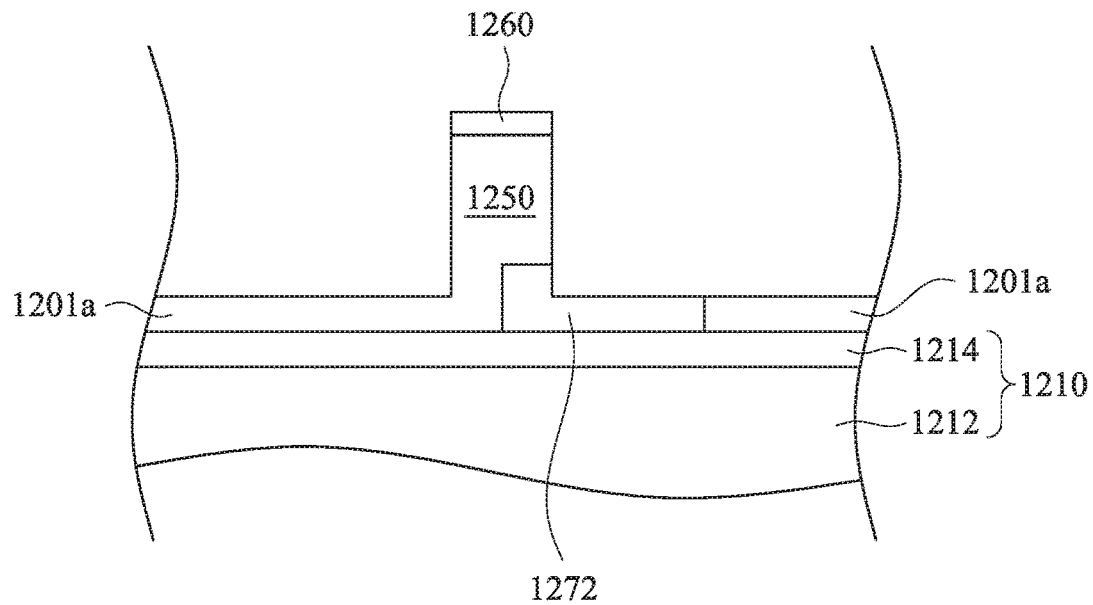

Then, operation 1116 is performed to etch the top portion 1201b of the semiconductor substrate 1201 and the ohmic contact layer OCL12 to form a post structure 1250 on the bottom portion 1201a of the semiconductor substrate 1201 as shown in FIG. 12E. In operation 1116, the top portion 1201b of the semiconductor substrate 1201 is etched to form at least one portion of the post structure 1250, and the ohmic contact layer OCL12 is etched to form a floating node 1260 on the post structure 1250. In some embodiments, a portion of the bottom portion 1201a of the semiconductor substrate 1201 is also etched to form another portion of the post structure 1250. In some embodiments, the doped region 1272 is etched to have a protrusion portion located under the post structure 1250.

Figure 12F:
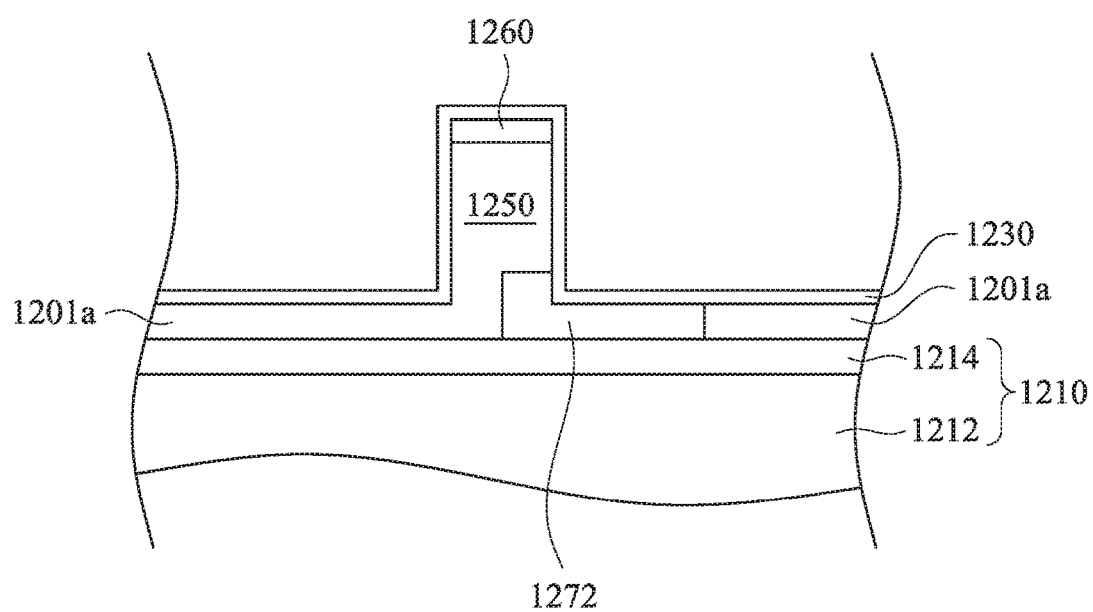

Thereafter, operation 1118 is performed to blanketly forming a gate dielectric layer 1230 to cover the bottom portion 1201*a* of the semiconductor substrate 1201, the post structure 1250 and the floating node 1260 as shown in FIG. 12F. In some embodiments, the gate dielectric layer 1230 is formed by using a deposition process such as an atomic layer deposition (ALD). Other methods to form the gate dielectric layer 1230 include chemical vapor deposition (CVD), physical vapor deposition (PVD), and plasma enhanced chemical vapor deposition (PECVD).

In some embodiments, the gate dielectric layer 1230 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material.

Figure 12G:
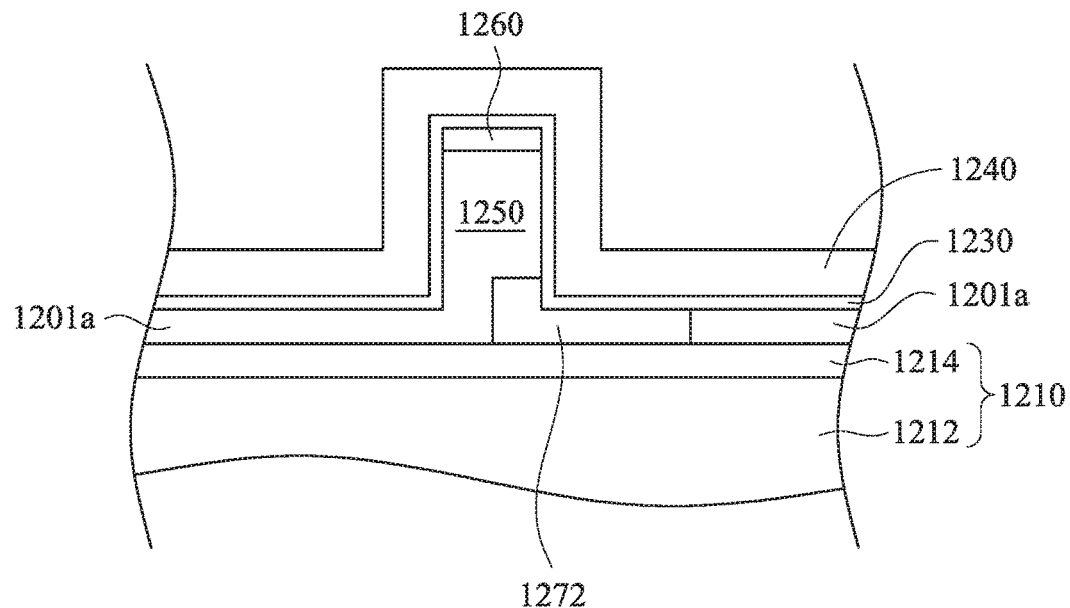

Then, operation 1120 is performed to blanketly form a conductive layer 1240 to cover the gate dielectric layer 1230 as shown in FIG. 12G. In some embodiments, the conductive layer 1240 is formed by using a deposition process such as an atomic layer deposition (ALD). Other methods to form the conductive layer 1240 include chemical vapor deposition (CVD), physical vapor deposition (PVD), and plasma enhanced chemical vapor deposition (PECVD). In some embodiments, the conductive layer 1240 is formed by doped poly-silicon, metal such as Al, Cu, W, Ti, Ta, TiN, TaN, NiSi, CoSi, other suitable conductive materials, or combinations thereof.

Figure 12H:
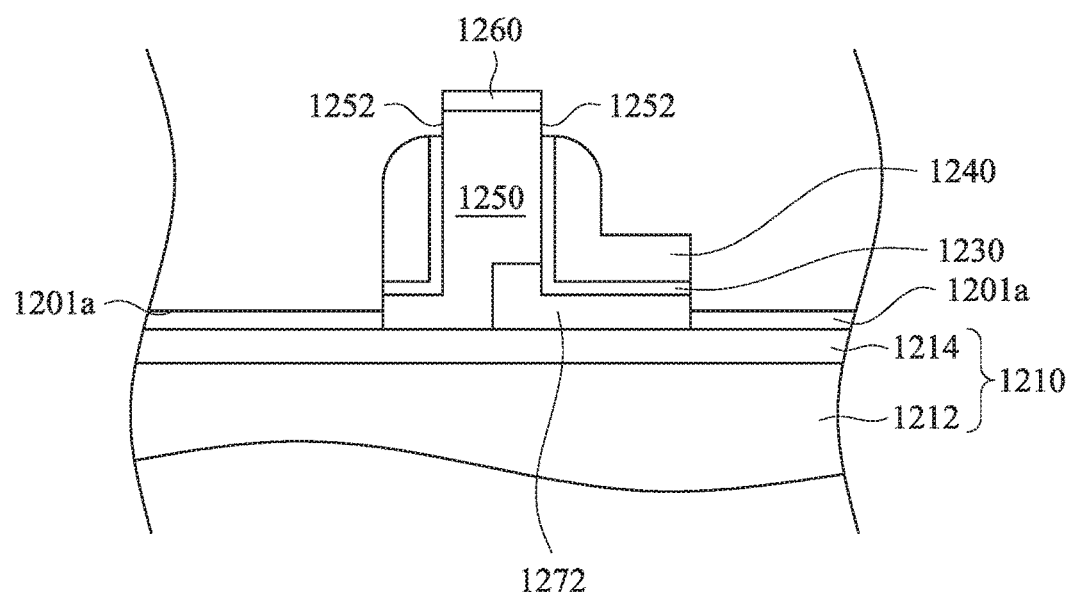

Thereafter, operation 1122 is performed to etch the conductive layer 1240 and the gate dielectric layer 1230 to form a vertical gate structure on the post structure 1250, and to expose the floating node 1260 and portions 1252 of sidewalls of the post structure 1250 as shown in FIG. 12H. In some embodiments, the conductive layer 1240 is etched to form a contact landing portion 1242. In some embodiments, a portion of the bottom portion 1201*a* of the semiconductor substrate 1201 may be etched, and thus a portion of the doped region 1272 is exposed.

Figure 12I:
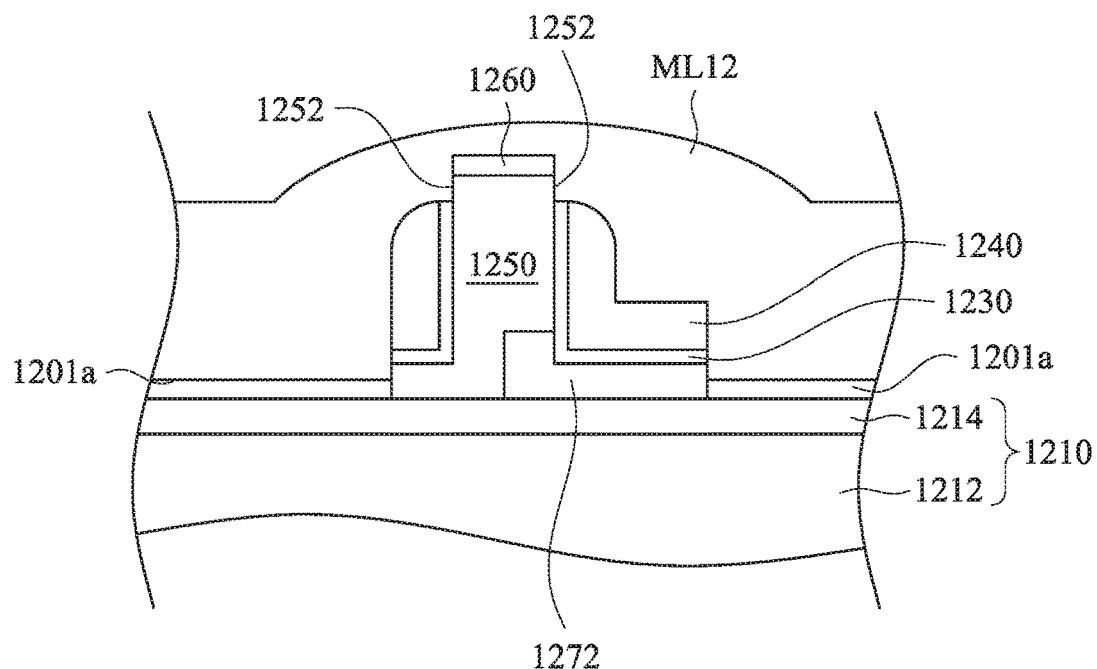
Figure 12J:
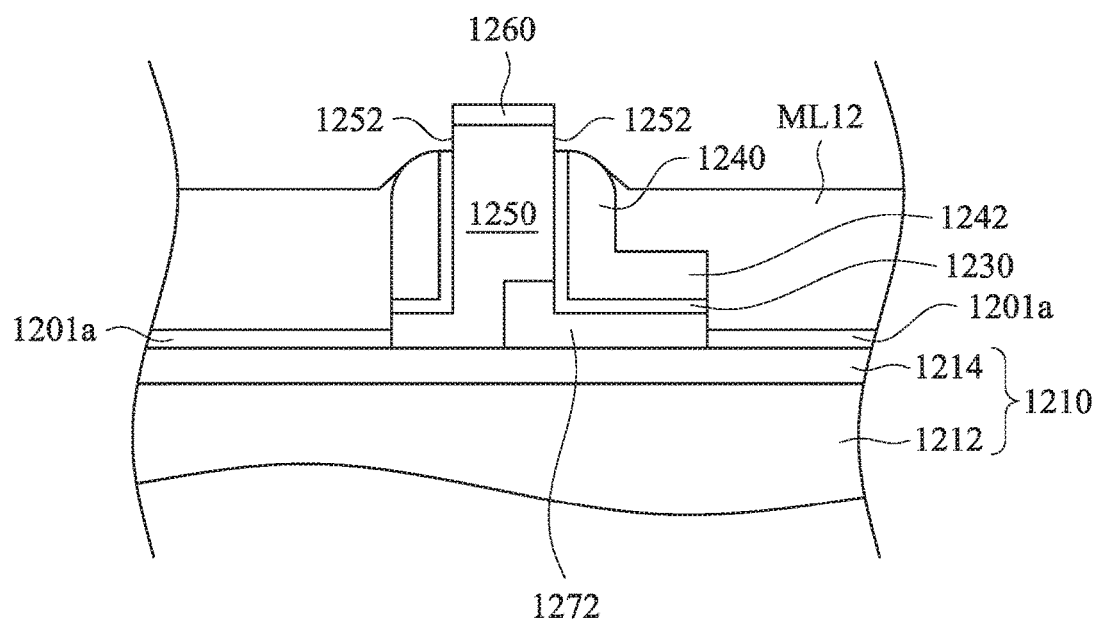
Figure 12K:
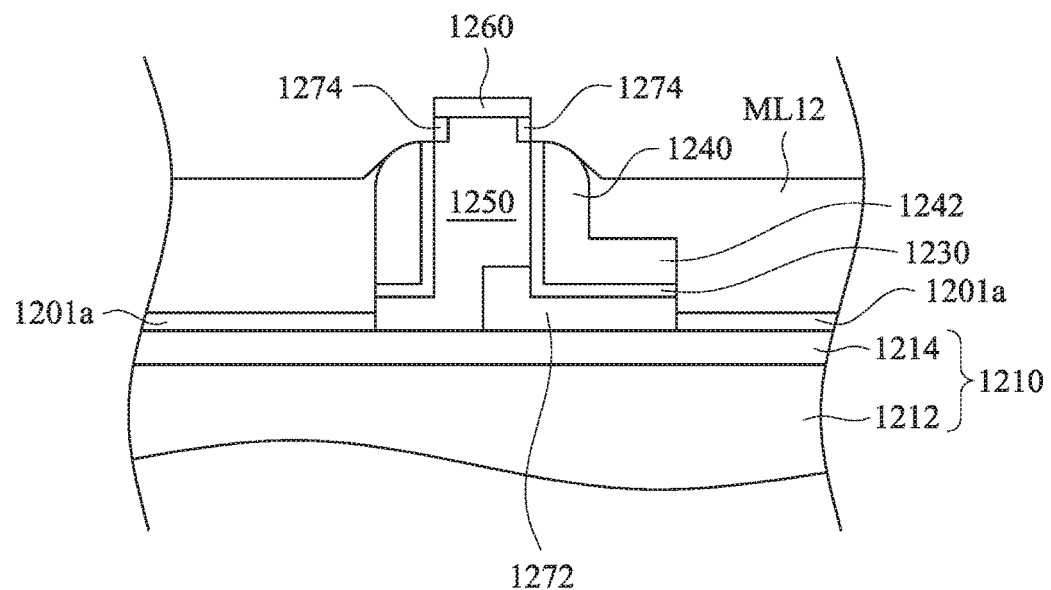

Then, operation 1123 is performed to form a doped region on the exposed portions 1252 of the post structure 1250 as shown in FIG. 12I, FIG. 12J and FIG. 12K. In the operation 1123, at first, a mask layer ML12 is formed to cover the floating node 1260, the portions 1252 of the post structure 1250, the gate dielectric layer 1230, the conductive layer 1240 and the bottom portion 1201*a* of the semiconductor substrate 1201, as shown in FIG. 12I. Then, the mask ML12 is etched to expose the portions 1252 of the post structure 1250 as shown in FIG. 3J. Thereafter, the portions 1252 of the post structure 1250 are doped to form a doped region 1274 surrounding the post structure 1250 as shown in FIG. 12K. In some embodiments, the portions 1252 of the post structure 1250 are doped with the n-type dopant at a concentration of about 1E12 atoms/$cm^3$. In some embodiments, the portions 1252 of the post structure 1250 are doped with a tilt angle.

Figure 12L:
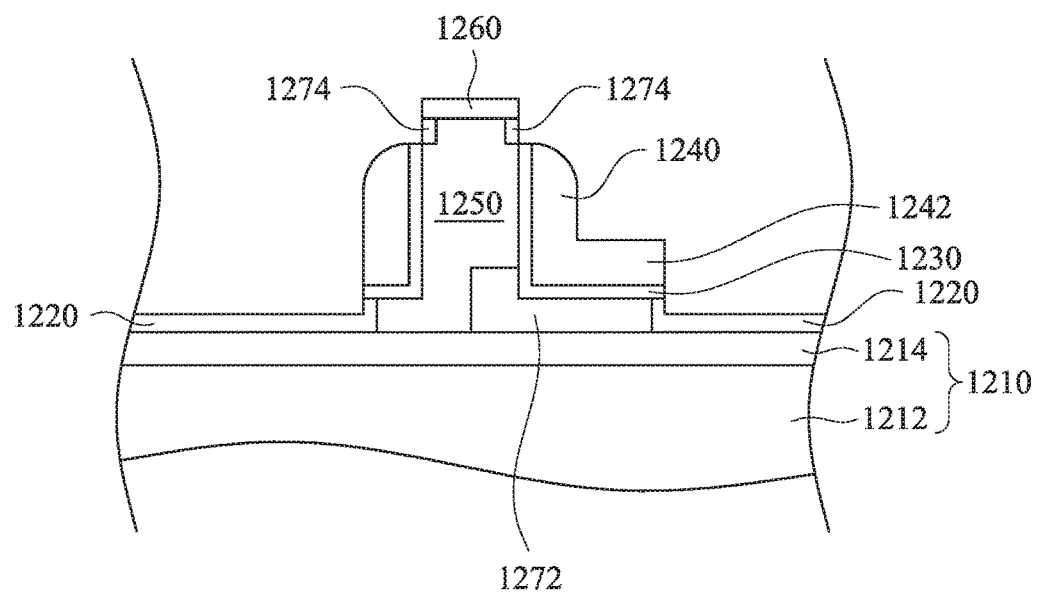

Thereafter, operation 1124 is performed to remove the mask ML12 and form a protection layer 1220 on the light-sensitive element 1210 as shown in FIG. 12L. The protection layer 1220 may be referred to as a pinning layer and formed by doping the bottom portion 1201*a* of the semiconductor substrate 1201 and the exposed portion of the doped region 1272. The protection layer 1220 is formed by doping with a dopant of a second type opposite to the first type. In some embodiments, the protection layer 1220 is formed by doping with a p-type dopant at a concentration of about 1E13 atoms/$cm^3$.

Figure 12M:
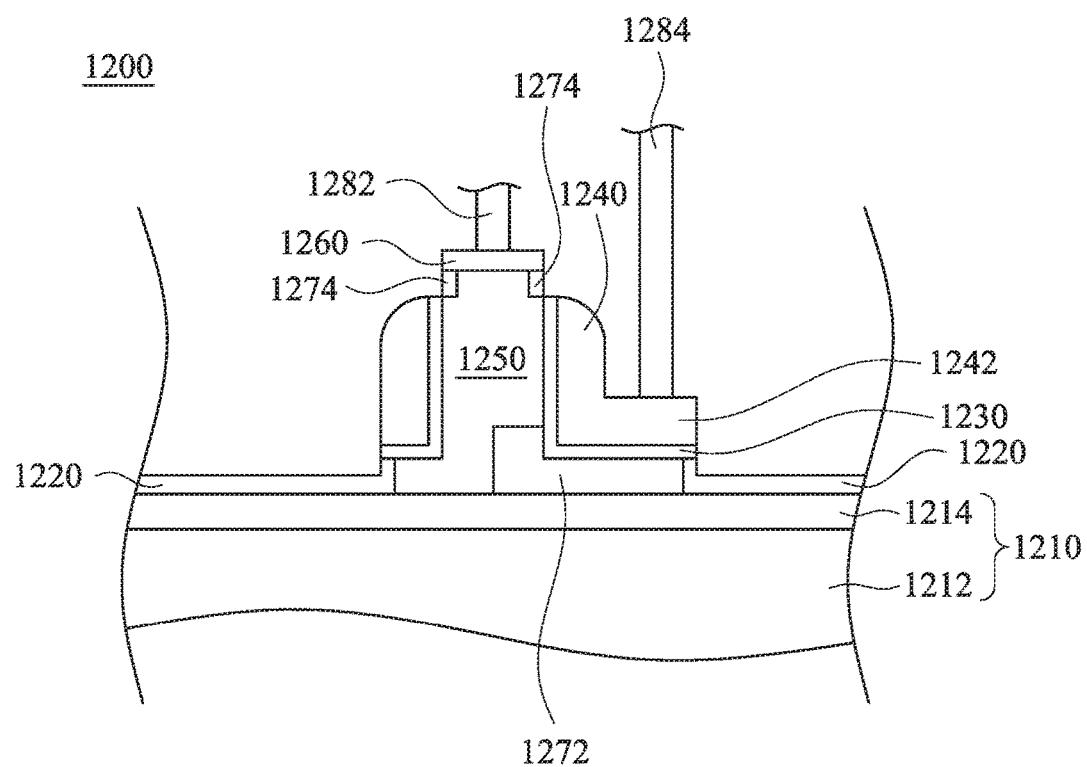

Thereafter, operation 1126 is performed to form a source contact 1282 on the floating node 1260, and to form a gate contact 1284 on the gate contact landing portion 1242 of the conductive layer 1240, thereby forming a pixel unit 1200 as shown in FIG. 12M.

It can be understood that few masks are used in method 1100 for fabricating an image sensor. For example, a mask is used to form the doped region 1272 as shown in FIG. 12C. For another example, a mask is used to achieve etching the top portion 1201*b* of the semiconductor substrate 1201 and the ohmic contact layer OCL12 as shown in FIG. 12E. For further another example, a mask is used to define the contact landing portion 1242 as shown in FIG. 12H. Since few masks are used in the method 1100 for fabricating an image sensor, cost of the method 1100 is reduced. Further, the method 1100 adopts self-align methodology, and thus process window of operation of the method 1100 can be enlarged.

In some embodiments, the operation 1122 can be performed to enable the conductive layer 1240 and the gate dielectric layer 1230 to fully cover the post structure 1250, and operation 1123 is omitted. Therefore, no doped region is formed between the gate dielectric layer 1130 and the floating node 1160.

In addition, similar to the floating node 1060 of the pixel unit as shown in FIG. 10C, the floating node 1260 can be formed to have a smaller area to expose a portion of the post structure 1250 between the floating node 1260 and the gate dielectric layer 1230.

Figure 13A:
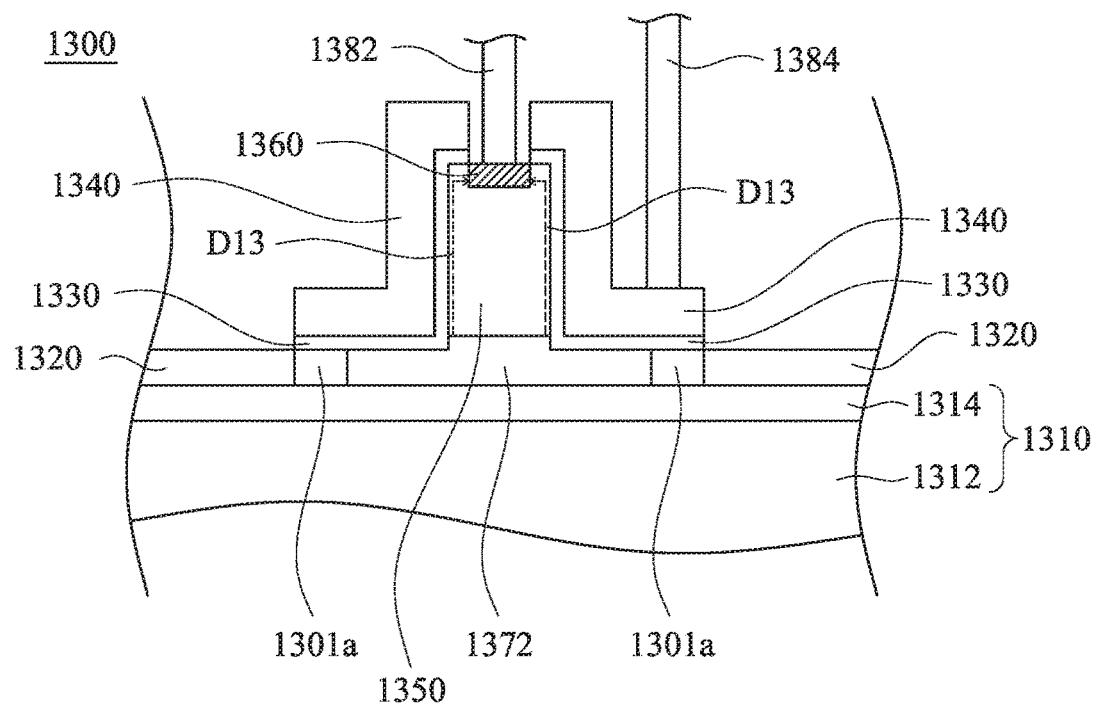
FIG. 13A is a schematic cross-sectional view of a pixel unit of an image sensor in accordance with some embodiments of the present disclosure.
Figure 13B:
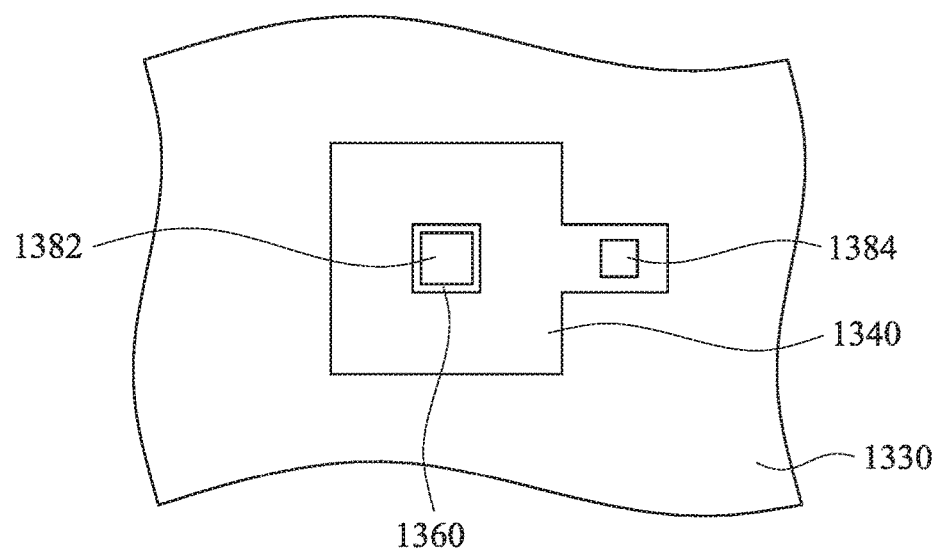
FIG. 13B is a schematic top view of the pixel unit of an image sensor in accordance with some embodiments of the present disclosure.
Figure 14:
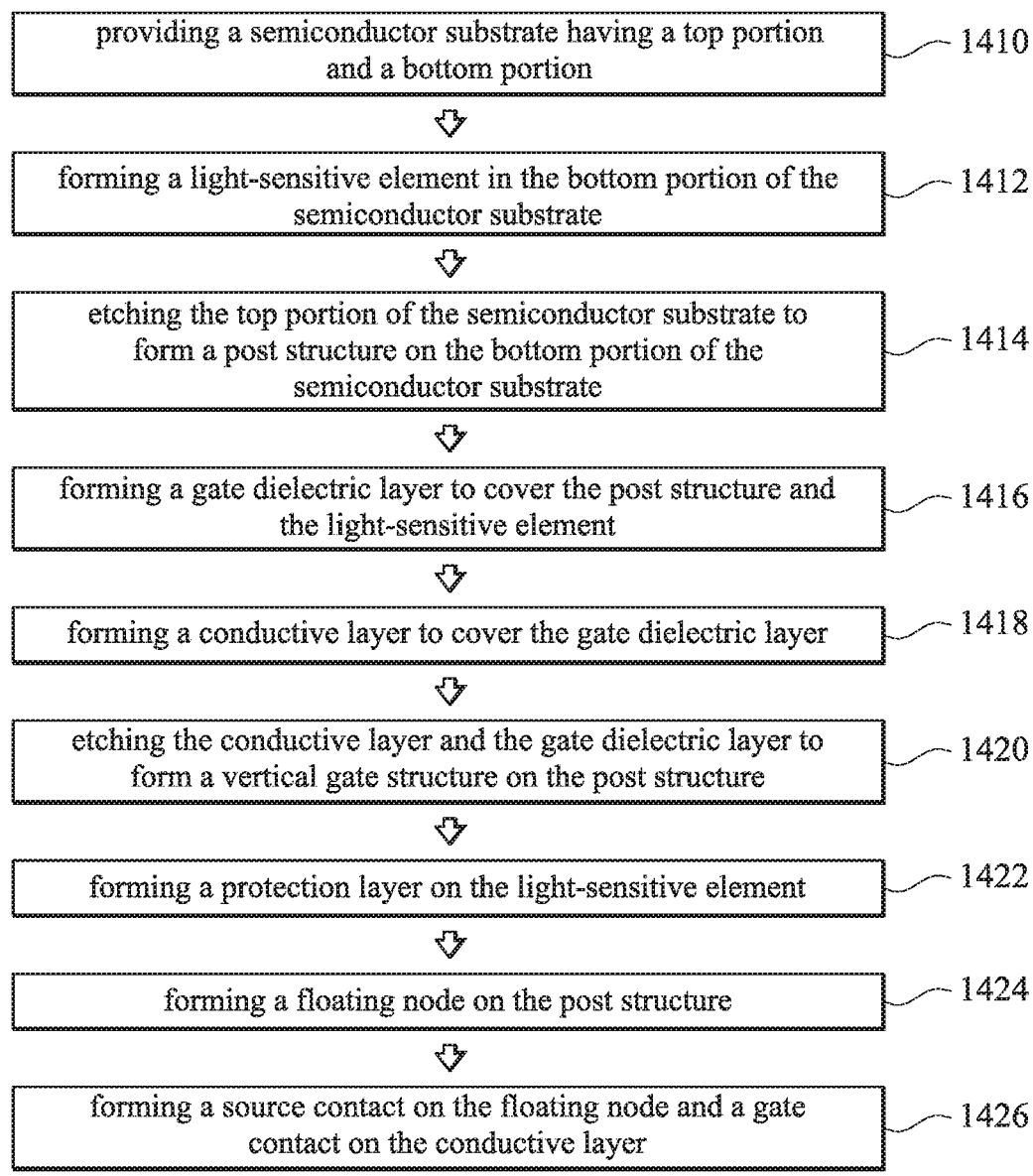
FIG. 14 is a flow chart showing a method for fabricating an image sensor in accordance with embodiments of the present disclosure.

Referring to FIG. 13A and FIG. 13B, FIG. 13A is a schematic cross-sectional view of a pixel unit 1300 of an image sensor in accordance with some embodiments of the present disclosure, and FIG. 13B is a schematic top view of the pixel unit 1300 of an image sensor in accordance with some embodiments of the present disclosure. The pixel unit 1300 is defined by plural isolation structures (not shown). In some embodiments, the isolation structures are doped (e.g., p-type, n-type, or a combination thereof) regions. In some embodiments, the isolation structures are shallow trench isolations (STIs).

The pixel unit 1300 includes a light-sensitive element 1310, a protection layer 1320, a gate dielectric layer 1330, a conductive layer 1340, a post structure 1350 and a floating node 1360. In some embodiments, the light-sensitive element 1310 is a photodiode including doped regions 1312 and 1314. The doped regions 1312 and 1314 are formed by doping with a dopant of a first type. In some embodiment, the doped regions 1312 and 1314 are formed by doping with an n-type dopant. In some embodiments, the doped region 1312 is doped at a first concentration, and the doped region 1314 is doped at a second concentration greater than the first concentration. In some embodiments, the doped region 1312 is doped at a concentration of about 1E12 atoms/$cm^3$, and the doped region 1314 is doped at a concentration of about 5E12 atoms/$cm^3$, but embodiments of the present disclosure are not limited thereto.

The protection layer 1320 is disposed on the light-sensitive element 1310 to stabilize the light-sensitive element 1310. The protection layer 1320 may be referred to as a pinning layer and formed by doping with a dopant of a second type opposite to the first type. In some embodiments, the protection layer 1320 is formed by doping with a p-type dopant at a concentration of about 1E13 atoms/cm$^3$. In some embodiments, the protection layer 1320 is divided by plural semiconductor layers 1301a. In some embodiments, the semiconductor layers 1301a can be omitted.

The gate dielectric layer 1330 and the conductive layer 1340 are sequentially disposed on the light-sensitive element 1310 and surround the post structure 1350, thereby forming a vertical gate structure on the light-sensitive element 1010. In some embodiments, portions of the gate dielectric layer 1330 and the conductive layer 1340 are disposed on the top surface of the post structure 1350. Further, in some embodiments, the gate dielectric layer 1330 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$) alloy, or another suitable material. In some embodiments, the conductive layer 1340 is formed by doped poly-silicon, metal such as Al, Cu, W, Ti, Ta, TiN, TaN, NiSi, CoSi, other suitable conductive materials, or combinations thereof.

The floating node 1360 is formed on the post structure 1350 and can be considered as a source node. In some embodiments, the pixel unit 1300 further includes a source contact 1382 and a gate contact 1384 formed on the floating node 1060 and the conductive layer 1340.

Therefore, when the vertical gate structure is turned on to transfer signals generated by the light-sensitive element 1310 to corresponding peripheral circuits, a vertical channel is induced in the post structure 1350 to transfer the signals of the light-sensitive element 1310. Since the channel induced by the vertical gate structure is not located in a substrate in which the light-sensitive element 1310 is formed, the light-sensitive element 1310 can be formed to occupy a big area of the pixel unit 1000, and high quantum efficiency (QE) is achieved. In addition, the gate dielectric layer 1330 and the conductive layer 1340 includes portions disposed on the post structure 1350 and adjacent to the floating node, the signals of the light-sensitive element 1310 are transmitted to the peripheral circuits along the direction D13.

In some embodiments, a doped region 1372 is formed on the light-sensitive element 1310, and the doped region 1372 is formed by doping with a dopant of the first type. In some embodiments, the doped region 1372 is formed by doping with the n-type dopant at a concentration of about 2.5E12 atoms/cm$^3$.

Figure 15A:
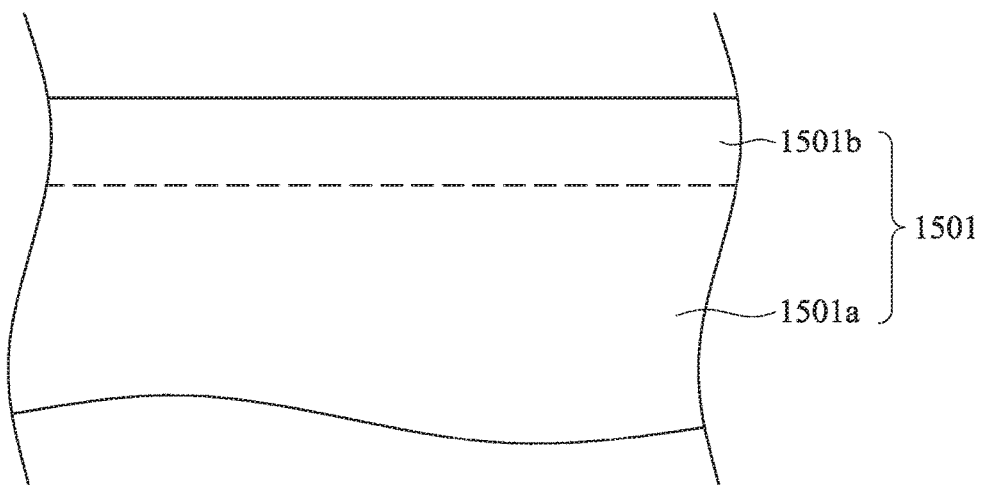
FIG. 15A to FIG. 15J are cross-sectional views of intermediate stages showing the method for fabricating an image sensor in accordance with some embodiments of the present disclosure.

Referring to FIG. 14 and FIG. 15A to FIG. 15J, FIG. 14 is a flow chart showing a method 1400 for fabricating an image sensor in accordance with embodiments of the present disclosure, and FIG. 15A to FIG. 15J are cross-sectional views of intermediate stages showing the method 1400 for fabricating an image sensor in accordance with some embodiments of the present disclosure. The method 1400 begins at operation 1410. Operation 1410 is performed to provide a semiconductor substrate 1501 as shown in FIG. 15A. The semiconductor substrate 1501 has a bottom portion 1501a and a top portion 1501b on the bottom portion 1501a.

In some embodiments, the semiconductor substrate 1501 may be a semiconductor material and may include structures including a graded layer or a buried oxide, for example. In some exemplary examples, the semiconductor substrate 1501 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 1501. Alternatively, the semiconductor substrate 1501 may be an active layer of a semiconductor-on-insulator (SOI) substrate or a multi-layered structure such as a silicon-germanium layer formed on a bulk silicon layer.

Figure 15B:
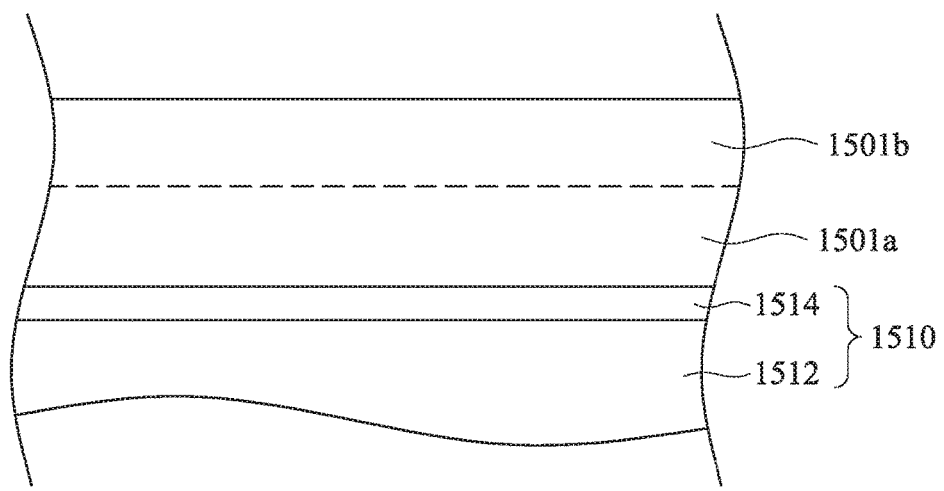

Then, operation 1412 is performed to form a light-sensitive element 1510 in the bottom portion 1501a of the semiconductor substrate 1501 as shown in FIG. 15B. In some embodiments, the light-sensitive element 1510 is a photodiode and includes doped regions 1512 and 1514. The doped regions 1512 and 1514 are formed by doping with a dopant of a first type. In some embodiment, the doped regions 1512 and 1514 are formed by doping with an n-type dopant. In some embodiments, the doped region 1512 is doped at a first concentration, and the doped region 1514 is formed by doping with a second concentration greater than the first concentration. In some embodiments, the doped region 1512 is doped at a concentration of about 1E12 atoms/cm$^3$, and the doped region 1514 is doped at a concentration of about 5E12 atoms/cm$^3$, but embodiments of the present disclosure are not limited thereto.

Figure 15C:
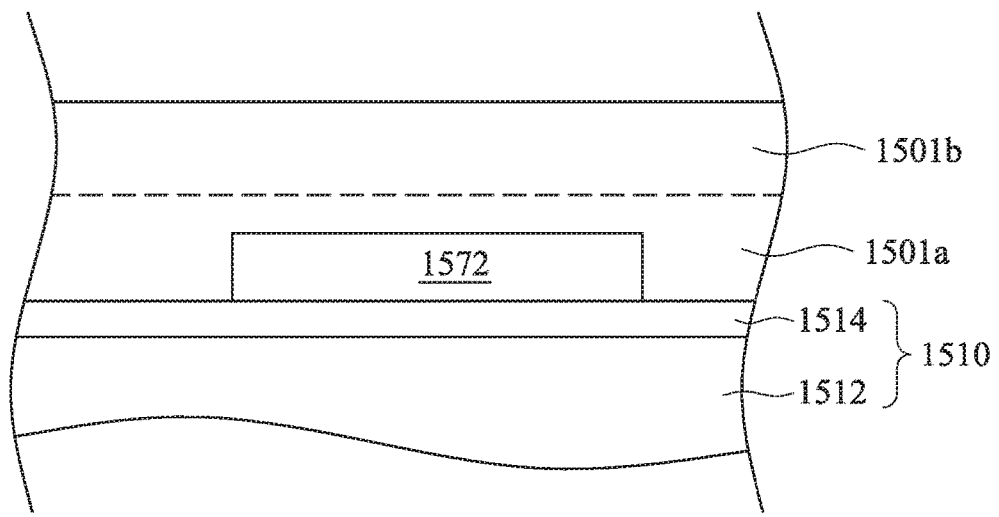

In some embodiments, a doped region 1572 can be formed on the light-sensitive element 1510 as shown in FIG. 15C, and the doped region 1572 is formed by doping with a dopant of the first type. In some embodiments, the doped region 1572 is formed by doping with the n-type dopant at a concentration of about 2.5E12 atoms/cm$^3$. In some embodiments, the doped region 1572 is not formed.

Figure 15D:
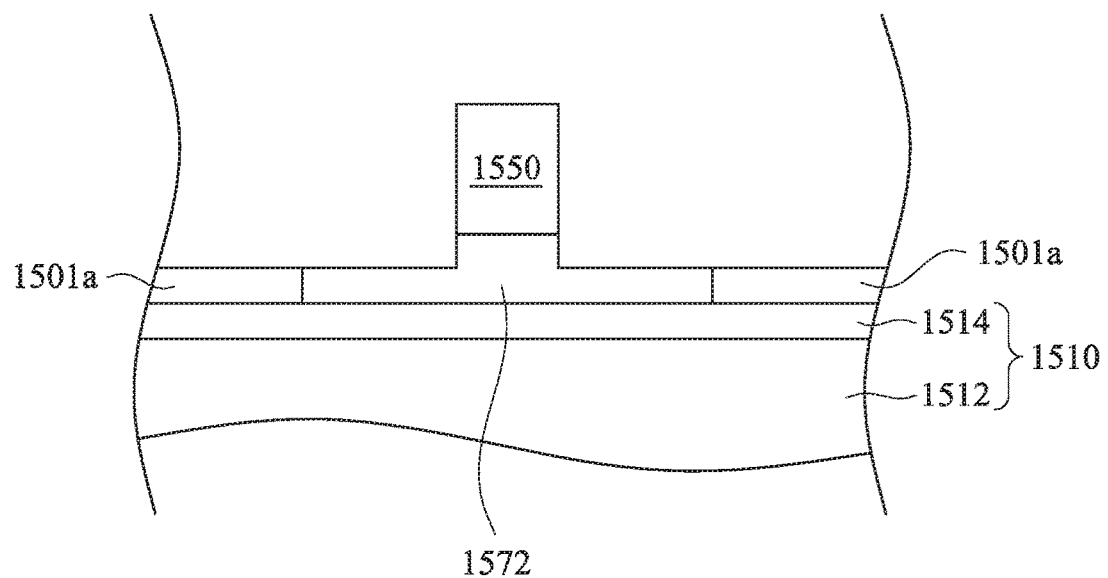

Then, operation 1414 is performed to etch the top portion 1501b of the semiconductor substrate 1501 to form a post structure 1550 on the bottom portion 1501a of the semiconductor substrate 1501 as shown in FIG. 15D. In operation 1414, the top portion 1501b of the semiconductor substrate 1501 is etched to form at least one portion of the post structure 1550. In some embodiments, a portion of the bottom portion 1501a of the semiconductor substrate 1501 is also etched to form another portion of the post structure 1550. In some embodiments, the doped region 1572 is etched to have a protrusion portion located under the post structure 1550.

Figure 15E:
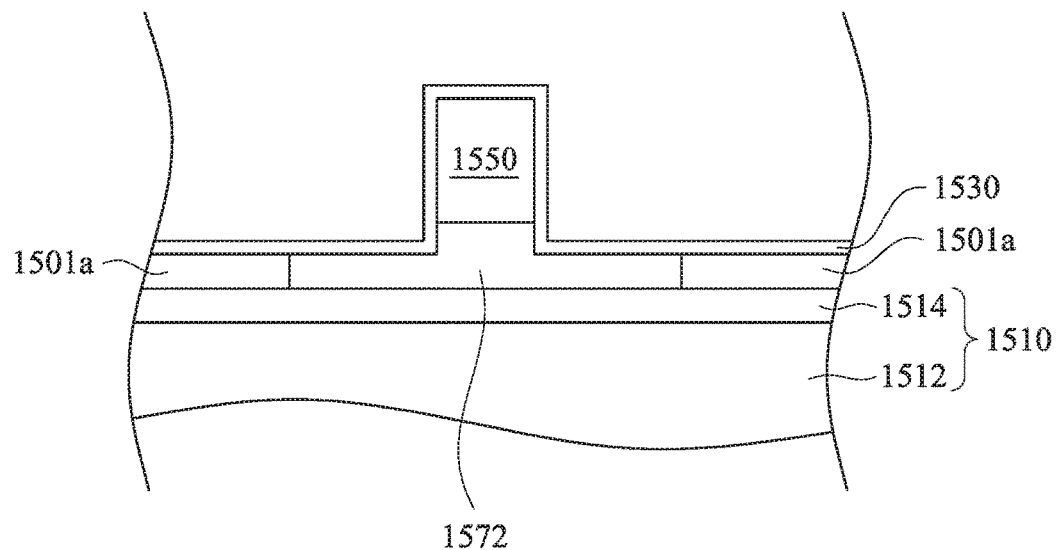

Thereafter, operation 1416 is performed to blanketly forming a gate dielectric layer 1530 to cover the bottom portion 1501a of the semiconductor substrate 1201 and the post structure 1550 as shown in FIG. 15E. In some embodiments, the gate dielectric layer 1530 is formed by using a deposition process such as an atomic layer deposition (ALD). Other methods to form the gate dielectric layer 1530 include chemical vapor deposition (CVD), physical vapor deposition (PVD), and plasma enhanced chemical vapor deposition (PECVD).

In some embodiments, the gate dielectric layer 1530 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material.

Figure 15F:
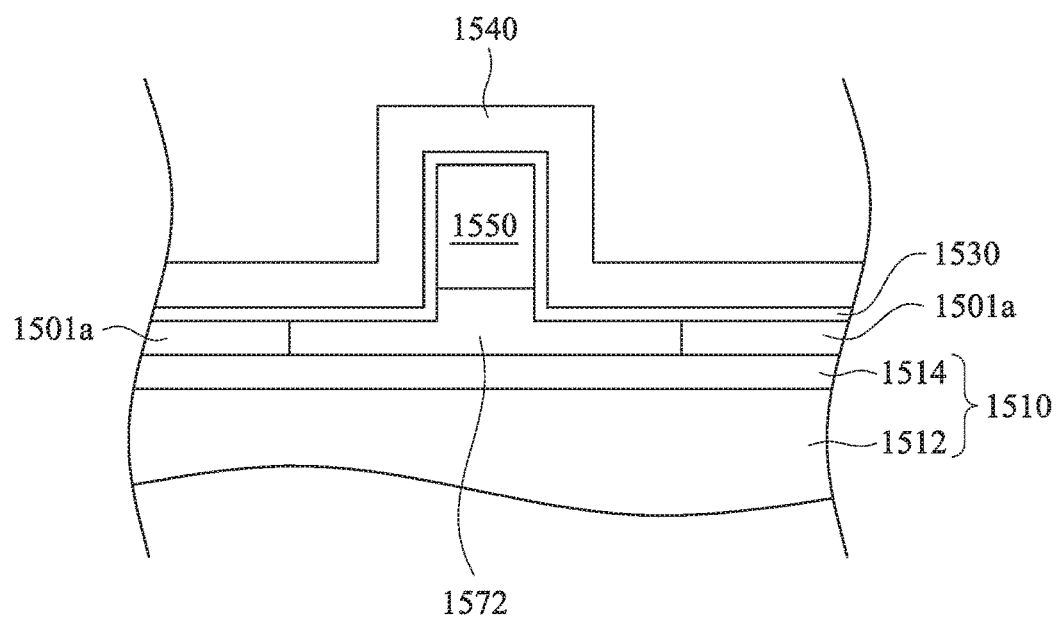

Then, operation 1418 is performed to blanketly form a conductive layer 1540 to cover the gate dielectric layer 1530 as shown in FIG. 15F. In some embodiments, the conductive layer 1540 is formed by using a deposition process such as an atomic layer deposition (ALD). Other methods to form the conductive layer 1540 include chemical vapor deposition (CVD), physical vapor deposition (PVD), and plasma enhanced chemical vapor deposition (PECVD). In some embodiments, the conductive layer 1540 is formed by doped poly-silicon, metal such as Al, Cu, W, Ti, Ta, TiN, TaN, NiSi, CoSi, other suitable conductive materials, or combinations thereof.

Figure 15G:
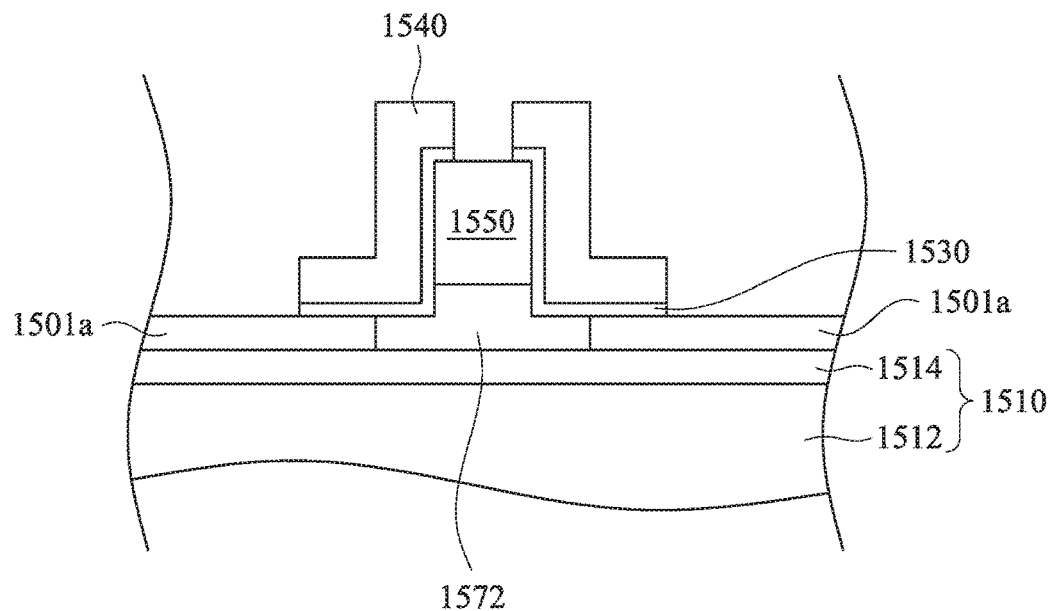

Thereafter, operation 1420 is performed to etch the conductive layer 1540 and the gate dielectric layer 1530 to form a vertical gate structure on the post structure 1550, as shown in FIG. 15G. In some embodiments, after being etched, the conductive layer 1540 and the gate dielectric layer include portions located on the tope surface of the post structure 1550.

Figure 15H:
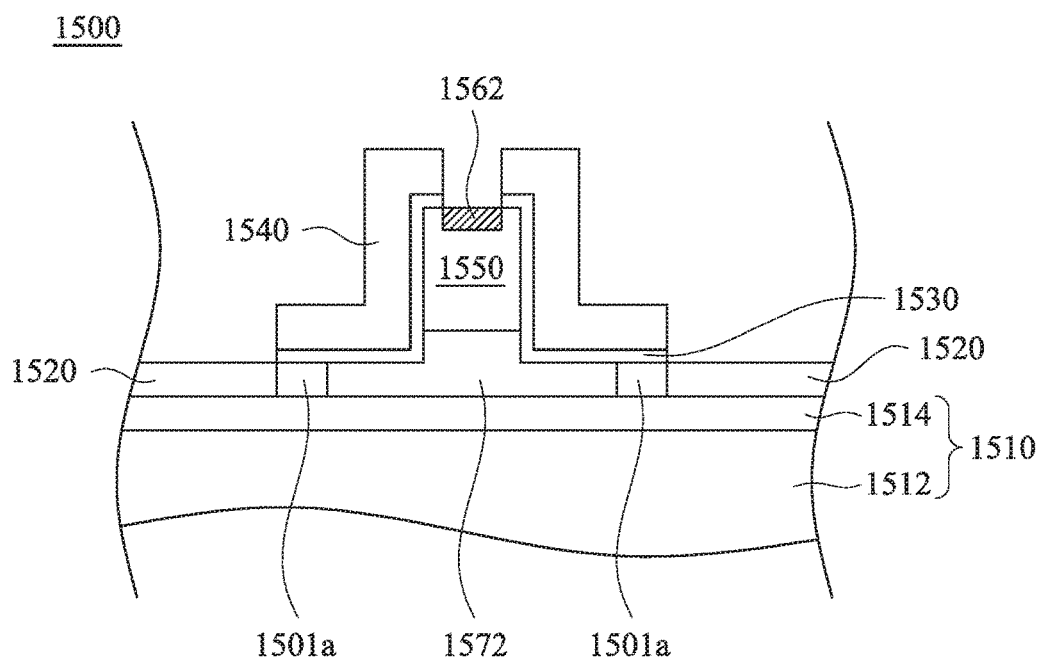

Then, operation 1422 is performed to form a protection layer 1520 on the light-sensitive element 1510 as shown in FIG. 15H. The protection layer 1520 may be referred to as a pinning layer and formed by doping the bottom portion 1501a of the semiconductor substrate 1501. The protection layer 1520 is formed by doping with a dopant of a second type opposite to the first type. In some embodiments, the protection layer 1520 is formed by doping with a p-type dopant at a concentration of about 1E13 atoms/$cm^3$. In addition, since the post structure 1550 has a portion not covered by the conductive layer 1540 and the gate dielectric layer 1530, the post structure 1550 may be doped to form a doped region 1562.

Figure 15I:
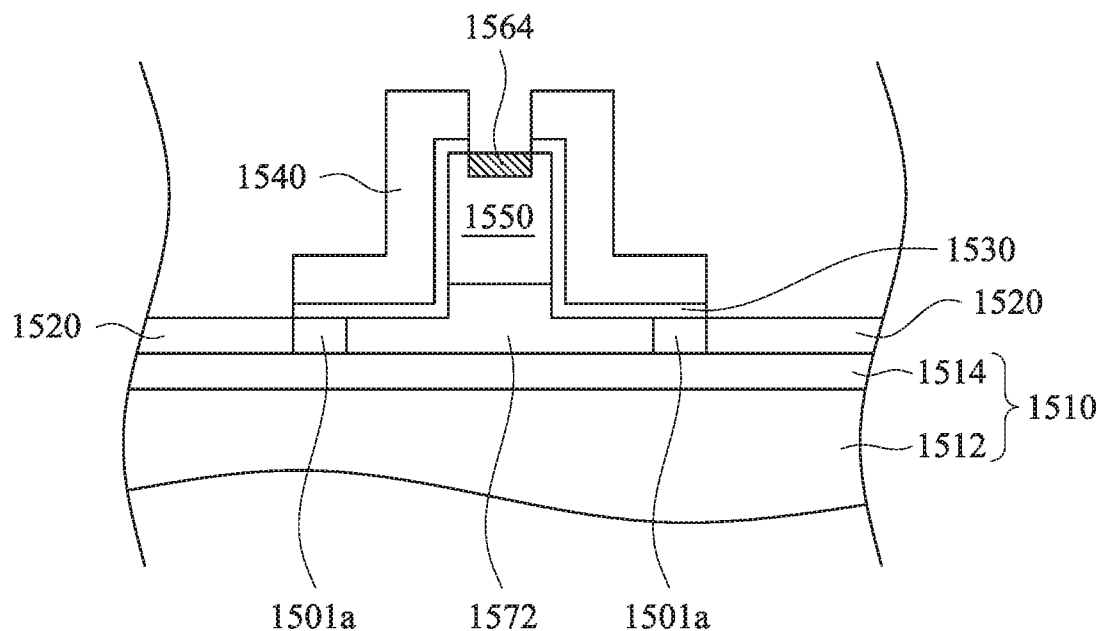

Thereafter, operation 1424 is performed to form a floating node 1564 on the post structure 1550 as shown in FIG. 15I. The floating node 1564 is formed by doping the doped region 1562. In some embodiments, the doped region 1562 is formed by doping with the n-type dopant of the first type at a concentration of 1E15 atoms/$cm^3$, but embodiments of the present disclosure are not limited thereto.

Figure 15J:
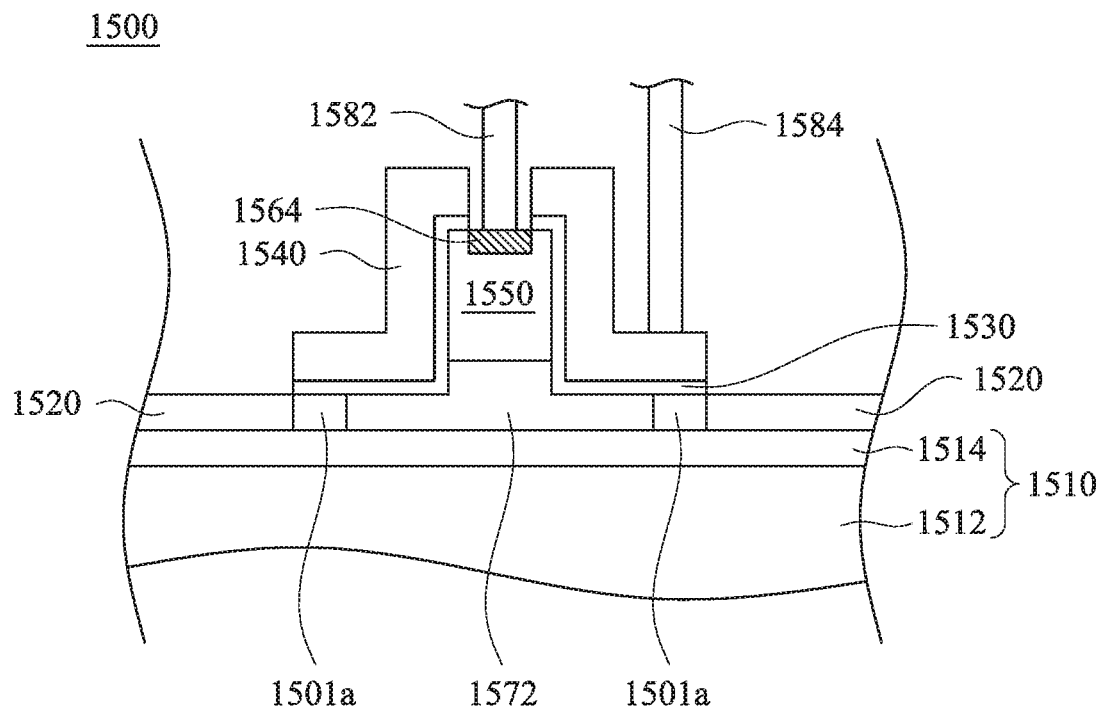

Then, operation 1426 is performed to form a source contact 1582 on the floating node 1564, and to form a gate contact 1584 on the conductive layer 1540, thereby forming a pixel unit 1500 as shown in FIG. 15J.

It can be understood that few masks are used in method 1400 for fabricating an image sensor. For example, a mask is used to form the doped region 1572 as shown in FIG. 15C. For another example, a mask is used to achieve etching the top portion 1501b of the semiconductor substrate 1501 as shown in FIG. 15D. For further another example, a mask is used to etch the conductive layer 1540 and the gate dielectric layer 1530 as shown in FIG. 15G. For still another example, a mask is used to form the floating node 1564 as shown in FIG. 15G. Since few masks are used in the method 1400 for fabricating an image sensor, cost of the method 1400 is reduced.

Figure 16A:
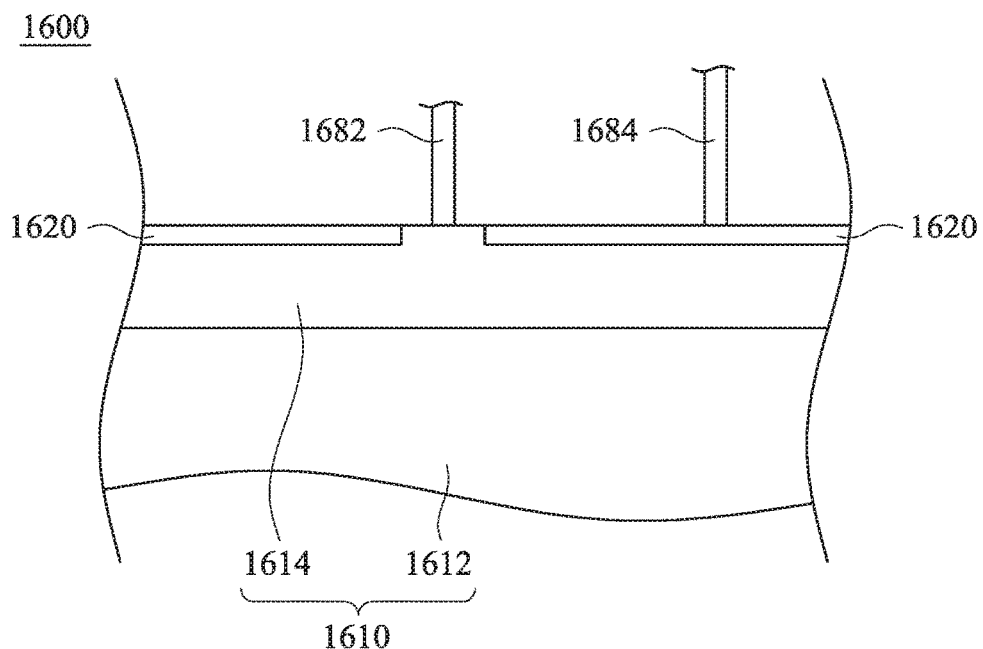
FIG. 16A is a schematic cross-sectional view of a pixel unit of an image sensor in accordance with some embodiments of the present disclosure.
Figure 16B:
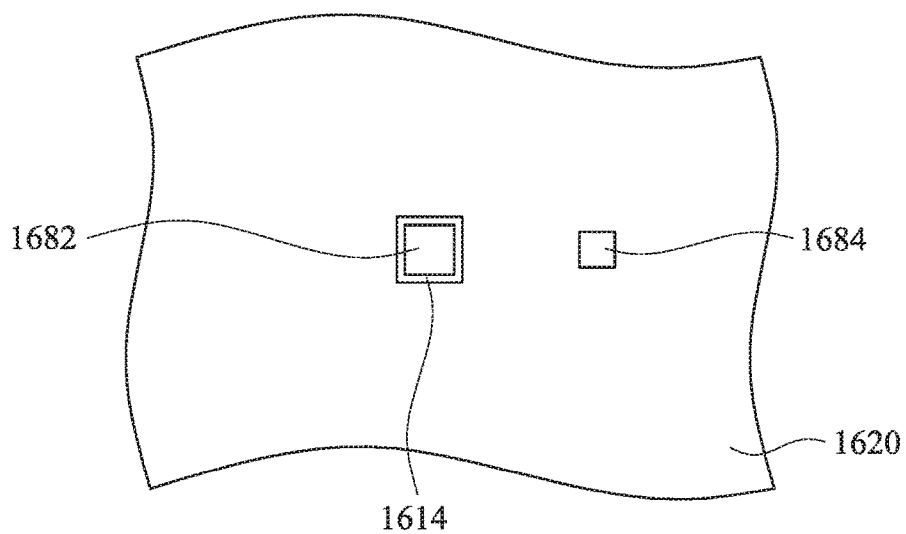
FIG. 16B is a schematic top view of the pixel unit of an image sensor in accordance with some embodiments of the present disclosure.

Referring to FIG. 16A and FIG. 16B, FIG. 16A is a schematic cross-sectional view of a pixel unit 1600 of an image sensor in accordance with some embodiments of the present disclosure, and FIG. 16B is a schematic top view of the pixel unit 1600 of an image sensor in accordance with some embodiments of the present disclosure. The pixel unit 1600 is defined by plural isolation structures (not shown). In some embodiments, the isolation structures are doped (e.g., p-type, n-type, or a combination thereof) regions. In some embodiments, the isolation structures are shallow trench isolations (STIs).

The pixel unit 1600 includes a light-sensitive element 1610, a protection layer 1620, and contacts 1682 and 1684. In some embodiments, the light-sensitive element 1610 is a photodiode including doped regions 1612 and 1614, and the contact 1682 is disposed on the doped region 1614. In some embodiments, the contact 1682 is formed right on the doped region 1614. The doped regions 1612 and 1614 are formed by doping with a dopant of a first type. In some embodiment, the doped regions 1612 and 1614 are formed by doping with an n-type dopant. In some embodiments, the doped region 1612 is doped at a first concentration, and the doped region 1614 is doped at a second concentration greater than the first concentration. In some embodiments, the doped region 1612 is doped at a concentration of about 1E12 atoms/$cm^3$, and the doped region 1614 is doped at a concentration of about 5E12 atoms/$cm^3$, but embodiments of the present disclosure are not limited thereto.

The protection layer 1620 is disposed on the light-sensitive element 1610 to stabilize the light-sensitive element 1610. The protection layer 1620 may be referred to as a pinning layer and formed by doping with a dopant of a second type opposite to the first type. In some embodiments, the protection layer 1620 surrounds the contact 1682. In some embodiments, the protection layer 1620 is formed by doping with a p-type dopant at a concentration of about 1E13 atoms/$cm^3$.

When the light-sensitive element 1610 converts photo energy of light into the electrical signals, the electrical signals can be upward transmitted to the peripheral circuit trough a channel induced by the protection layer 1620 (since a PNP structure is formed adjacent to the contact 1682) and through the contact 1682. For example, a channel is induced by the protection layer 1620 when a voltage is applied on the protection layer 1620 through the contact 1684, and thus the electrical signals are upward transmitted to the peripheral circuit trough the induced channel and the contact 1682.

Figure 16C:
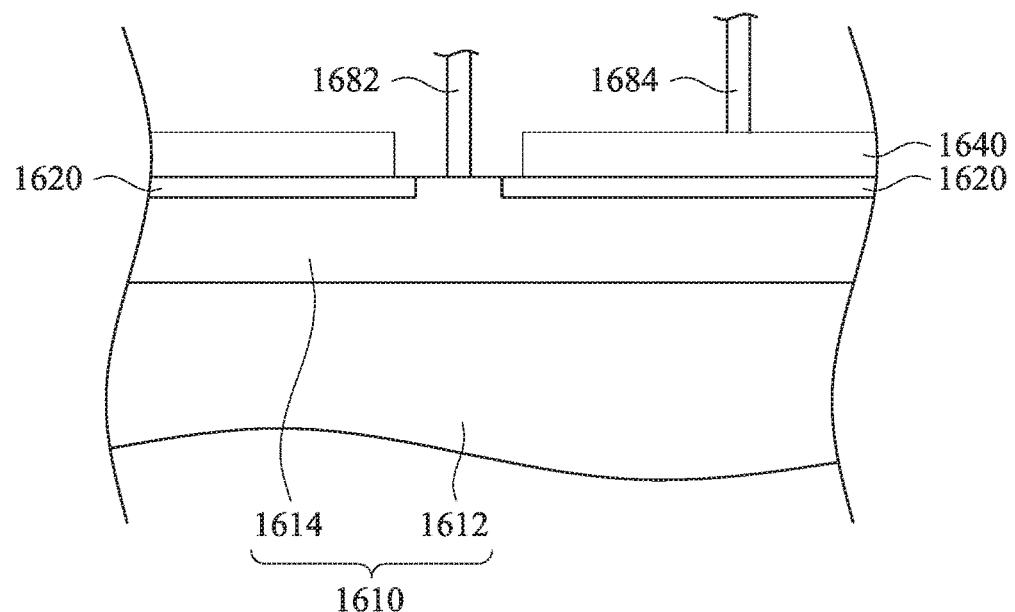
FIG. 16C is a schematic cross-sectional view of a pixel unit of an image sensor in accordance with some embodiments of the present disclosure.
Figure 16D:
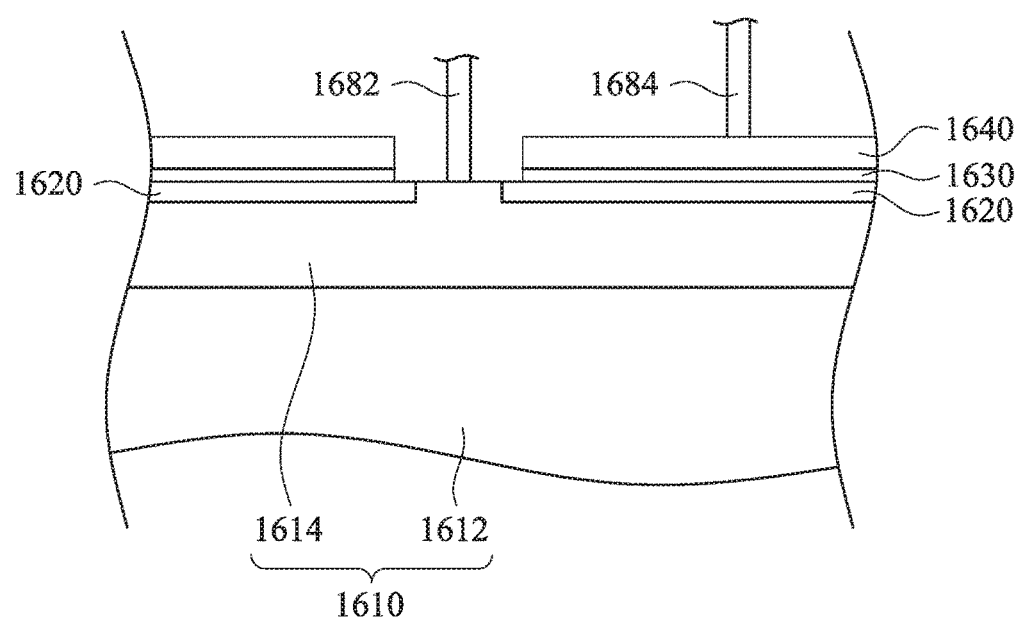
FIG. 16D is a schematic cross-sectional view of a pixel unit of an image sensor in accordance with some embodiments of the present disclosure.
Figure 17:
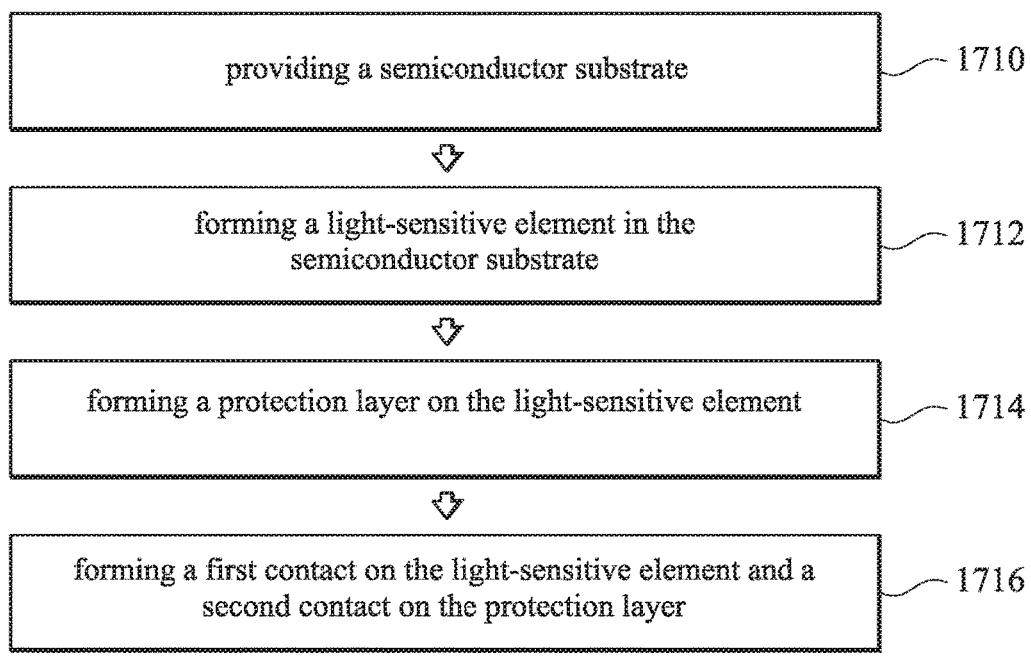
FIG. 17 is a flow chart showing a method for fabricating an image sensor in accordance with embodiments of the present disclosure.

In some embodiments, a conductive layer 1640 is formed on the protection layer 1620 and surrounds the contact 1682 as shown in FIG. 16C. In some embodiments, a gate dielectric layer 1630 is formed between the conductive layer 1640 and the protection layer 1620, and surrounds the contact 1682 as shown in FIG. 16D.

Figure 18A:
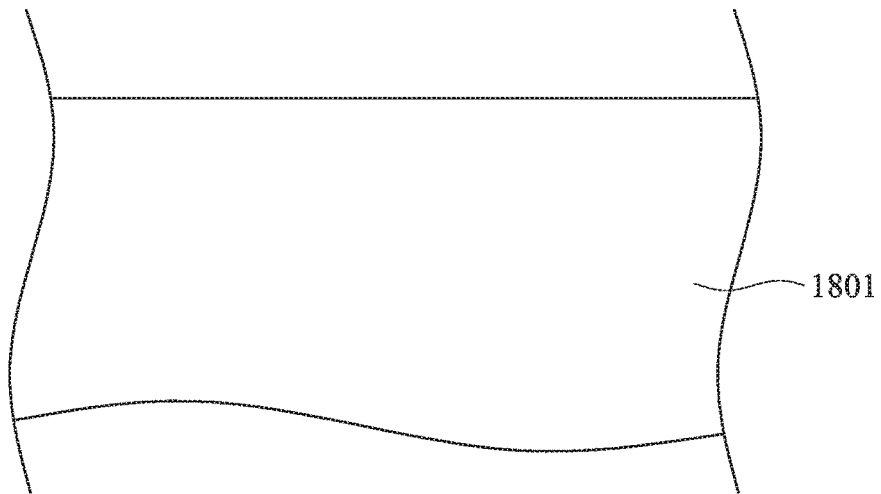
FIG. 18A to FIG. 18D are cross-sectional views of intermediate stages showing the method for fabricating an image sensor in accordance with some embodiments of the present disclosure.

Referring to FIG. 17 and FIG. 18A to FIG. 18D, FIG. 17 is a flow chart showing a method 1700 for fabricating an image sensor in accordance with embodiments of the present disclosure, and FIG. 18A to FIG. 18D are cross-sectional views of intermediate stages showing the method 1700 for fabricating an image sensor in accordance with some embodiments of the present disclosure. The method 1700 begins at operation 1710. Operation 1710 is performed to provide a semiconductor substrate 1801 as shown in FIG. 18A.

In some embodiments, the semiconductor substrate 1801 may be a semiconductor material and may include structures including a graded layer or a buried oxide, for example. In some exemplary examples, the semiconductor substrate 1801 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 1801. Alternatively, the semiconductor substrate 1801 may be an active layer of a semiconductor-on-insulator (SOI) substrate or a multi-layered structure such as a silicon-germanium layer formed on a bulk silicon layer.

Figure 18B:
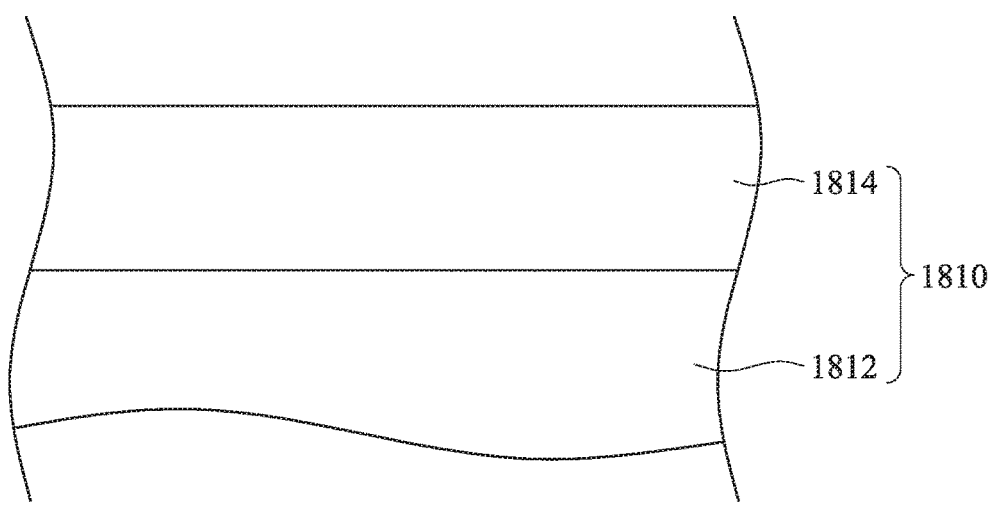

Then, operation 1712 is performed to form a light-sensitive element 1810 in the semiconductor substrate 1801 as shown in FIG. 18B. In some embodiments, the light-sensitive element 1810 is a photodiode and includes doped regions 1812 and 1814. The doped regions 1812 and 1814 are formed by doping with a dopant of a first type. In some embodiment, the doped regions 1812 and 1814 are formed by doping with an n-type dopant. In some embodiments, the doped region 1812 is doped at a first concentration, and the doped region 1814 is formed by doping with a second concentration greater than the first concentration. In some embodiments, the doped region 1812 is doped at a concentration of about 1E12 atoms/cm$^3$, and the doped region 1814 is doped at a concentration of about 5E12 atoms/cm$^3$, but embodiments of the present disclosure are not limited thereto.

Figure 18C:
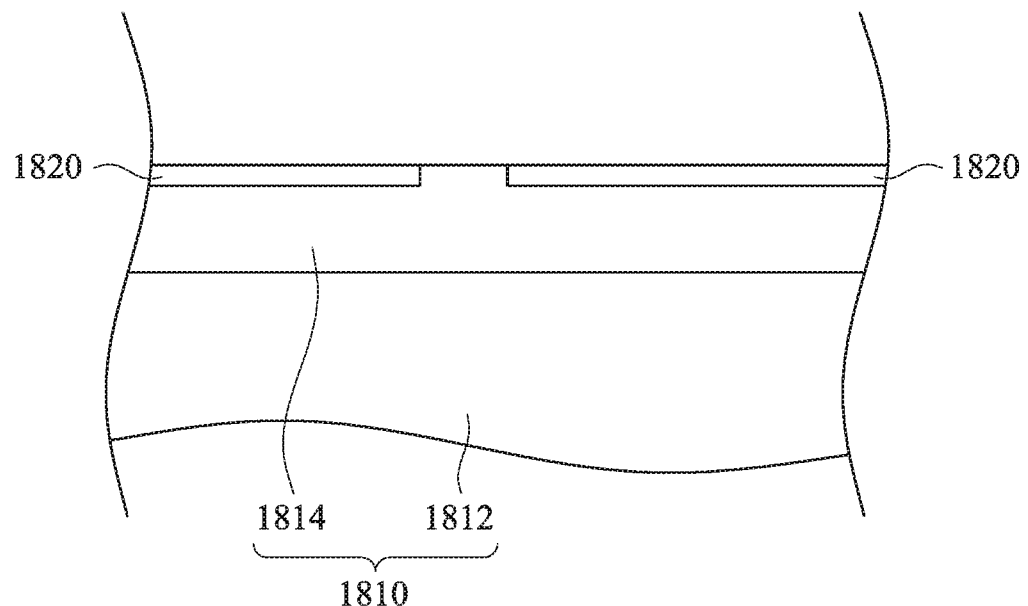

Thereafter, operation 1714 is performed to form a protection layer 1820 on the light-sensitive element 1810 as shown in FIG. 18C. The protection layer 1820 may be referred to as a pinning layer and formed by doping the doped region 1814. The protection layer 1820 is formed by doping with a dopant of a second type opposite to the first type. In some embodiments, the protection layer 1820 is formed by doping with a p-type dopant, thereby forming the protection layer 1820 having a concentration of about 1E13 atoms/cm$^3$ of the p-type dopant.

Figure 18D:
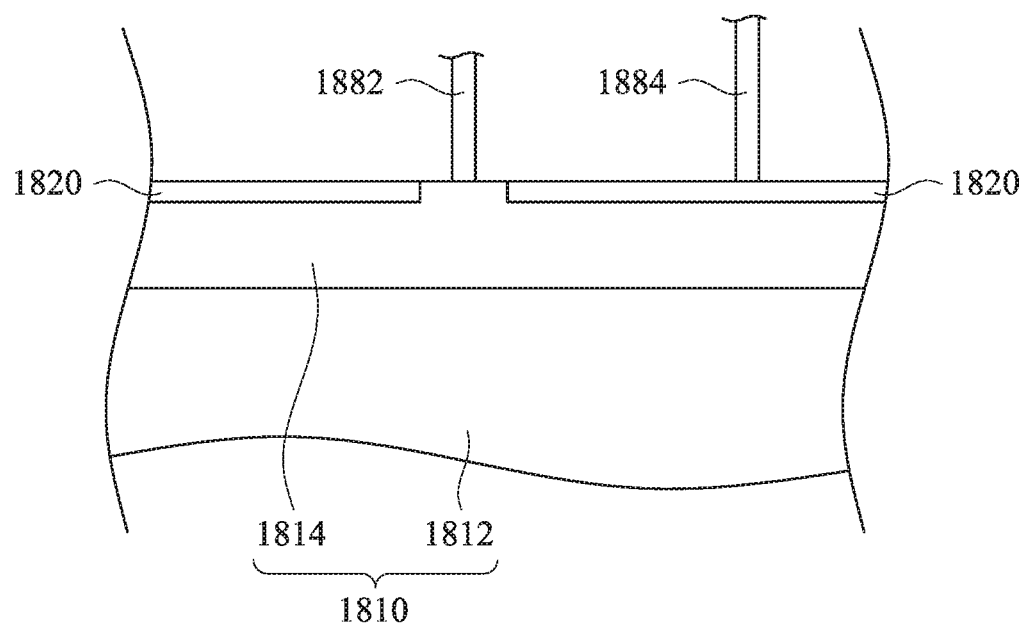

Then, operation 1716 is performed to form a first contact 1882 on the doped region 1814, and to form a second contact 1884 on the protection layer 1820, thereby forming a pixel unit 1800 as shown in FIG. 18D. In some embodiments, the protection layer 1820 surrounds the first contact 1882.

Figure 19A:
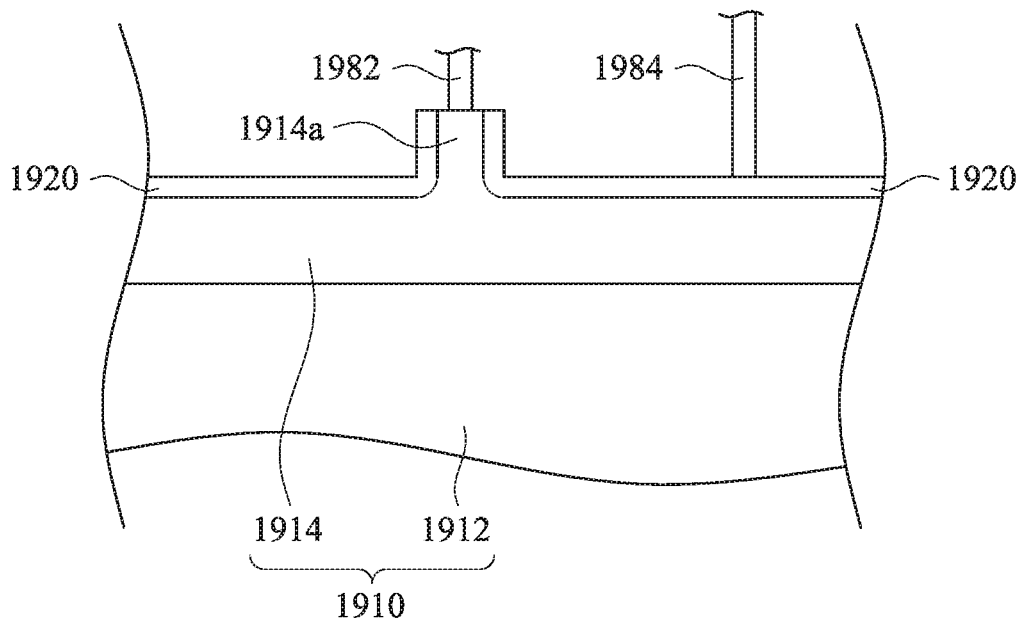
FIG. 19A is a schematic cross-sectional view of a pixel unit of an image sensor in accordance with some embodiments of the present disclosure.
Figure 19B:
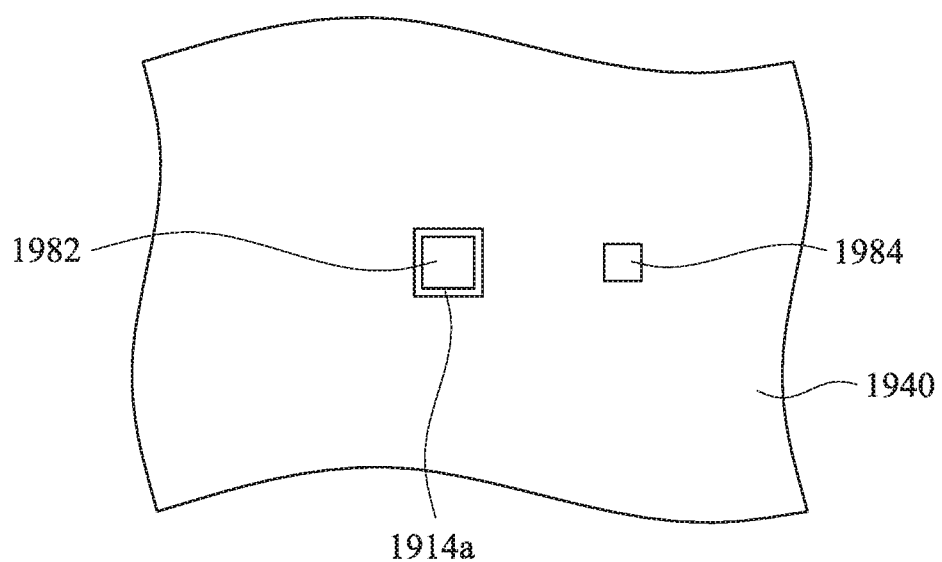
FIG. 19B is a schematic top view of the pixel unit of an image sensor in accordance with some embodiments of the present disclosure.

Referring to FIG. 19A and FIG. 19B, FIG. 19A is a schematic cross-sectional view of a pixel unit 1900 of an image sensor in accordance with some embodiments of the present disclosure, and FIG. 19B is a schematic top view of the pixel unit 1900 of an image sensor in accordance with some embodiments of the present disclosure. The pixel unit 1900 is defined by plural isolation structures (not shown). In some embodiments, the isolation structures are doped (e.g., p-type, n-type, or a combination thereof) regions. In some embodiments, the isolation structures are shallow trench isolations (STIs).

The pixel unit 1900 includes a light-sensitive element 1910, a protection layer 1920, and contacts 1982 and 1984. In some embodiments, the light-sensitive element 1910 is a photodiode including doped regions 1912 and 1914, and the doped region 1914 has a protrusion portion 1914a on which the contact 1982 is disposed. The doped regions 1912 and 1914 are formed by doping with a dopant of a first type. In some embodiment, the doped regions 1912 and 1914 are formed by doping with an n-type dopant. In some embodiments, the doped region 1912 is doped at a first concentration, and the doped region 1914 is doped at a second concentration greater than the first concentration. In some embodiments, the doped region 1912 is doped at a concentration of about 1E12 atoms/cm$^3$, and the doped region 1914 is doped at a concentration of about 5E12 atoms/cm$^3$, but embodiments of the present disclosure are not limited thereto.

The protection layer 1920 is disposed on the light-sensitive element 1910 to stabilize the light-sensitive element 1910. The protection layer 1920 may be referred to as a pinning layer and formed by doping with a dopant of a second type opposite to the first type. In some embodiments, the protection layer 1920 covers the protrusion portion 1914a of the doped region 1914 and surrounds the contact 1982. In some embodiments, the protection layer 1920 is formed by doping with a p-type dopant at a concentration of about 1E13 atoms/cm$^3$.

When the light-sensitive element 1910 converts photo energy of light into the electrical signals, the electrical signals can be upward transmitted to the peripheral circuit trough a channel induced by the protection layer 1920 (since a PNP structure is formed adjacent to the contact 1982) and through the contact 1982. For example, a channel is induced by the protection layer 1920 when a high voltage is applied on the protection layer 1920 through the contact 1984, and thus the electrical signals are upward transmitted to the peripheral circuit trough the induced channel and the contact 1982.

Figure 19C:
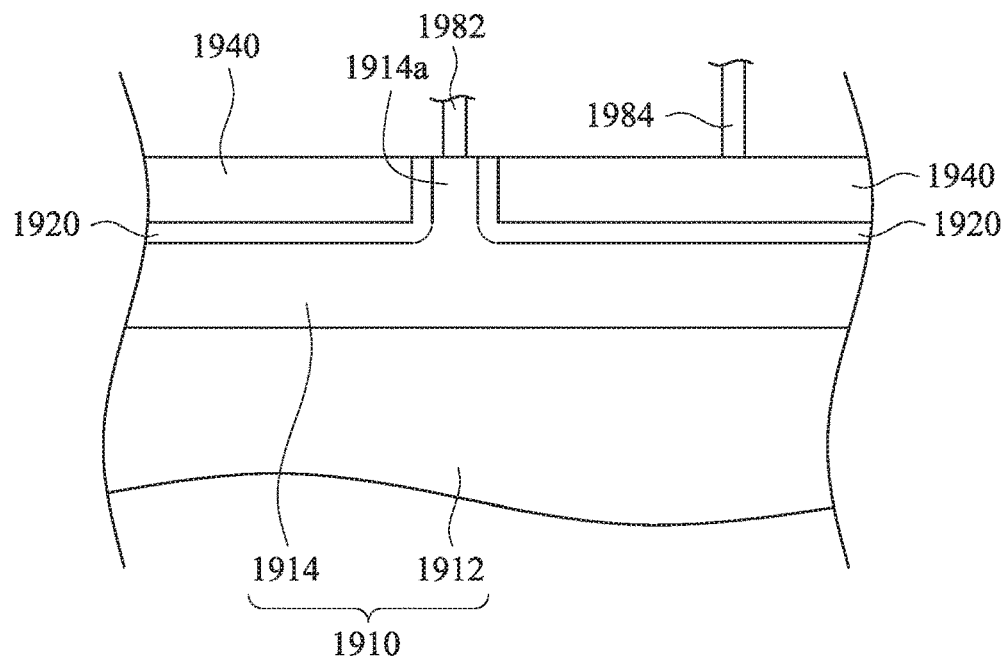
FIG. 19C is a schematic cross-sectional view of a pixel unit of an image sensor in accordance with some embodiments of the present disclosure.
Figure 19D:
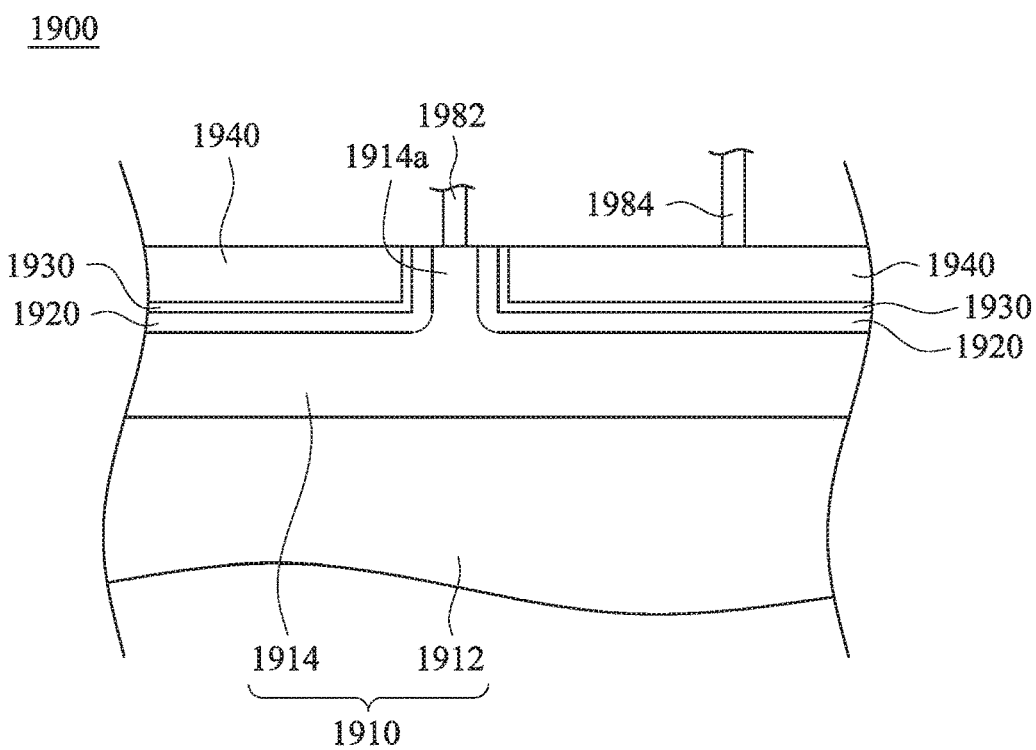
FIG. 19D is a schematic cross-sectional view of a pixel unit of an image sensor in accordance with some embodiments of the present disclosure.
Figure 20:
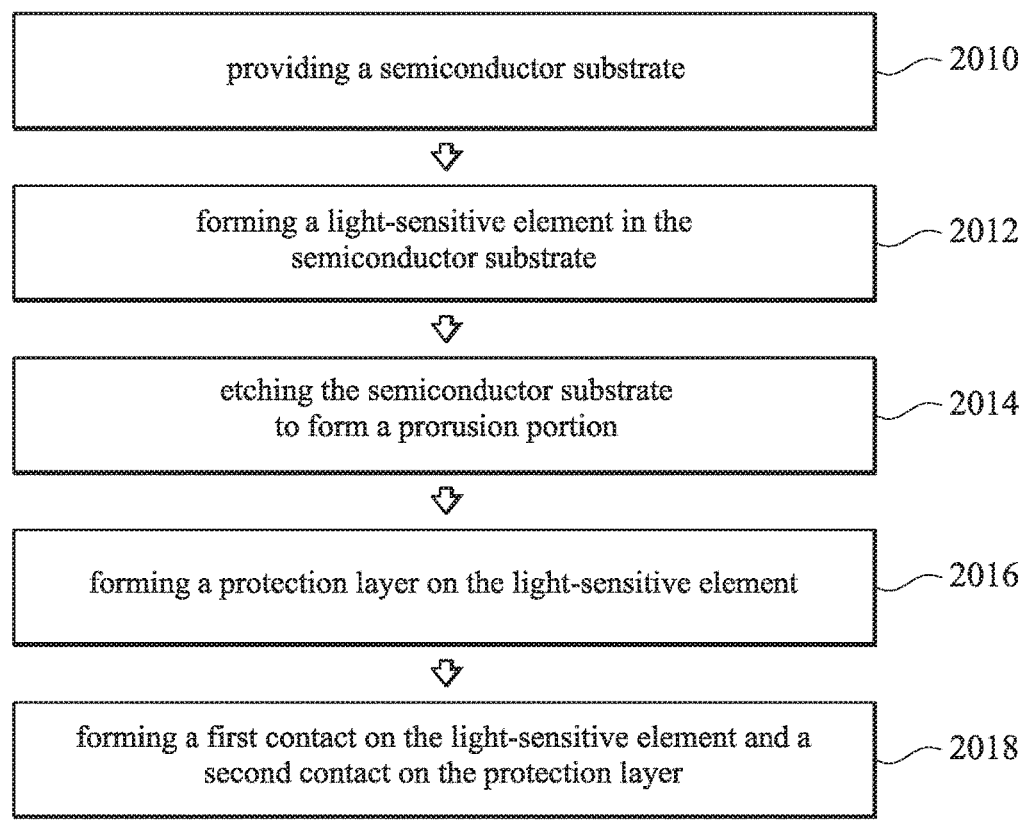
FIG. 20 is a flow chart showing a method for fabricating an image sensor in accordance with embodiments of the present disclosure.

In some embodiments, a conductive layer 1940 is formed on the protection layer 1920 and surrounds the contact 1982 as shown in FIG. 19C. In some embodiments, a gate dielectric layer 1930 is formed between the conductive layer 1940 and the protection layer 1920, and surrounds the contact 1982 as shown in FIG. 19D. In some embodiments, the protrusion portion 1914a can be an undoped portion.

Figure 21A:
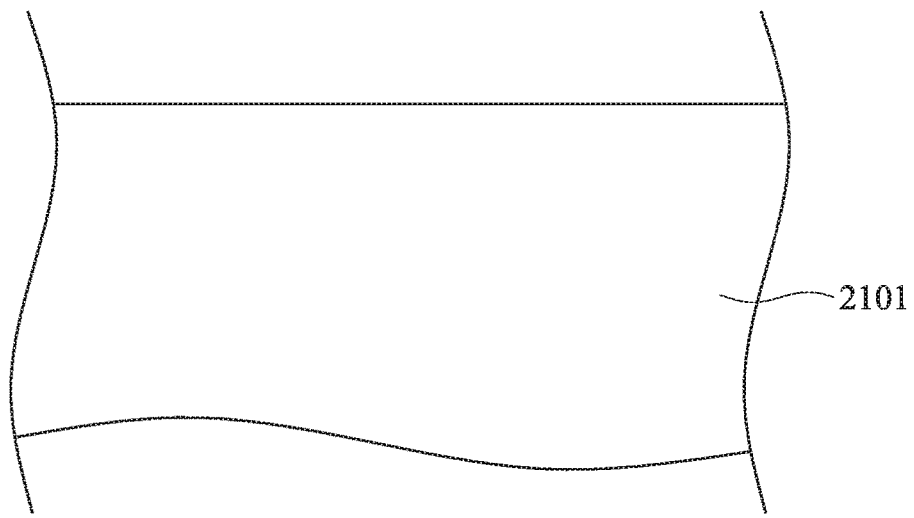
FIG. 21A to FIG. 21E are cross-sectional views of intermediate stages showing the method for fabricating an image sensor in accordance with some embodiments of the present disclosure.

Referring to FIG. 20 and FIG. 21A to FIG. 21D, FIG. 20 is a flow chart showing a method 2000 for fabricating an image sensor in accordance with embodiments of the present disclosure, and FIG. 21A to FIG. 21D are cross-sectional views of intermediate stages showing the method 2000 for fabricating an image sensor in accordance with some embodiments of the present disclosure. The method 2000 begins at operation 2010. Operation 2010 is performed to provide a semiconductor substrate 2101 as shown in FIG. 21A.

In some embodiments, the semiconductor substrate 2101 may be a semiconductor material and may include structures including a graded layer or a buried oxide, for example. In some exemplary examples, the semiconductor substrate 2101 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 2101. Alternatively, the semiconductor substrate 2101 may be an active layer of a semiconductor-on-insulator (SOI) substrate or a multi-layered structure such as a silicon-germanium layer formed on a bulk silicon layer.

Figure 21B:
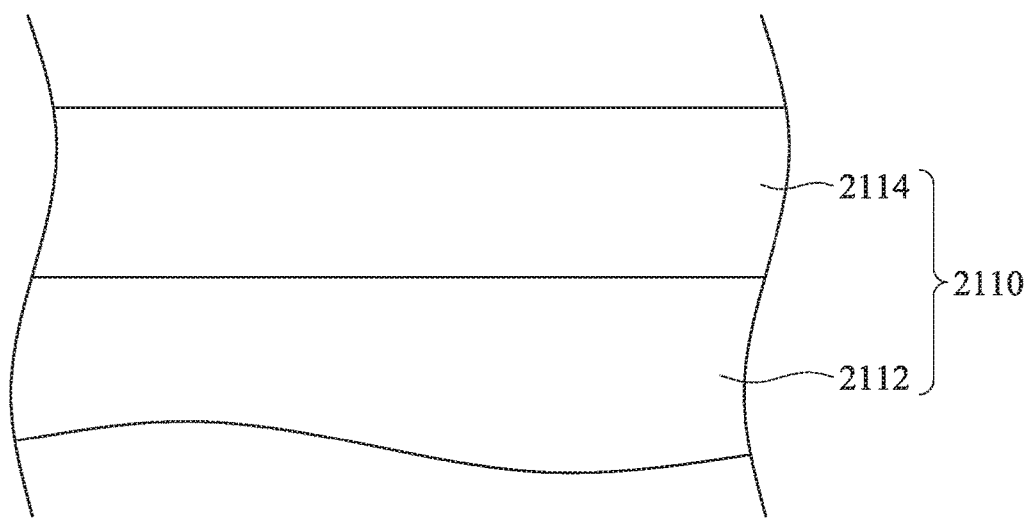

Then, operation 2012 is performed to form a light-sensitive element 2110 in the semiconductor substrate 2101 as shown in FIG. 21B. In some embodiments, the light-sensitive element 2110 is a photodiode and includes doped regions 2112 and 2114. The doped regions 2112 and 2114 are formed by doping with a dopant of a first type. In some embodiment, the doped regions 2112 and 2114 are formed by doping with an n-type dopant. In some embodiments, the doped region 2112 is doped at a first concentration, and the doped region 2114 is formed by doping with a second concentration greater than the first concentration. In some embodiments, the doped region 2112 is doped at a concentration of about 1E12 atoms/cm³, and the doped region 2114 is doped at a concentration of about 5E12 atoms/cm³, but embodiments of the present disclosure are not limited thereto.

Figure 21C:
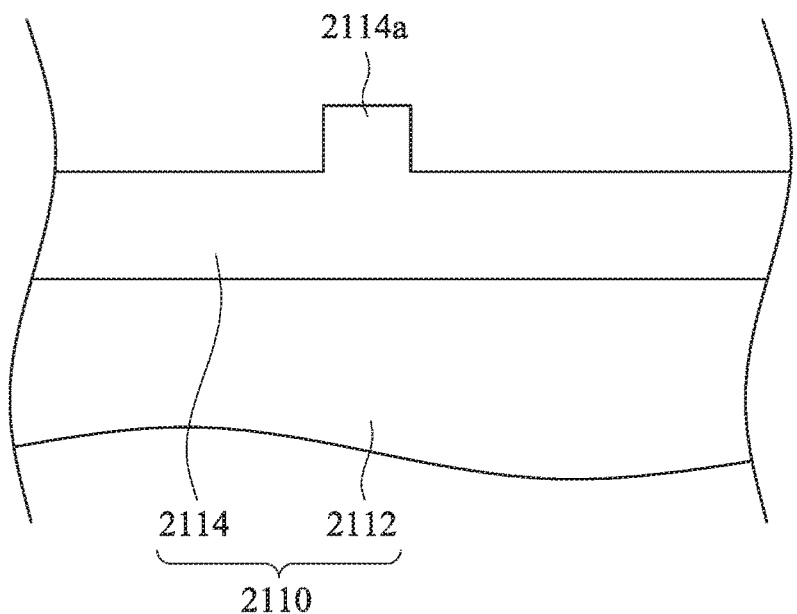

Thereafter, operation 2014 is performed to etch the semiconductor substrate 2101 to form a protrusion portion 2114a of the doped region 2114 as shown in FIG. 21C.

Figure 21D:
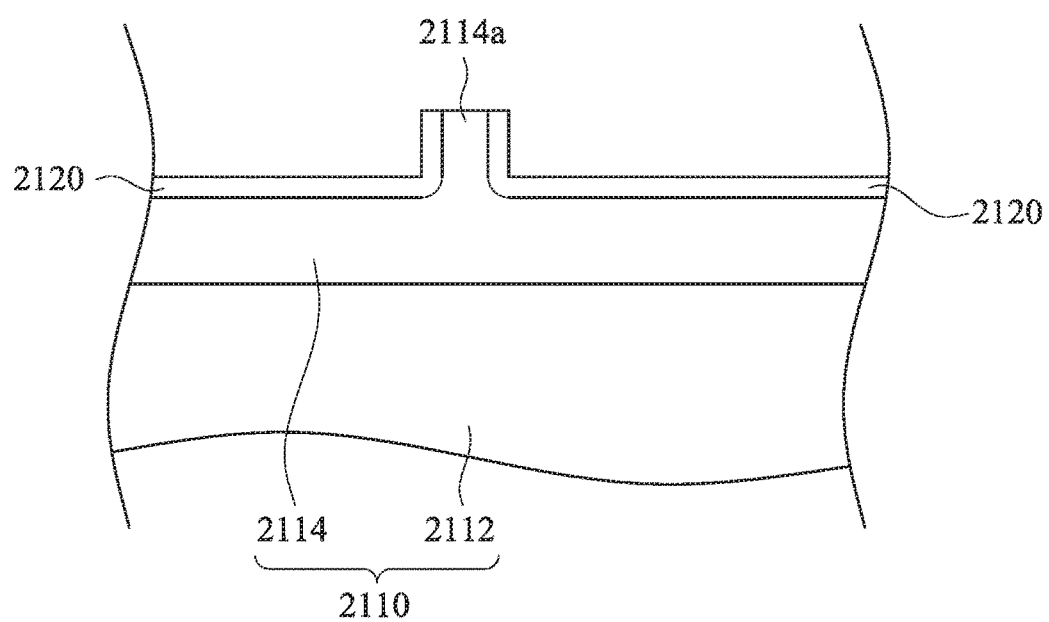

Then, operation 2016 is performed to form a protection layer 2120 on the light-sensitive element 2110 as shown in FIG. 21D. The protection layer 2120 may be referred to as a pinning layer and formed by doping the doped region 2114. The protection layer 2120 is formed by doping with a dopant of a second type opposite to the first type. In some embodiments, the protection layer 2120 is formed by doping with a p-type dopant, thereby forming the protection layer 2120 having a concentration of about 1E13 atoms/cm³ of the p-type dopant. In some embodiments, the protection layer 2120 is formed to cover sidewalls of the protrusion portion 2114a of the doped region 2114.

Figure 21E:
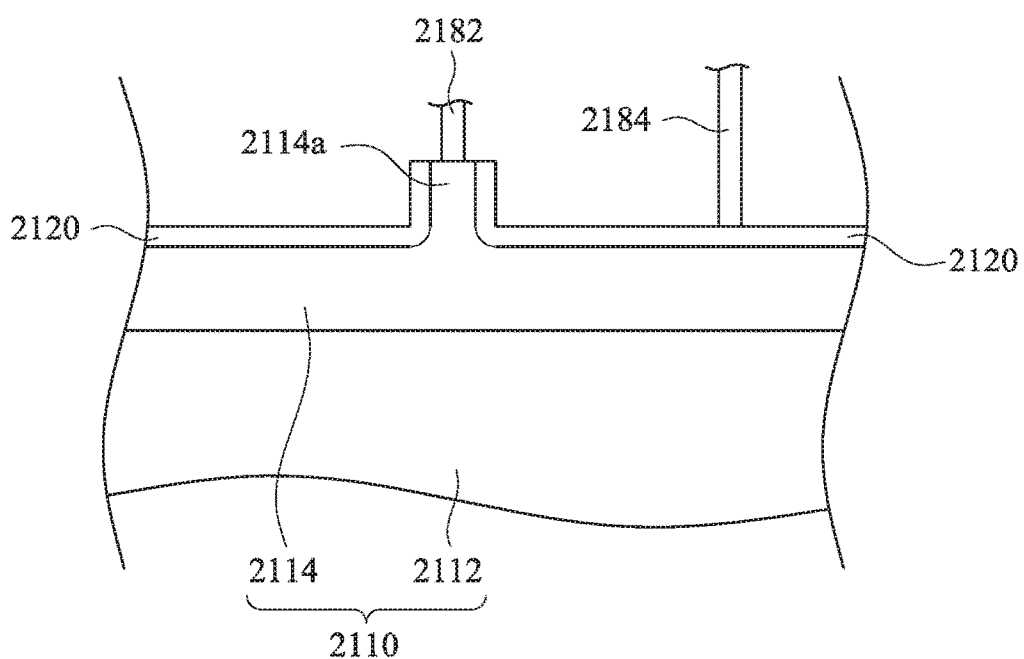

Then, operation 2018 is performed to form a first contact 2182 on the protrusion portion 2114a of the doped region 2114, and to form a second contact 2184 on the protection layer 2120, thereby forming a pixel unit 2100 as shown in FIG. 21E. In some embodiments, the protection layer 2120 surrounds the first contact 2182.

Figure 22A:
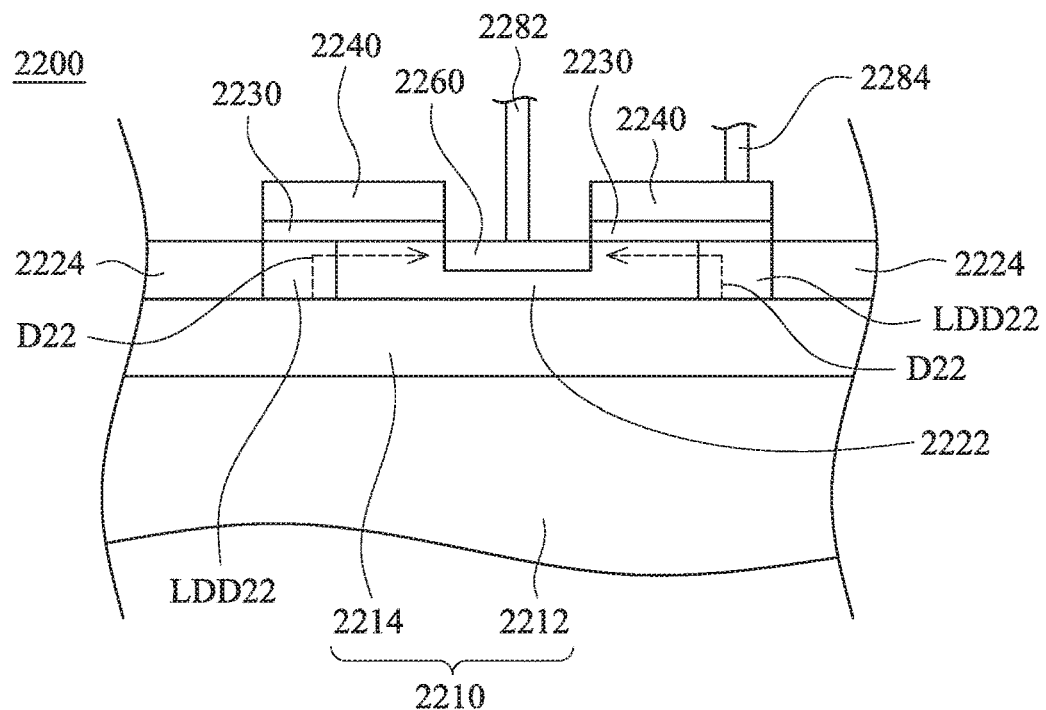
FIG. 22A is a schematic cross-sectional view of a pixel unit of an image sensor in accordance with some embodiments of the present disclosure.
Figure 22B:
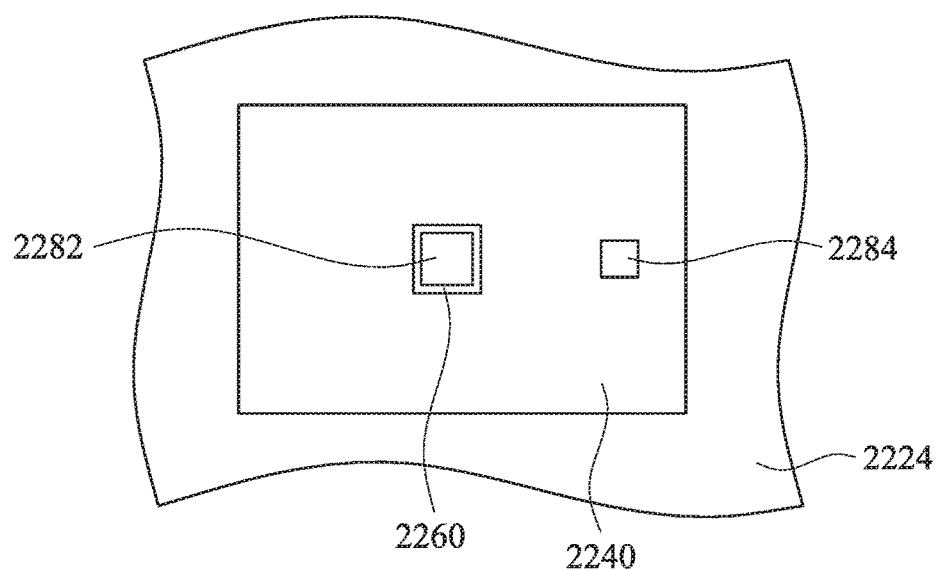
FIG. 22B is a schematic top view of the pixel unit of an image sensor in accordance with some embodiments of the present disclosure.
Figure 23:
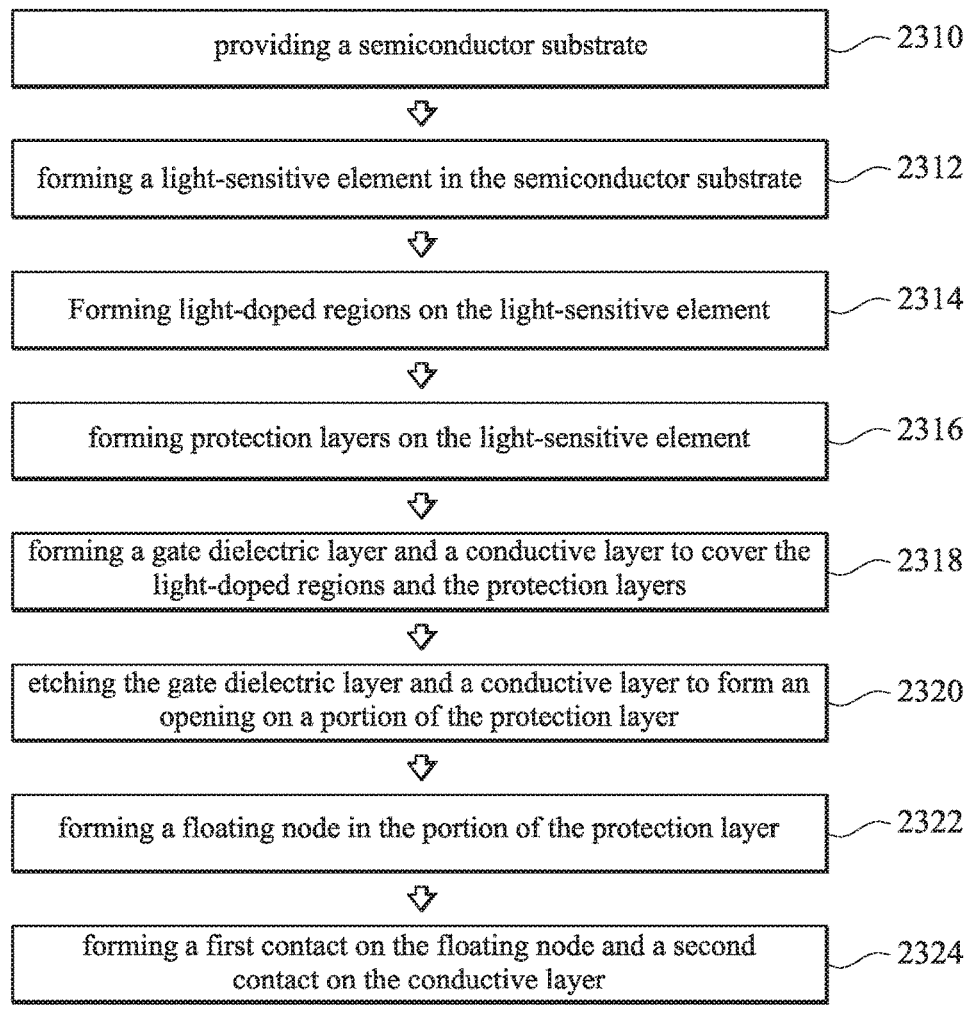
FIG. 23 is a flow chart showing a method for fabricating an image sensor in accordance with embodiments of the present disclosure.

Referring to FIG. 22A and FIG. 22B, FIG. 22A is a schematic cross-sectional view of a pixel unit 2200 of an image sensor in accordance with some embodiments of the present disclosure, and FIG. 22B is a schematic top view of the pixel unit 2200 of an image sensor in accordance with some embodiments of the present disclosure. The pixel unit 2200 is defined by plural isolation structures (not shown). In some embodiments, the isolation structures are doped (e.g., p-type, n-type, or a combination thereof) regions. In some embodiments, the isolation structures are shallow trench isolations (STIs).

The pixel unit 2200 includes a light-sensitive element 2210, protection layers 2222 and 2224, a lightly-doped region LDD22, a gate dielectric layer 2230, a conductive layer 2240, a floating node 2260, and contacts 2282 and 2284. In some embodiments, the light-sensitive element 2210 is a photodiode including doped regions 2212 and 2214. The doped regions 2212 and 2214 are formed by doping with a dopant of a first type. In some embodiment, the doped regions 2212 and 2214 are formed by doping with an n-type dopant. In some embodiments, the doped region 2212 is doped at a first concentration, and the doped region 2214 is doped at a second concentration greater than the first concentration. In some embodiments, the doped region 2212 is doped at a concentration of about 1E12 atoms/cm³, and the doped region 2214 is doped at a concentration of about 5E12 atoms/cm³, but embodiments of the present disclosure are not limited thereto.

The protection layers 2222 and 2224 are disposed on the light-sensitive element 2210 to stabilize the light-sensitive element 2210. The protection layers 2222 and 2224 may be referred to as a pinning layer and formed by doping with a dopant of a second type opposite to the first type. In some embodiments, the protection layers 2222 and 2224 surround the contact 2282. In some embodiments, the protection layers 2222 and 2224 are formed by doping with a p-type dopant at a concentration of about 1E13 atoms/cm³.

The lightly-doped region LDD22 is disposed on the light-sensitive element 2210. In some embodiments, the lightly-doped region LDD22 is located between the protection layers 2222 and 2224 and surrounds the contact 2282. The lightly-doped region LDD22 is formed by doping with a dopant of the first type. In some embodiment, the lightly-doped region LDD22 is formed by doping with an n-type dopant. In some embodiments, the lightly-doped region LDD22 is doped at a concentration smaller than the doping concentration of the doped region 2214. In some embodiments, the lightly-doped region LDD22 is doped at a concentration of about 2.5E12 atoms/cm³, but embodiments of the present disclosure are not limited thereto.

The gate dielectric layer 2230 and the conductive layer 2240 are sequentially disposed on the light-sensitive element 2210 and surround the contact 2282, and the contact 2284 is disposed on the conductive layer 2240. In some embodiments, the gate dielectric layer 2230 and the conductive layer 2240 covers the lightly-doped region LDD22 and a portion of the protection layer 2222. In some embodiments, the gate dielectric layer 2230 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$) alloy, or another suitable material. In some embodiments, the conductive layer 2240 is formed by doped poly-silicon, metal such as Al, Cu, W, Ti, Ta, TiN, TaN, NiSi, CoSi, other suitable conductive materials, or combinations thereof.

The floating node 2260 is disposed in the protection layer 2222, and the contact 2282 is disposed on the floating node 2260. In some embodiments, the floating node 2260 is formed by doping the protection layer 2222 with an n-type dopant at a concentration of about 1E15 atoms/cm³.

When the light-sensitive element 2210 converts photo energy of light into the electrical signals, the electrical signals can be upward transmitted to the peripheral circuit trough a channel induced by the gate dielectric layer 2230 and the conductive layer 2240 and through the contact 1982. For example, a channel is induced by the gate dielectric layer 2230 and the conductive layer 2240 when a high voltage is applied on the conductive layer 2240 through the contact 2284, and thus the electrical signals are upward transmitted to the peripheral circuit along a direction D22.

Figure 24A:
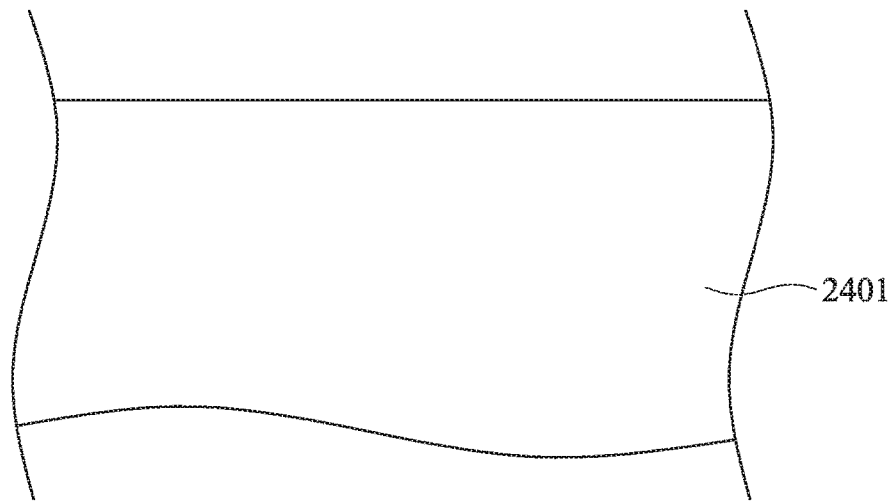
FIG. 24A to FIG. 24H are cross-sectional views of intermediate stages showing the method for fabricating an image sensor in accordance with some embodiments of the present disclosure.

Referring to FIG. 23 and FIG. 24A to FIG. 24H, FIG. 23 is a flow chart showing a method 2300 for fabricating an image sensor in accordance with embodiments of the present disclosure, and FIG. 24A to FIG. 24H are cross-sectional views of intermediate stages showing the method 2300 for fabricating an image sensor in accordance with some embodiments of the present disclosure. The method 2300 begins at operation 2310. Operation 2310 is performed to provide a semiconductor substrate 2401 as shown in FIG. 24A.

In some embodiments, the semiconductor substrate 2401 may be a semiconductor material and may include structures including a graded layer or a buried oxide, for example. In some exemplary examples, the semiconductor substrate 2401 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 2401. Alternatively, the semiconductor substrate 2401 may be an active layer of a semiconductor-on-insulator (SOI) substrate or a multi-layered structure such as a silicon-germanium layer formed on a bulk silicon layer.

Figure 24B:
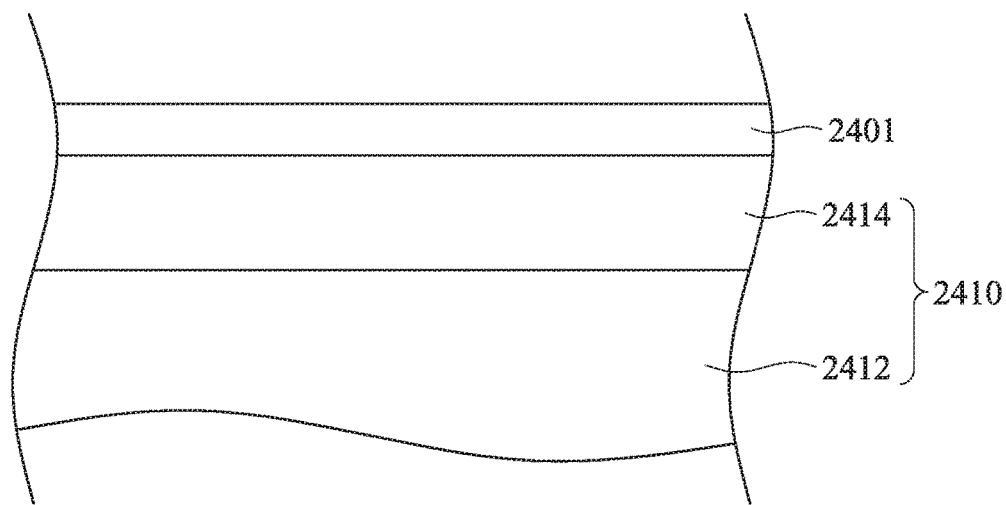

Then, operation 2312 is performed to form a light-sensitive element 2410 in the semiconductor substrate 2401 as shown in FIG. 24B. In some embodiments, the light-sensitive element 2410 is a photodiode and includes doped regions 2412 and 2414. The doped regions 2412 and 2414 are formed by doping with a dopant of a first type. In some embodiment, the doped regions 2412 and 2414 are formed by doping with an n-type dopant. In some embodiments, the doped region 2412 is doped at a first concentration, and the doped region 2414 is formed by doping with a second concentration greater than the first concentration. In some embodiments, the doped region 2412 is doped at a concentration of about 1E12 atoms/cm$^3$, and the doped region 2414 is doped at a concentration of about 5E12 atoms/cm$^3$, but embodiments of the present disclosure are not limited thereto.

Figure 24C:
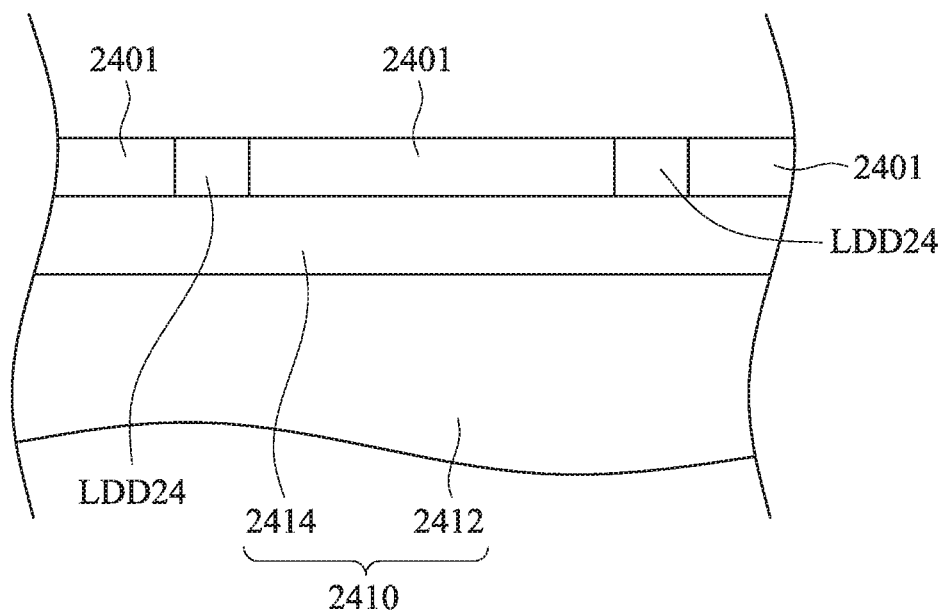

Thereafter, operation 2314 is performed to form a lightly-doped region LDD24 in the semiconductor substrate 2401 as shown in FIG. 24C. In some embodiments, the lightly-doped region LDD24 is formed by doping the semiconductor substrate 2401 with an n-type dopant. In some embodiments, the lightly-doped region LDD24 is doped at a concentration smaller than the doping concentration of the doped region 2414. In some embodiments, the lightly-doped region LDD24 is doped at a concentration of about 2.5E12 atoms/cm$^3$, but embodiments of the present disclosure are not limited thereto.

Figure 24D:
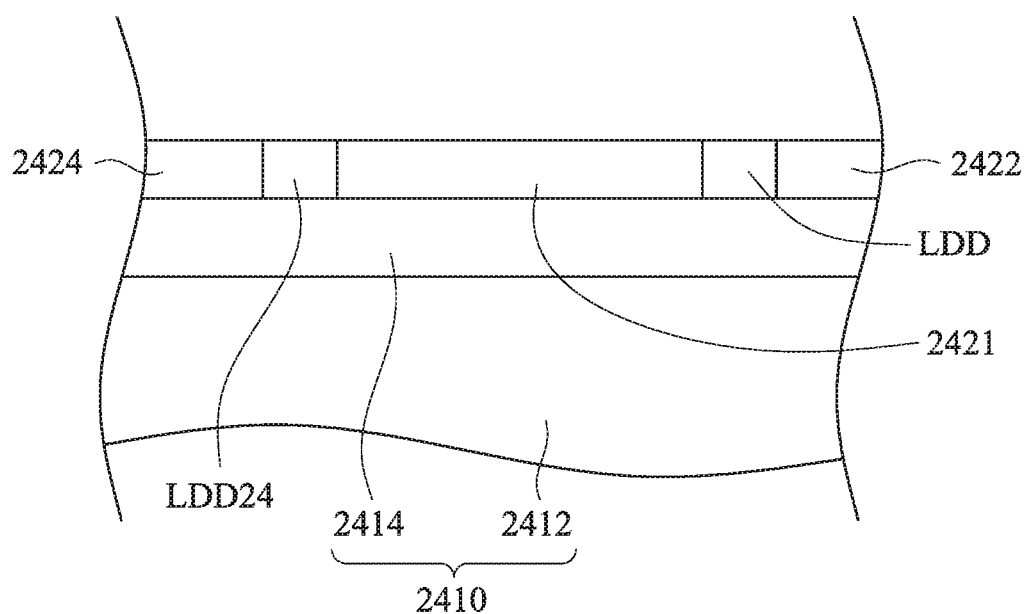

Then, operation 2316 is performed to form protection layers 2422 and 2424 on the light-sensitive element 2410 as shown in FIG. 24D. The protection layers 2422 and 2424 may be referred to as a pinning layer. The protection layers 2422 and 2424 are formed by doping the semiconductor substrate 2401 with a dopant of a second type opposite to the first type. In some embodiments, the protection layers 2422 and 2424 are formed by doping with a p-type dopant at a concentration of about 1E13 atoms/cm$^3$.

Figure 24E:
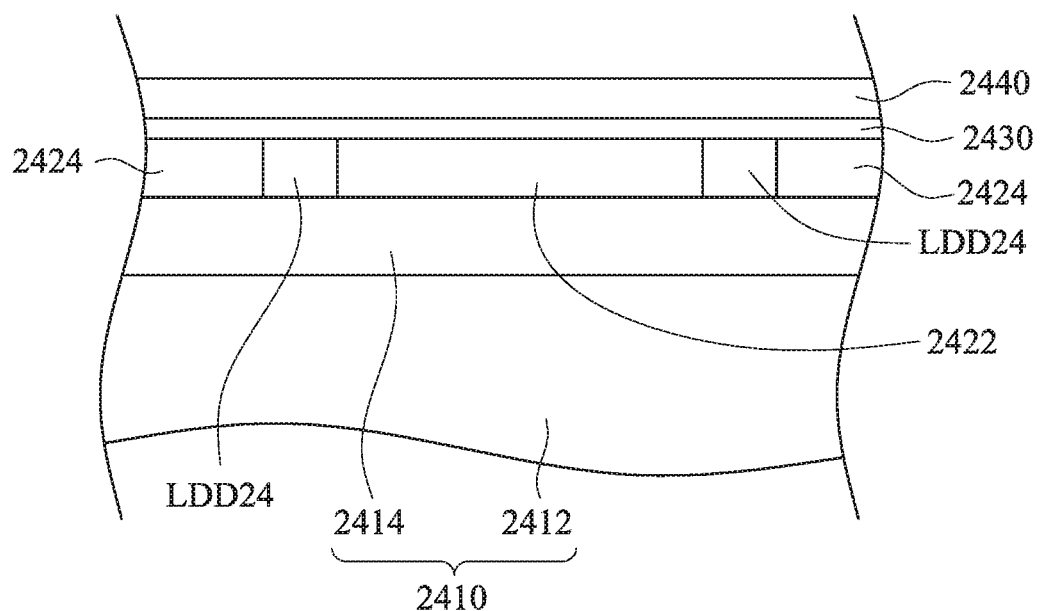

Thereafter, operation 2318 is performed to blanketly forming a gate dielectric layer 2430 and a conductive layer 2340 to cover the lightly-doped region LDD24 and the protection layers 2422 and 242 as shown in FIG. 24E. In some embodiments, the gate dielectric layer 2430 and the conductive layer 2340 are formed by using a deposition process such as an atomic layer deposition (ALD). Other methods to form the gate dielectric layer 2430 and the conductive layer 2340 include chemical vapor deposition (CVD), physical vapor deposition (PVD), and plasma enhanced chemical vapor deposition (PECVD).

In some embodiments, the gate dielectric layer 2430 is formed by high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$) alloy, or another suitable material.

In some embodiments, the conductive layer 2440 is formed by doped poly-silicon, metal such as Al, Cu, W, Ti, Ta, TiN, TaN, NiSi, CoSi, other suitable conductive materials, or combinations thereof.

Figure 24F:
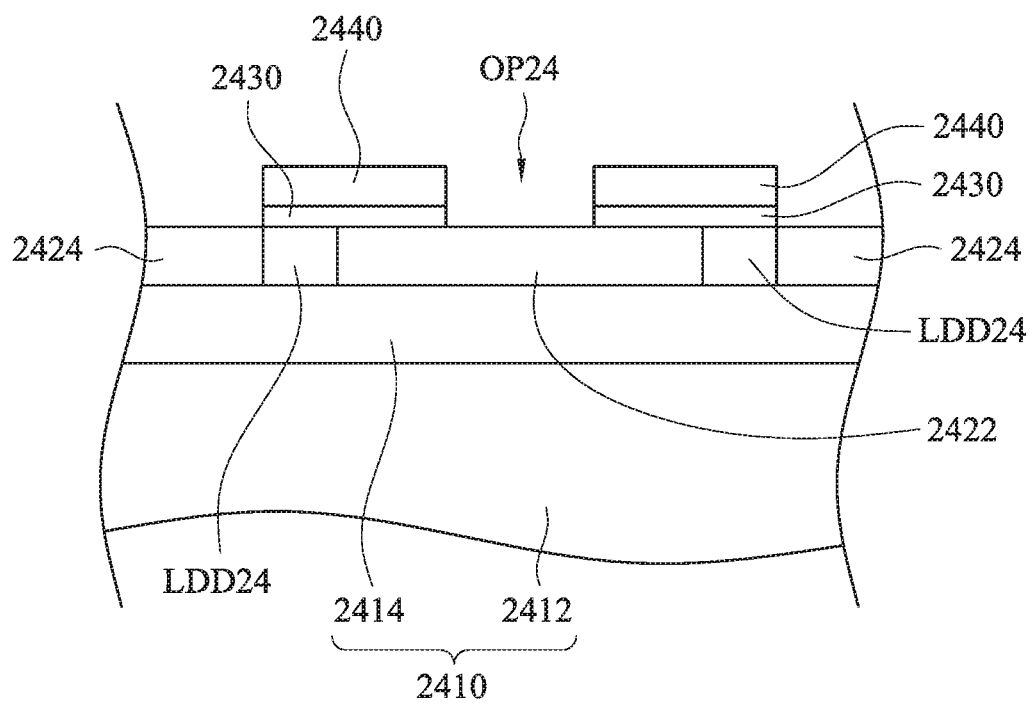

Thereafter, operation 2320 is performed to etch the conductive layer 2340 and the gate dielectric layer 2330 to form an opening OP24 on a portion of the protection layer 2422 as shown in FIG. 24F. In some embodiments, remaining portions of the conductive layer 2340 and the gate dielectric layer 2330 covers the lightly-doped region LDD24 and a portion of the protection layer 2422.

Figure 24G:
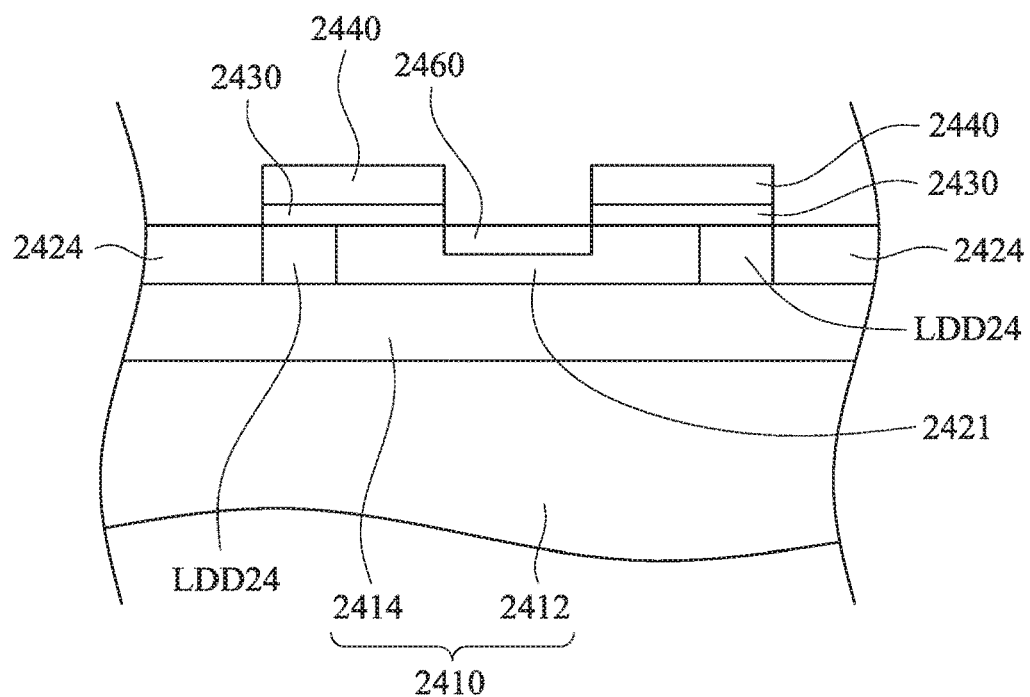

Then, operation 2322 is performed to form a floating node 2460 in the portion of the protection layer 2422 as shown in FIG. 24G. In some embodiments, the floating node 2460 is formed by doping the protection layer 2422 with an n-type dopant at a concentration of about 1E15 atoms/cm$^3$.

Figure 24H:
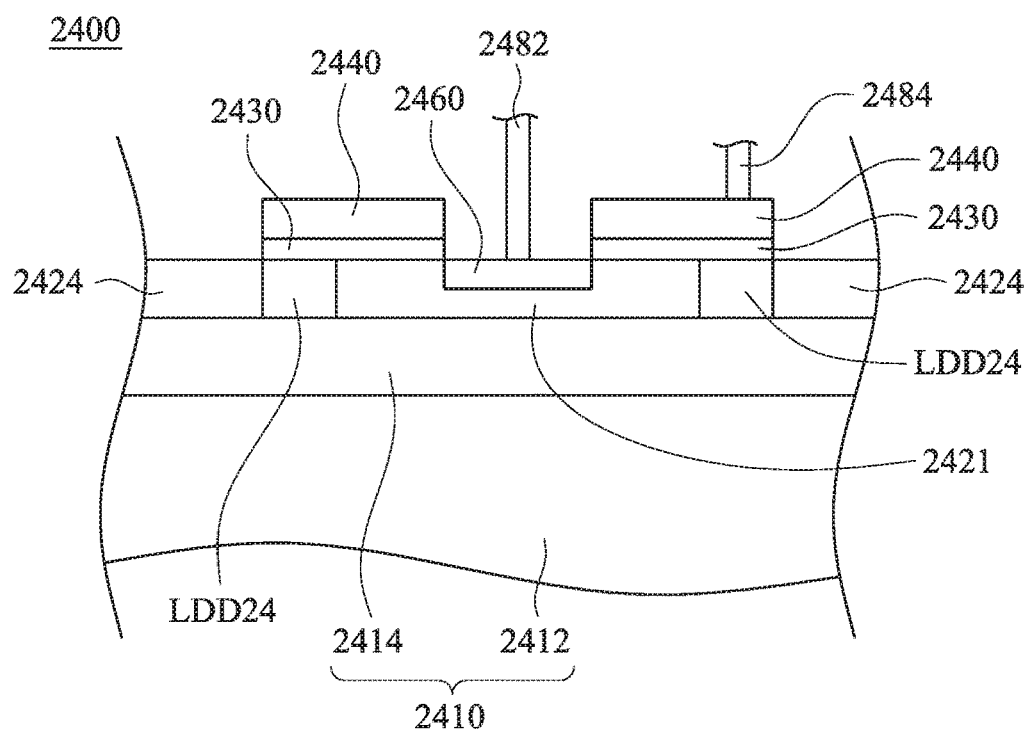

Thereafter, operation 2324 is performed to form a first contact 2482 on the floating node 2460, and to form a second contact 2484 on the conductive layer 2340, thereby forming a pixel unit 2400 as shown in FIG. 24H. In some embodiments, the protection layers 2422 and 2424, the lightly-doped region LDD24, the conductive layer 2340 and the gate dielectric layer 2330 surround the first contact 2482.

Figure 25:
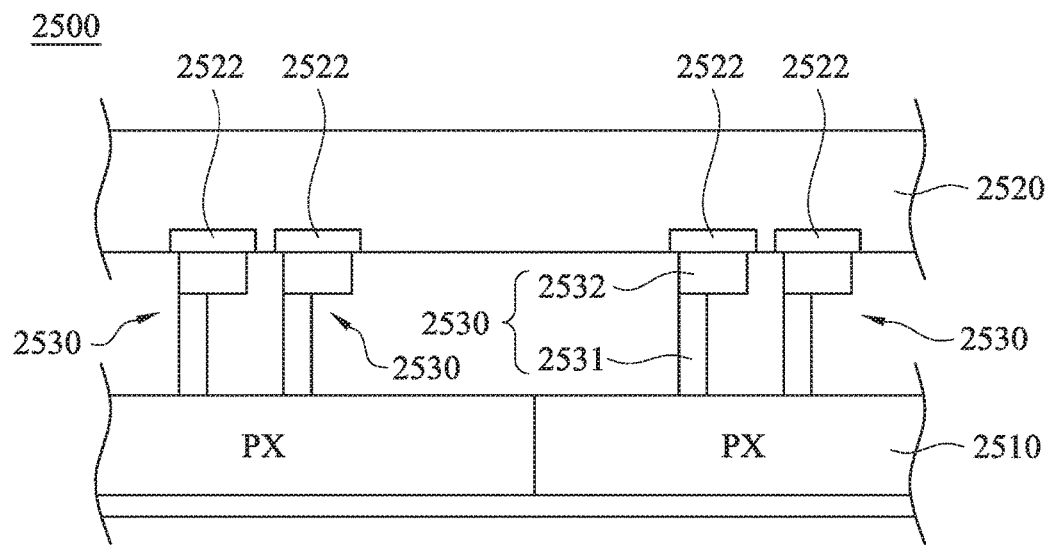
FIG. 25 is a schematic cross-sectional view of an image sensor in accordance with some embodiments of the present disclosure.
Figure 26:
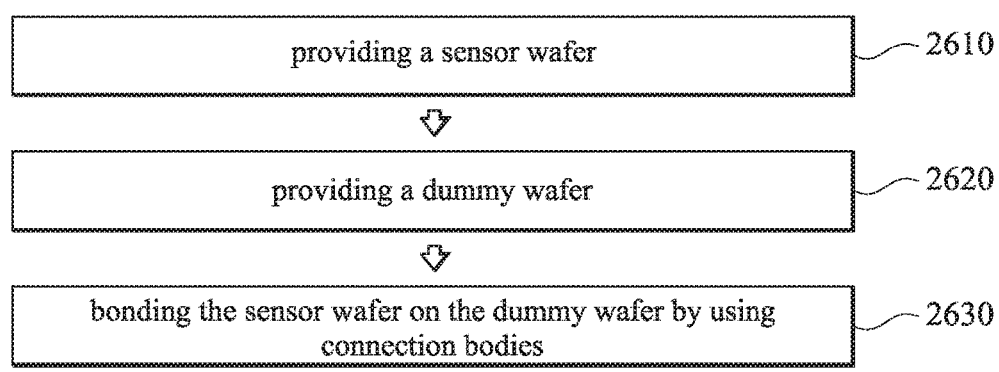
FIG. 26 is a flow chart showing a method for fabricating an image sensor in accordance with embodiments of the present disclosure.

Referring to FIG. 25, FIG. 25 is a schematic cross-sectional view of an image sensor 2500 in accordance with some embodiments of the present disclosure. The image sensor 2500 includes a sensor wafer 2510, a circuit wafer 2520 and plural connection members 2030. The sensor wafer 2510 includes plural pixel units PX configured to convert various photo energy of light into electrical signals. In some embodiments, the above pixel unit 100, 300, 400, 600, 700, 900, 1000, 1200, 1300, 1500, 1600, 1800, 1900, 2100, 2200 or 2400 is applied for each of the pixel units PX. The circuit wafer 2520 includes plural peripheral circuits 2522 corresponding to the pixel units PX. In some embodiments, the peripheral circuit 2522 may be an amplifier circuit (for example, a source follower circuit), a reset circuit or a selection circuit. The connection members 2530 are configured to electrically connect the pixel units PX of the sensor wafer 2510 to the peripheral circuits 2522 of the circuit wafer 2520, thereby achieving pixel level bonding. In some embodiments, each of the connection members 2530 includes a first portion 2531 and a second portion 2532. The second portion 2532 is wider than the first portion 2531, thereby enabling the connection members 2530 has a shape of funnel. In some embodiments, the first portion 2531 is located adjacent to a corresponding pixel unit PX, and the second portion 2532 is located adjacent to a corresponding peripheral circuit 2522, thereby connecting the corresponding pixel unit PX to the corresponding peripheral circuit 2522.

Figure 27A:
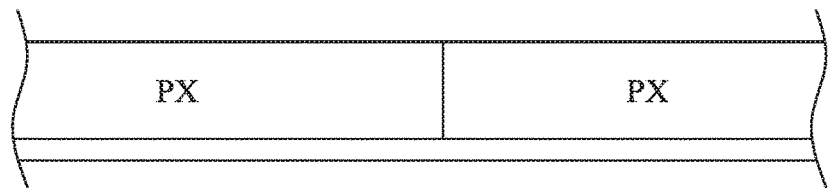
FIG. 27A to FIG. 27C are cross-sectional views of intermediate stages showing the method for fabricating an image sensor in accordance with some embodiments of the present disclosure.
Figure 27B:
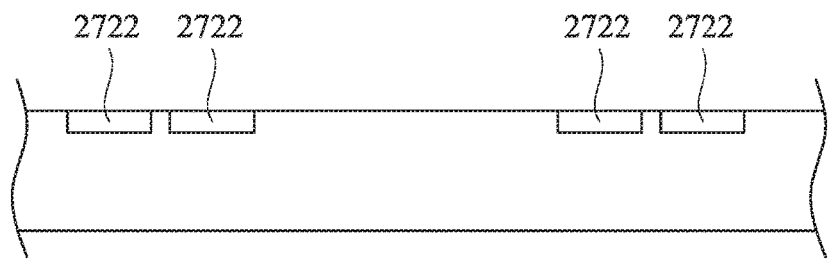
Figure 27C:
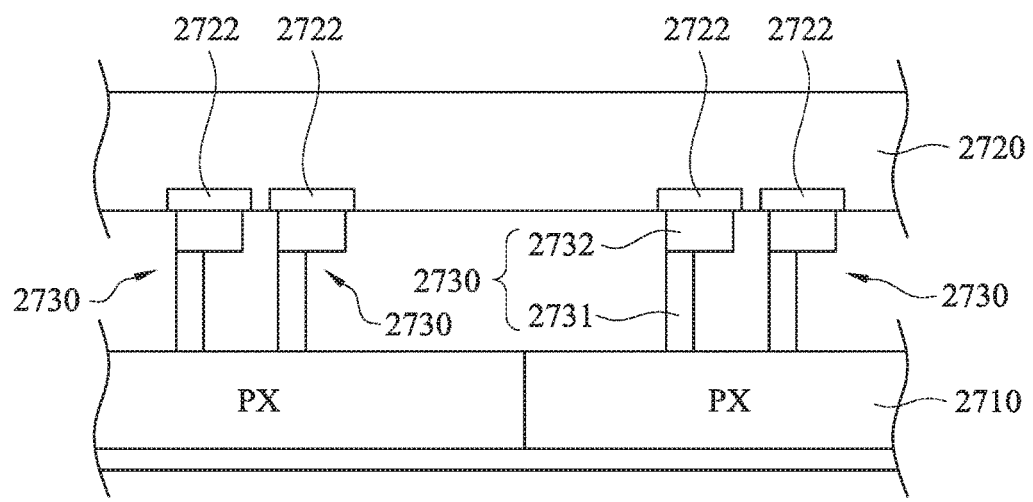

Referring to FIG. 26 and FIG. 27A to FIG. 27C, FIG. 26 is a flow chart showing a method 2600 for fabricating an image sensor in accordance with embodiments of the present disclosure, and FIG. 27A to FIG. 27C are cross-sectional views of intermediate stages showing the method 2600 for fabricating an image sensor in accordance with some embodiments of the present disclosure. The method 2600 begins at operation 2610. Operation 2610 is performed provide a sensor wafer 2710 including pixels PX as shown in FIG. 27A. In some embodiments, operation 2610 includes the method 200, the method 500 or method 800 for fabricating pixels of an image sensor. Then, operation 2620 is performed to provide a circuit wafer 2720 including plural peripheral circuits 2722, as shown in FIG. 12B. In some embodiments, the peripheral circuit 2522 may be an amplifier circuit (for example, a source follower circuit), a reset circuit or a selection circuit. Thereafter, operation 2630 is performed to bond the sensor wafer 2710 on the circuit wafer 2720 by using plural connection members 2730. In some embodiments, each of the connection members 2730 includes a first portion 2731 and a second portion 2732. The second portion 2732 is wider than the first portion 2731, thereby enabling the connection members 2730 has a shape of funnel. In some embodiments, the first portion 2731 is connected to a contact (for example, a source contact) of a corresponding pixel unit PX, and the second portion 2732 is connected to a contact of a corresponding peripheral circuit 2722, thereby connecting the corresponding pixel unit PX to the corresponding peripheral circuit 2722.

Since the above pixel unit 100, 300, 400, 600, 700, 900, 1000, 1200, 1300, 1500, 1600, 1800, 1900, 2100, 2200 or 2400 can be applied for each of the pixel units PX, and the peripheral circuits 2722 are formed on the circuit wafer 2720, fewer connection members 2730 are used to connect the sensor wafer 2710 to the circuit wafer 2720, and a success rate for the pixel level bonding is increased.

In accordance with an embodiment of the present disclosure, the present disclosure discloses a method for fabricating an image sensor. In the method, at first, a semiconductor substrate is provided. The semiconductor substrate has a top portion and a bottom portion. Then, a light-sensitive element is formed in the bottom portion of the semiconductor substrate. Thereafter, the top portion of the semiconductor substrate is etched to form a post structure on the bottom portion of the semiconductor substrate and a floating node on the post structure. Thereafter, a gate dielectric layer is formed to cover the post structure. Then, a conductive layer is formed to cover the gate dielectric layer. Thereafter, the conductive layer and the gate dielectric layer are etched to form a vertical gate structure on the post structure. Then, a first protection layer is formed on the light-sensitive element. Thereafter, a gate contact is formed on the conductive layer.

In accordance with another embodiment of the present disclosure, the present disclosure discloses a method for fabricating an image sensor. In the method, at first, a semiconductor substrate is provided. Then, a light-sensitive element is formed in the semiconductor substrate. Thereafter, a protection layer is formed on the light-sensitive element. Then, a contact is formed on the light-sensitive element, in which the contact is configured to output a plurality of signals generated by the light-sensitive element, and the protection layer surrounds the contact.

In accordance with another embodiment of the present disclosure, the present disclosure discloses a method for fabricating an image sensor. In the method, at first, a sensor wafer is provided. In the operation for providing the sensor wafer, at first, a semiconductor substrate is provided. The semiconductor substrate has a top portion and a bottom portion. Then, a light-sensitive element is formed in the bottom portion of the semiconductor substrate. Thereafter, the top portion of the semiconductor substrate is etched to form a post structure on the bottom portion of the semiconductor substrate. Thereafter, a gate dielectric layer is formed to cover the post structure. Then, a conductive layer is formed to cover the gate dielectric layer. Thereafter, the conductive layer and the gate dielectric layer are etched to form a vertical gate structure on the post structure. Then, a protection layer is formed on the light-sensitive element. Thereafter, a floating node is formed in or on the post structure. Then, plural contacts are formed on the floating node and on the conductive layer. After the sensor wafer is provided, a circuit wafer is provided. The circuit wafer includes a peripheral circuit corresponding to the light-sensitive element, in which the peripheral circuit includes an amplifier circuit or a reset circuit. The sensor wafer is bonded on the circuit wafer by using plural connection members.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an image sensor, the method comprising:
    providing a semiconductor substrate having a top portion and a bottom portion;
    forming a light-sensitive element in the bottom portion of the semiconductor substrate;
    etching the top portion of the semiconductor substrate to form a post structure on the bottom portion of the semiconductor substrate;
    forming a gate dielectric layer to cover the post structure;
    forming a conductive layer to cover the gate dielectric layer;
    etching the conductive layer and the gate dielectric layer to form a vertical gate structure on the post structure;
    forming a first protection layer on the light-sensitive element; and
    forming a gate contact on the conductive layer.

2. The method of claim 1, further comprising:
    forming an ohmic contact layer in or on the top portion of the semiconductor substrate;
    etching the ohmic contact layer to form a floating node on the post structure; and
    forming a source contact on the floating node.

3. The method of claim 2, further comprising forming a doped region on a plurality of sidewalls of the post structure, wherein the doped region is formed between the ohmic contact layer and the gate dielectric layer.

4. The method of claim 1, wherein the first protection layer is formed by doping a portion of the bottom portion of the semiconductor substrate.

5. The method of claim 1, wherein forming the light-sensitive element comprising:
    forming a first doped region in the bottom portion of the semiconductor substrate, wherein the first doped region is formed by doping with a dopant of a first type at a first concentration; and
    forming a second doped region in the bottom portion of the semiconductor substrate, wherein the second doped region is located on the first doped region, and the second doped region is formed by doping with the dopant of the first type at a second concentration smaller than the first concentration.

6. The method of claim 5, further comprising forming a third doped region in the bottom portion of the semiconductor substrate, wherein the first doped region is located between the third doped region and the second doped region, and the third doped region is formed by doping with the dopant of the first type at a third concentration smaller than the first concentration.

7. The method of claim 6, wherein the protection layer is formed by doping with a dopant of a second type different from the first type.

8. A method for fabricating an image sensor, the method comprising:
forming a light-sensitive element in a substrate;
doping the substrate to form a doped region on the light-sensitive element;
etching the substrate to form a post structure on the doped region;
forming an ohmic contact layer on the substrate;
etching the ohmic contact layer to form a floating node on a top surface of the post structure;
forming a gate structure on the top surface and a sidewall of the post structure; and
removing the gate structure on the top surface of the post structure.

9. The method of claim 8, further comprising doping the substrate and the doped region to form a protection layer on the light-sensitive element.

10. The method of claim 8, further comprising forming a lightly-doped region on the doped region.

11. The method of claim 10, further comprising doping the substrate, the doped region, and the lightly-doped region to form a protection layer on the light-sensitive element.

12. The method of claim 8, further comprising:
removing the gate structure to expose the sidewall of the post structure; and
doping the sidewall to form a doped region in the post structure.

13. A method for fabricating an image sensor, the method comprising:
forming a light-sensitive element in a substrate;
doping the substrate to form a doped region on the light-sensitive element forming a lightly-doped region on the substrate;
doping the substrate, the doped region, and the lightly-doped region to form first and second protection layers on the light-sensitive element; and
providing a contact between and spaced apart from the first and second protection layers.

14. The method of claim 13, further comprising etching the substrate to form a post structure on the light-sensitive element.

15. The method of claim 14, wherein forming the lightly-doped region is such that the lightly-doped region is in contact with a sidewall of the post structure.

16. The method of claim 14, further comprising:
forming a mask layer that surrounds the post structure and the lightly-doped region.

17. The method of claim 16, further comprising:
after forming the mask layer, doping the post structure to form a doped region that surrounds the post structure.

18. The method of claim 13, further comprising:
forming a gate structure on the light-sensitive element;
forming a floating node on a top surface of the gate structure, wherein the contact extends from the floating node; and
providing a second contact that extends from the gate structure.

19. The method of claim 18, wherein forming the lightly-doped region is such that the lightly-doped region is in contact with a bottom surface of the gate structure.

20. The method of claim 13, wherein forming the lightly-doped region is such that the lightly-doped region is in contact with a top surface of the doped region.

\* \* \* \* \*